US010325953B2

(12) United States Patent
Kawahito

(10) Patent No.: US 10,325,953 B2
(45) Date of Patent: Jun. 18, 2019

(54) RANGE SENSOR AND SOLID-STATE IMAGING DEVICE

(71) Applicant: National University Corporation Shizuoka University, Shizuoka-shi, Shizuoka (JP)

(72) Inventor: Shoji Kawahito, Shizuoka (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 0 days.

(21) Appl. No.: 15/562,965

(22) PCT Filed: Mar. 31, 2016

(86) PCT No.: PCT/JP2016/001869
§ 371 (c)(1),
(2) Date: Sep. 29, 2017

(87) PCT Pub. No.: WO2016/157910
PCT Pub. Date: Oct. 6, 2016

(65) Prior Publication Data
US 2018/0114809 A1 Apr. 26, 2018

(30) Foreign Application Priority Data
Mar. 31, 2015 (JP) .................................. 2015-73097

(51) Int. Cl.
*H01L 31/10* (2006.01)
*H01L 27/144* (2006.01)
(Continued)

(52) U.S. Cl.
CPC ........ *H01L 27/14638* (2013.01); *G01S 7/481* (2013.01); *H01L 27/144* (2013.01);
(Continued)

(58) Field of Classification Search
None
See application file for complete search history.

(56) References Cited

U.S. PATENT DOCUMENTS 6,794,214 B2 9/2004 Berezin et al.
7,436,496 B2 10/2008 Kawahito
(Continued)

FOREIGN PATENT DOCUMENTS

JP 2004-294420 A 10/2004
JP 2013-175951 A 9/2013
(Continued)

OTHER PUBLICATIONS

The English translation of the international preliminary report on patentability (Chapter II) of PCT/JP2016/001869 mailed by the International Bureau of WIPO dated Oct. 5, 2017 (PCT/IB/338 and PCT/IPEA/409).

*Primary Examiner* — Shaun M Campbell
(74) *Attorney, Agent, or Firm* — Metrolexis Law Group, PLLC

(57) ABSTRACT

A range sensor includes: an n-type surface-buried region selectively buried in an upper portion of a pixel layer to implement a photodiode and extending from a light-receiving area toward plural portions shielded by a shielding plate along the upper portion of the pixel layer so as to provide a plurality of branches; n-type charge-accumulation regions having a higher impurity concentration than the surface-buried region; a plurality of transfer gate electrodes provided adjacent to the charge-accumulation regions; and an n-type guide region having a higher impurity concentration than the surface-buried region and a lower impurity concentration than the charge-accumulation regions, and provided with one end below an aperture of the shielding plate and other ends extending to a part of the respective transfer gate electrodes.

13 Claims, 44 Drawing Sheets

(51) Int. Cl.
*H01L 27/146* (2006.01)
*G01S 7/481* (2006.01)
*H04N 5/361* (2011.01)
*H04N 5/369* (2011.01)
*H04N 5/374* (2011.01)
*H04N 5/3745* (2011.01)

(52) U.S. Cl.
CPC ...... *H01L 27/146* (2013.01); *H01L 27/14605* (2013.01); *H01L 27/14623* (2013.01); *H01L 27/14643* (2013.01); *H01L 31/10* (2013.01); *H04N 5/361* (2013.01); *H04N 5/369* (2013.01); *H04N 5/374* (2013.01); *H04N 5/3745* (2013.01)

(56) References Cited

U.S. PATENT DOCUMENTS

| | | | |
|---|---|---|---|
| 8,558,293 B2 | 10/2013 | Kawahito et al. | |
| 8,587,709 B2 | 11/2013 | Kawahito et al. | |
| 8,730,382 B2 | 5/2014 | Aoyama et al. | |
| 9,231,006 B2 | 1/2016 | Kawahito et al. | |
| 2006/0192938 A1 | 8/2006 | Kawahito | |
| 2011/0090385 A1* | 4/2011 | Aoyama | H01L 27/14603 348/308 |
| 2011/0187908 A1* | 8/2011 | Kawahito | H01L 27/14603 348/306 |
| 2012/0193692 A1 | 8/2012 | Kawahito et al. | |
| 2012/0193743 A1 | 8/2012 | Kawahito et al. | |
| 2015/0014749 A1 | 1/2015 | Ushinaga | |

FOREIGN PATENT DOCUMENTS

| | | |
|---|---|---|
| WO | 2009/147862 A1 | 12/2009 |
| WO | 2010/013811 A1 | 2/2010 |
| WO | 2011/043339 A1 | 4/2011 |
| WO | 2011/043432 A1 | 4/2011 |
| WO | 2013/125631 A1 | 8/2013 |

* cited by examiner

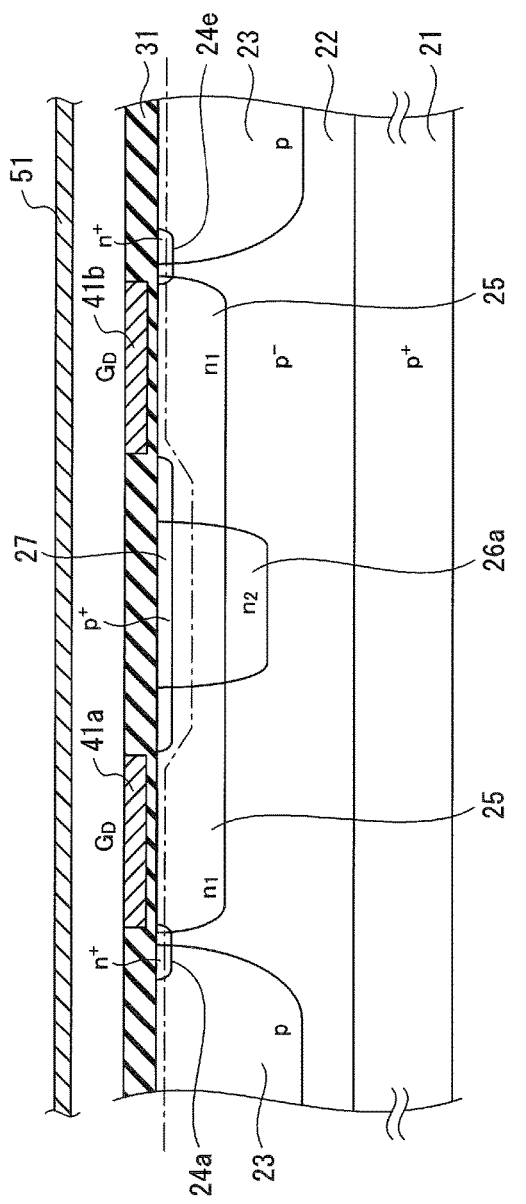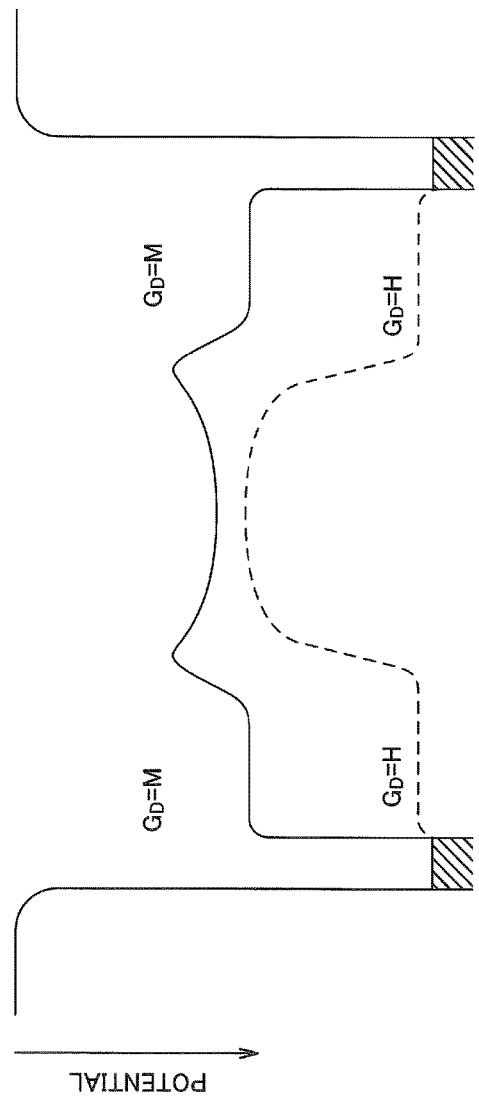
FIG. 2A
FIG. 2B

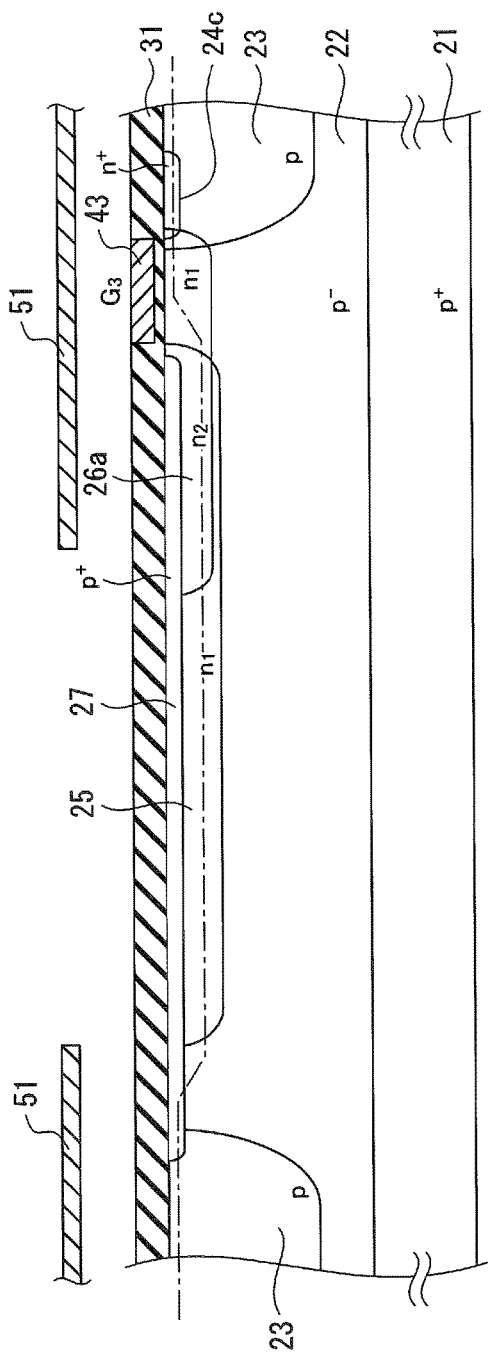
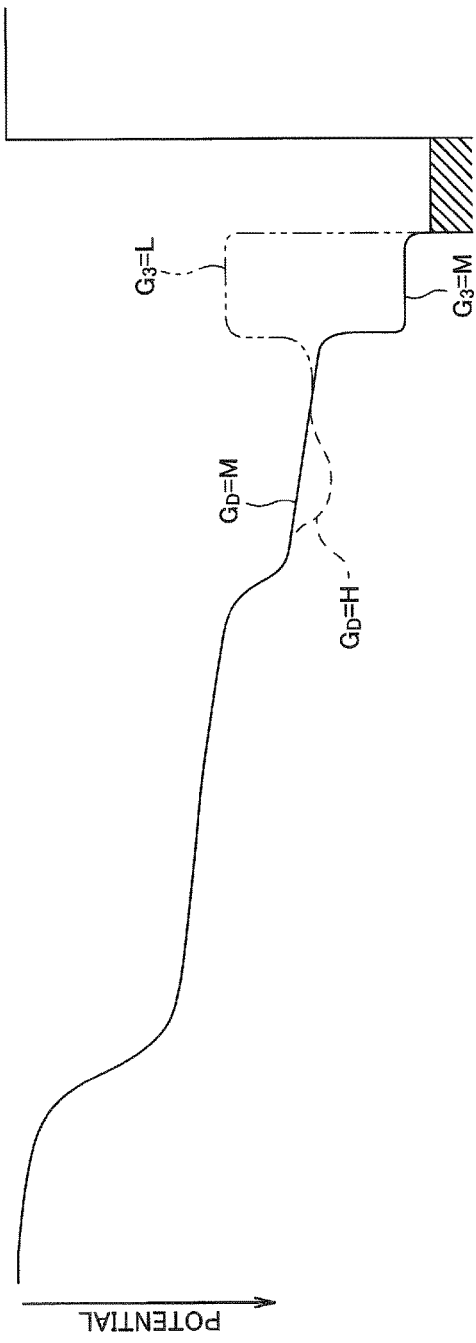
FIG. 3A
FIG. 3B

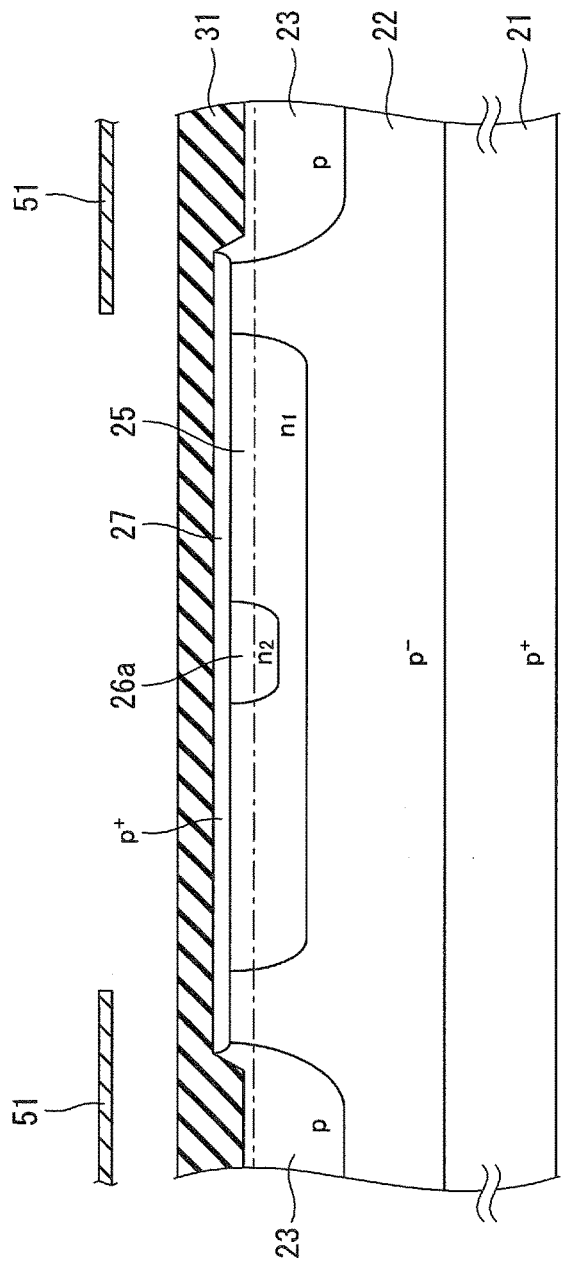
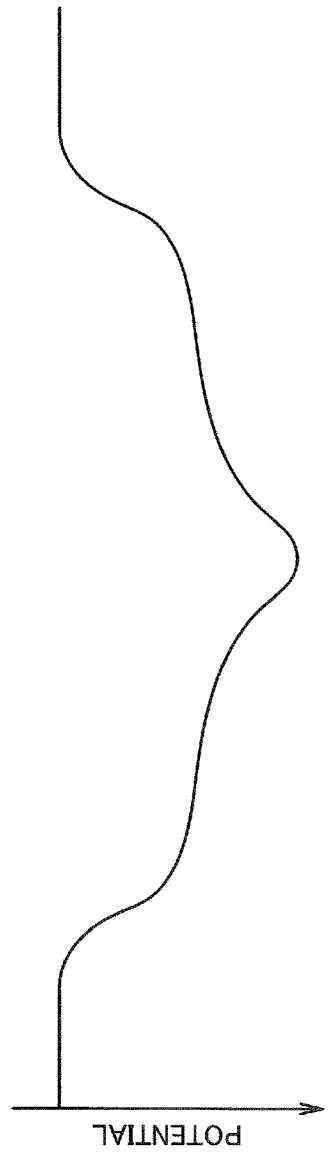
FIG. 5A
FIG. 5B

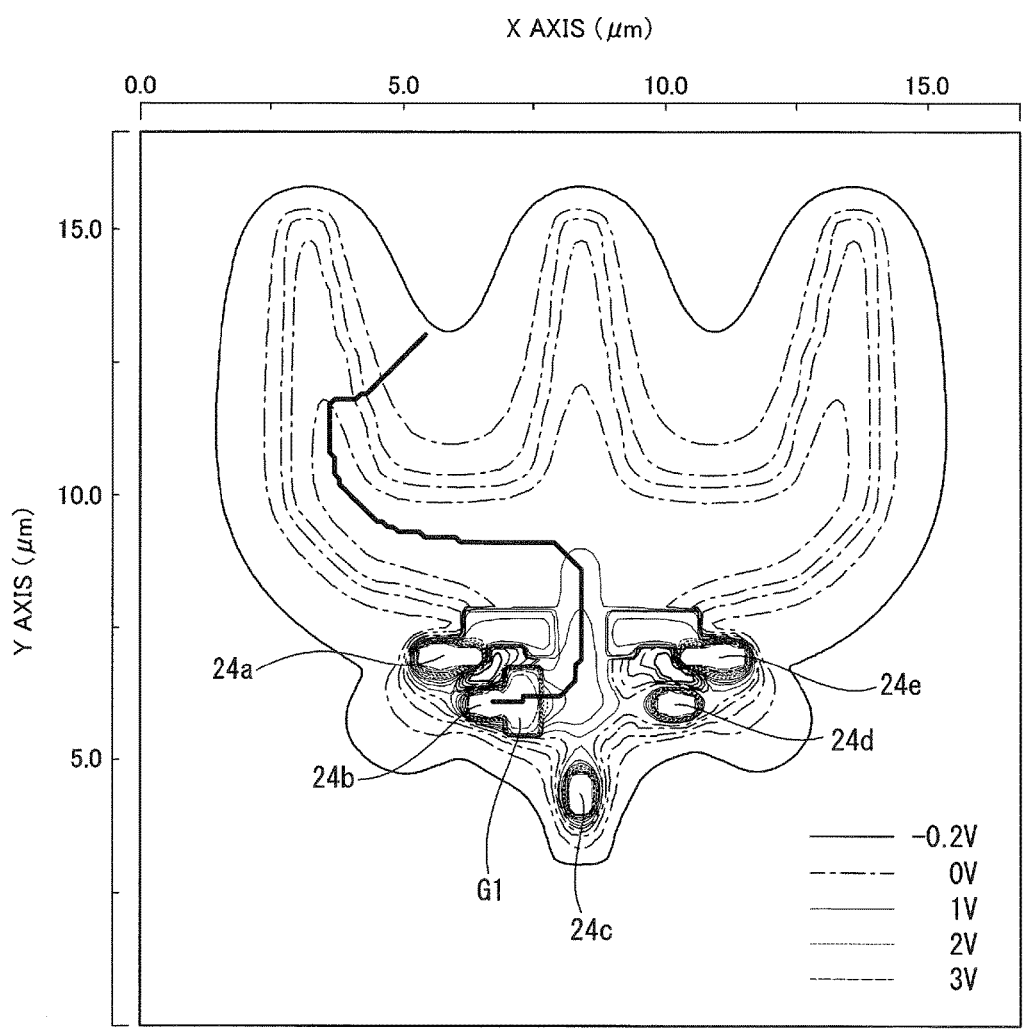

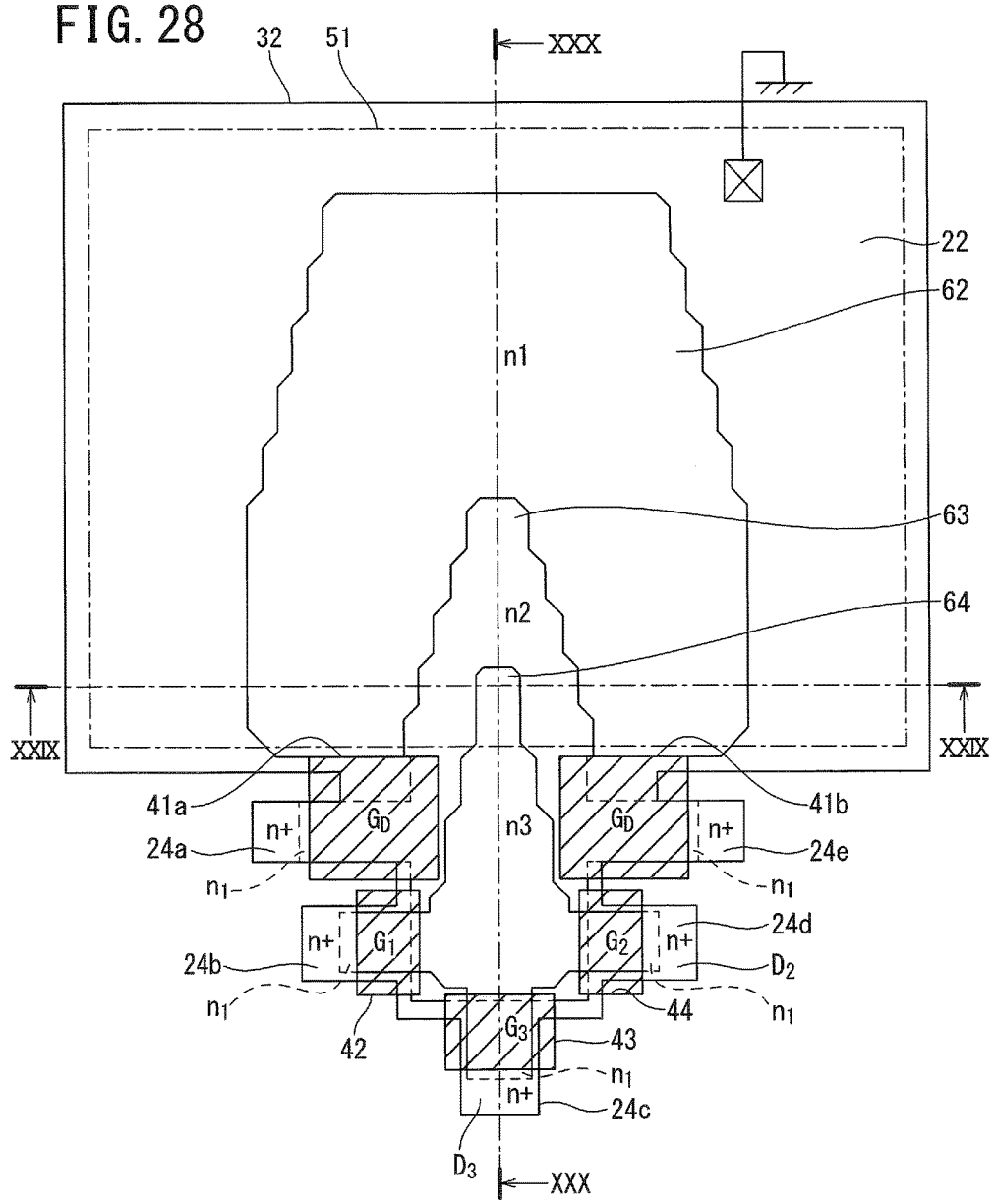

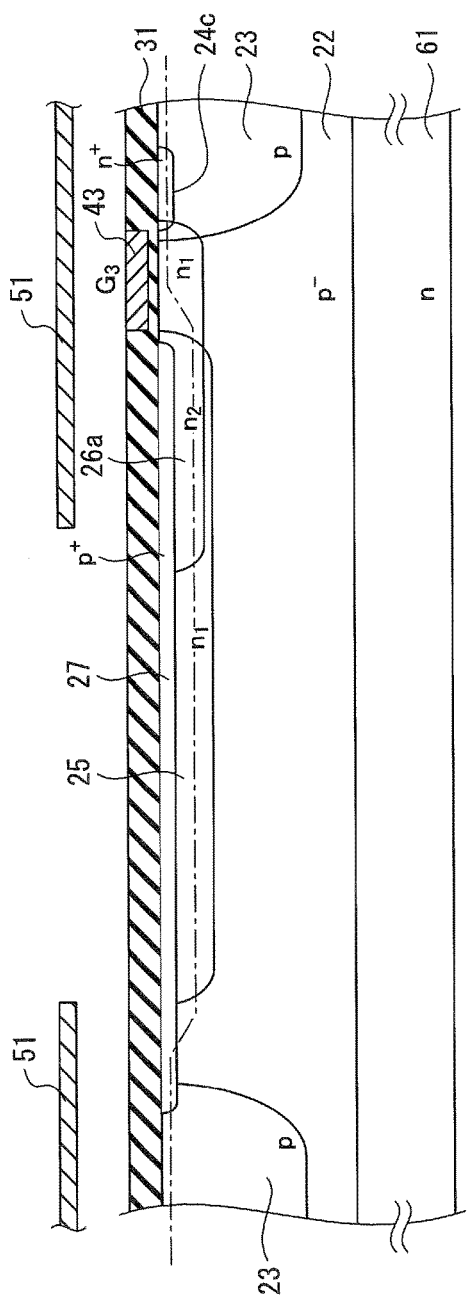
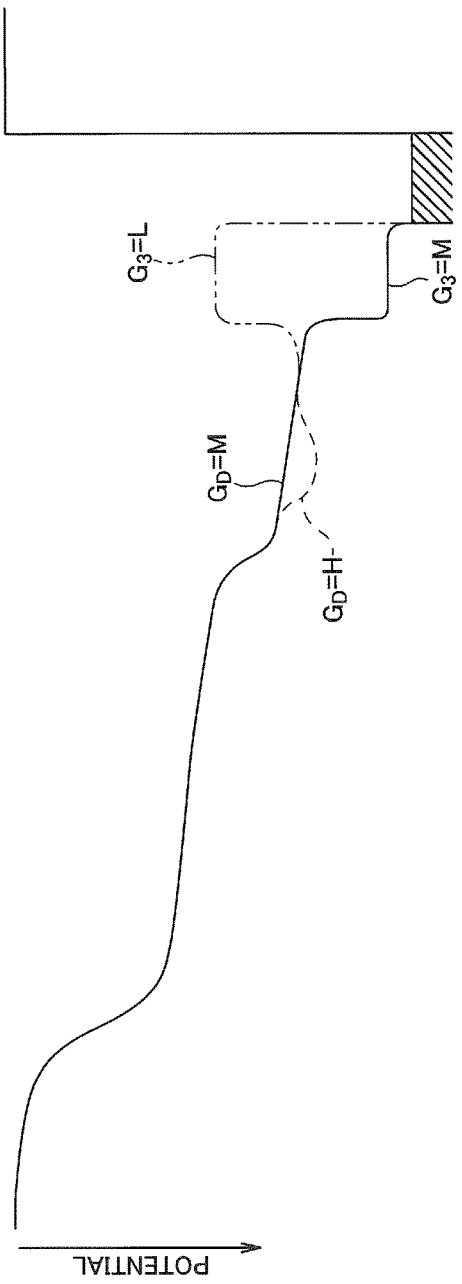
FIG. 37A
FIG. 37B

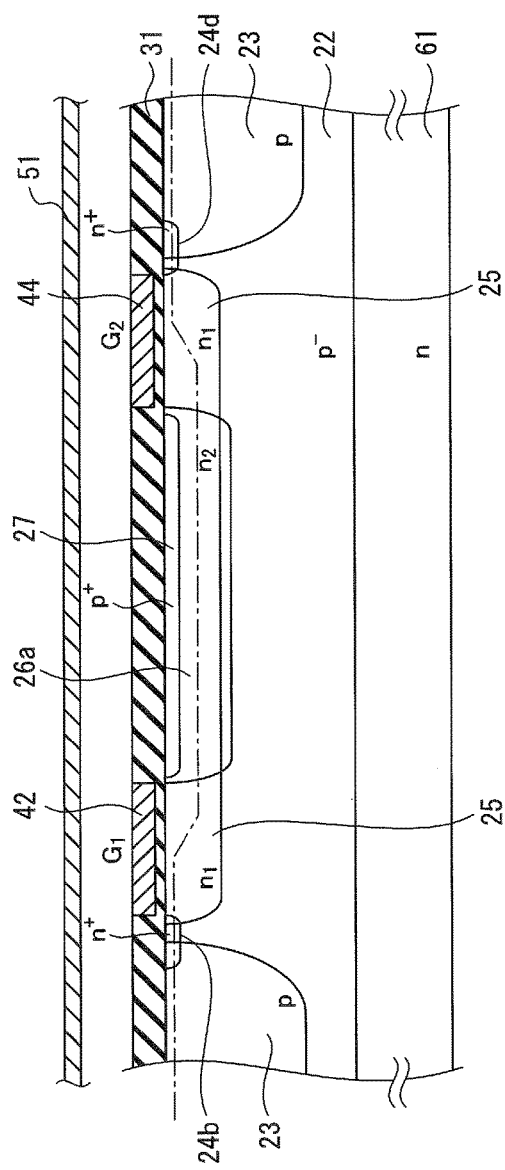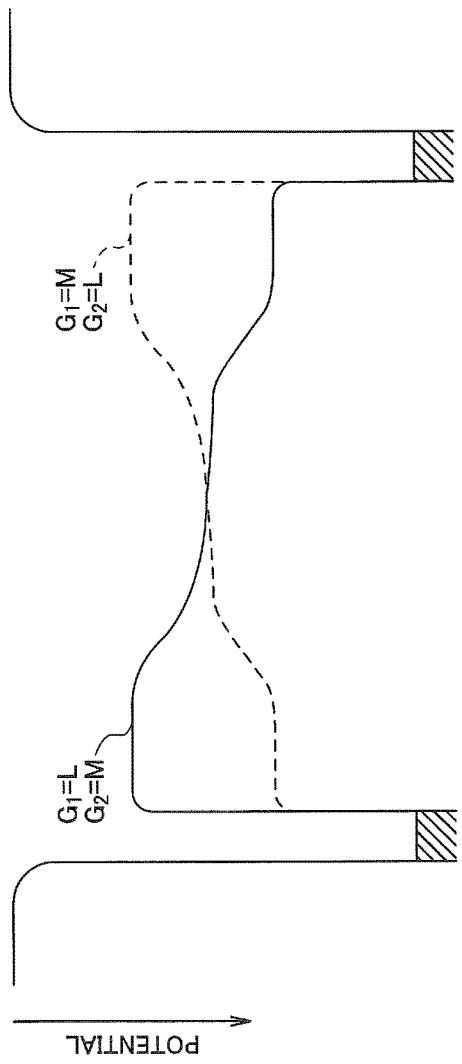
FIG. 38A
FIG. 38B

RANGE SENSOR AND SOLID-STATE IMAGING DEVICE

TECHNICAL FIELD

The present invention relates to a range sensor having a lock-in pixel function for detecting photoelectrons in synchronization with a light pulse, and a solid-state imaging device including a plurality of range sensors arranged as pixels.

BACKGROUND ART

In recent years, development of time-of-flight range image sensors using semiconductors is actively being carried out. For example, a range image sensor includes a plurality of lock-in pixels arrayed and connected in parallel for transferring carriers generated in photodiodes in synchronization with a light source to a plurality of charge accumulators, while each lock-in pixel element is made into a smaller pixel so as to transfer charges at high speed as disclosed in Patent Literature (PTL) 1.

In the image sensor disclosed in PTL 1, load capacitances of a plurality of transfer gates connected in parallel increase, and the entire power consumption increases as the number of pixels increases. Further, connecting a plurality of lock-in pixel elements increases the area of a diffusion layer of a signal detector, which may cause a dark current.

CITATION LIST

Patent Literature

PTL 1: U.S. Pat. No. 6,794,214

SUMMARY INVENTION

An objective of the present invention is to provide a range sensor having a large light receiving area and capable of high-speed modulation with high sensitivity at a low dark current, and a solid-state imaging device including a plurality of range sensors as pixels arranged on a semiconductor chip.

Solution to Problem

In order to achieve the objective, a first aspect of the present invention inheres in a range sensor encompassing (a) a pixel layer made of a semiconductor of a first conductivity type, (b) a shielding plate having an aperture and provided above the pixel layer, the aperture defines a light-receiving area in the pixel layer, (c) a surface-buried region of a second conductivity type selectively buried in an upper portion of the pixel layer to implement a photodiode in the light-receiving area by forming a junction with the pixel layer, and extending from the light-receiving area toward plural portions shielded by the shielding plate along the upper portion of the pixel layer, delineating a configuration with a plurality of branches, (d) a plurality of charge-accumulation regions of the second conductivity type having a higher impurity concentration than the surface-buried region connected to tips of the respective branches, (e) a plurality of transfer-control mechanisms provided at the respective branches adjacent to the charge-accumulation regions to control a transfer of signal charges to the charge-accumulation regions, and (f) a guide region of a second conductivity type having a higher impurity concentration than the surface-buried region, and a lower impurity concentration than the charge-accumulation regions, and buried in a part of an upper portion of the surface-buried region with one end provided below a part of the aperture and other ends extending to at least a part of the respective transfer-control mechanisms.

A second aspect of the present invention inheres in a range sensor encompassing (a) a pixel layer made of a semiconductor of a first conductivity type, (b) a shielding plate having a plurality of apertures and provided above the pixel layer to define a plurality of light-receiving areas on the pixel layer below the respective apertures, (c) a surface-buried region of a second conductivity type buried in an upper portion of the pixel layer, configured to assign a plurality of photodiodes in the respective light-receiving areas, by forming a plurality of junctions with the pixel layer, the surface-buried region including a charge-modulation arrangement-region having: a plurality of branches disposed at a position shielded by the shielding plate, and a plurality of light-receiving terminal-portions, a number of the light-receiving terminal-portions corresponding to the number of the apertures, extending toward the respective apertures at both ends of the charge-modulation arrangement-region, each of occupying areas of the light-receiving terminal-portions having an area sufficient to cover substantially the entire area of corresponding aperture; (d) a plurality of charge-accumulation regions of the second conductivity type having a higher impurity concentration than the surface-buried region connected to tips of the respective branches; (e) a plurality of transfer-control mechanisms provided at the respective branches adjacent to the charge-accumulation regions to control a transfer of signal charges to the charge-accumulation regions; and (f) a guide region of the second conductivity type having a higher impurity concentration than the surface-buried region, and a lower impurity concentration than the charge-accumulation regions, the guide region including: a plurality of protruding-edges, a number of protruding-edges corresponding to the number of respective apertures, extending from an area shielded by the shielding plate on the charge-modulation arrangement-region to the respective apertures so that tips of the protruding-edges are provided below the respective apertures.

A third aspect of the present invention inheres in a range sensor encompassing (a) a pixel layer made of a semiconductor of a first conductivity type, (b) a shielding plate having a plurality of apertures around a pixel region defined by the pixel layer and provided above the pixel layer to define a plurality of light-receiving areas on the pixel layer below the respective apertures, (c) a surface-buried region of a second conductivity type buried in an upper portion of the pixel layer, configured to assign a plurality of photodiodes in the respective light-receiving areas, by forming a plurality of junctions with the pixel layer, the surface-buried region including a charge-modulation arrangement-region having: a plurality of branches disposed in a central portion of the pixel region shielded by the shielding plate, and a plurality of light-receiving terminal-portions, a number of the light-receiving terminal-portions corresponding to the number of the apertures, the light-receiving terminal-portions radially extending toward the respective apertures, each of occupying areas of the light-receiving terminal-portions having an area sufficient to cover substantially the entire area of corresponding aperture; (d) a plurality of charge-accumulation regions of the second conductivity type having a higher impurity concentration than the surface-buried region connected to tips of the respective branches; (e) a plurality of transfer-control mechanisms provided at the respective branches adjacent to the charge-accumulation regions to control a transfer of signal charges to the charge-accumulation regions; and (f) a guide region of the second conductivity type having a higher impurity concentration than the surface-buried region, and a lower impurity concentration than the charge-accumulation regions, the guide region including: a plurality of protruding-edges, a number of the protruding-edges corresponding to the number of respective apertures, tips of the respective protruding-edges radially extending below the respective apertures from an area shielded by the shielding plate on the charge-modulation arrangement-region.

A fourth aspect of the present invention inheres in a solid-state imaging device including a plurality of pixels arranged on a semiconductor chip, each of the pixels being the range sensor according to the first aspect.

A fifth aspect of the present invention inheres in a solid-state imaging device including a plurality of pixels arranged on a semiconductor chip, each of the pixels being the range sensor according to the second aspect.

A sixth aspect of the present invention inheres in a solid-state imaging device including a plurality of pixels arranged on a semiconductor chip, each of the pixels being the range sensor according to the third aspect.

Advantageous Effects of Invention

According to the present invention, it is possible to achieve a range sensor having a large light receiving area and capable of high-speed modulation with high sensitivity at a low dark current, and a solid-state imaging device including a plurality of range sensors as pixels arranged on a semiconductor chip.

BRIEF DESCRIPTION OF DRAWINGS

FIG. 2A is a cross-sectional view of the range sensor according to the first embodiment as viewed from direction II-II in FIG. 1;

FIG. 2B is a view illustrating a potential profile for the structure illustrated in FIG. 2A;

FIG. 3A is a cross-sectional view of the range sensor according to the first embodiment as viewed from direction III-III in FIG. 1;

FIG. 3B is a view illustrating a potential profile for the structure illustrated in FIG. 3A;

FIG. 5A is a cross-sectional view of the range sensor according to the first embodiment as viewed from direction V-V in FIG. 1;

FIG. 5B is a view illustrating a potential profile for the structure illustrated in FIG. 5A;

FIG. 6 is a diagram illustrating a potential profile and a transport path of signal charges on equipotential lines in the principal part of the range sensor according to the first embodiment when a gate signal of an intermediate potential (M) is applied to a first transfer gate electrode;

FIG. 28 is a schematic plan view from above of a principal part of a range sensor according to a seventh embodiment of the present invention;

FIG. 37A is a cross-sectional view of the range sensor according to the other embodiment at a position corresponding to the cross section as viewed from direction III-III in FIG. 1 for the n-type semiconductor substrate;

FIG. 37B is a diagram illustrating a potential profile for the structure illustrated in FIG. 37A;

FIG. 38A is a cross-sectional view of the range sensor according to the other embodiment at a position corresponding to the cross section as viewed from direction IV-IV in FIG. 1 for the n-type semiconductor substrate;

FIG. 38B is a diagram illustrating a potential profile for the structure illustrated in FIG. 38A;

DESCRIPTION OF EMBODIMENTS

Figure 1:
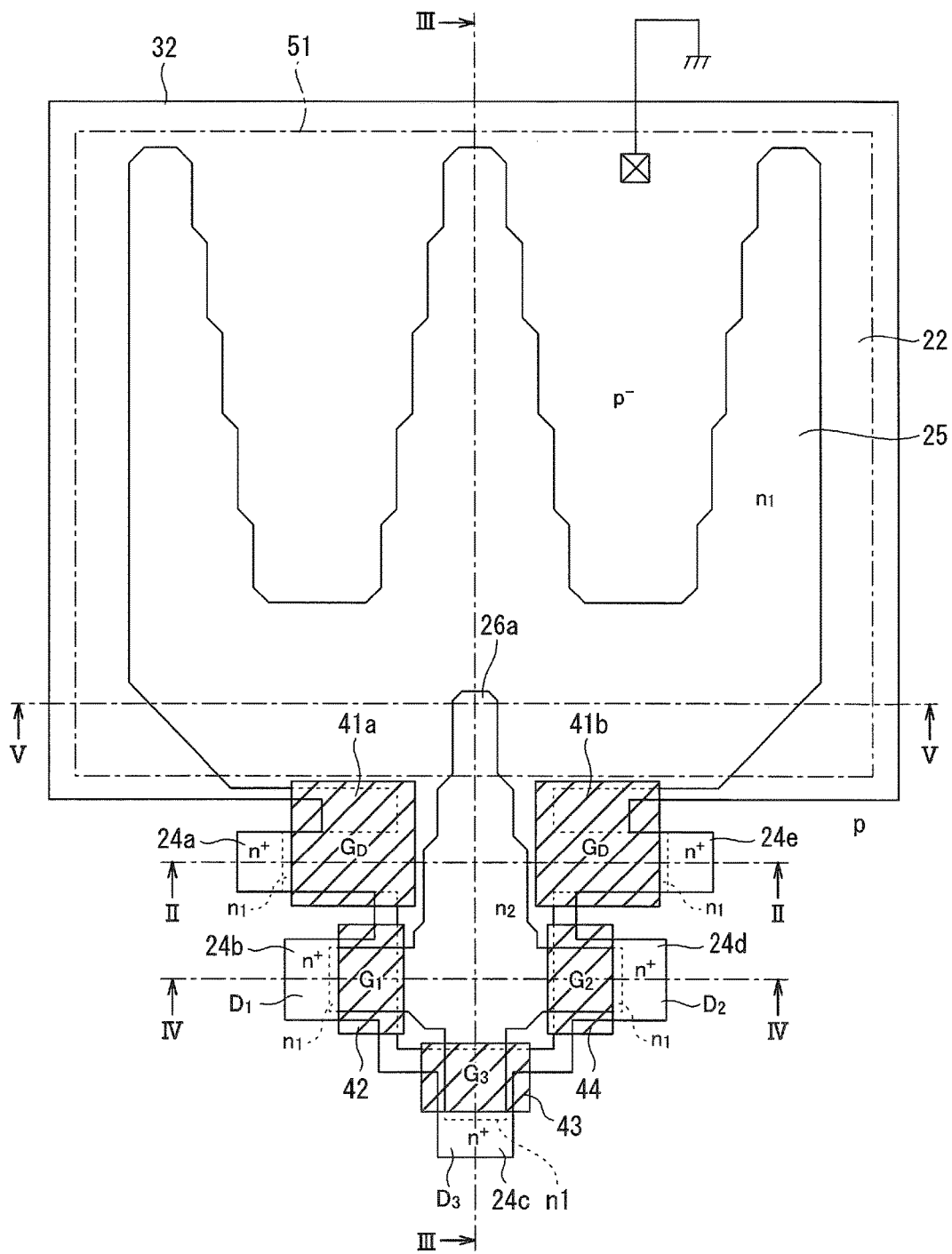
FIG. 1 is a schematic plan view from above of a principal part of a range sensor according to a first embodiment of the present invention.

First to seventh embodiments of the present invention will be described below. In the drawings, the same or similar elements are indicated by the same or similar reference numerals. It should be understood that the drawings are illustrated schematically; and relationships of thicknesses and planar dimensions, and proportions of the respective layers are not drawn to scale. The specific thicknesses and dimensions should be considered in accordance with the following description. It should also be understood that the respective drawings are illustrated with the dimensional relationships and proportions different from each other.

Although the first to seventh embodiments of the present invention described below will be exemplified with the case in which a first conductivity type is "p-type" and a second conductivity type is "n-type", the first and second conductivity types may be assigned in the inverted manner such that the first conductivity type is "n-type" and the second conductivity type is "p-type". It is noted that carriers as signal charges serve as electrons when the first conductivity type is "p-type" and the second conductivity type is "n-type", and carriers as signal charges serve as holes when the first conductivity type is "n-type" and the second conductivity type is "p-type". In the description, directions "left and right" or "up and down" are merely defined for the convenience of description, and thus, this definition does not limit the technical spirit of the present invention. Therefore, for example, if the paper plane is rotated by 90 degrees, the "left and right" and the "up and down" are read in exchange. If the paper plane is rotated by 180 degrees, the "left" is changed to the "right", and the "right" is changed to the "left".

(First Embodiment)

A range sensor according to the first embodiment of the present invention is a lock-in pixel including a shielding plate 51 having an aperture indicated by the dashed-dotted line in FIG. 1 defining a light-receiving area. As shown in the schematic plan view from above of the principal part of the range sensor in FIG. 1, the range sensor according to the first embodiment is provided with the shielding plate 51 including the aperture opened in a region corresponding to a photodiode of the light-receiving area, and further provided with a pixel region, excluding the aperture, covered with the shielding plate 51 so as to be shielded from light.

The range sensor according to the first embodiment serves as a lock-in pixel. As understood from the cross-sectional views of FIG. 2 to FIG. 4, the lock-in pixel includes a pixel layer 22 made of a semiconductor of a first conductivity type (p-type), the shielding plate 51 having the aperture and provided above the pixel layer 22 to define the light-receiving area on the pixel layer 22 below the aperture, and a surface-buried region 25 of a second conductivity type (n-type) selectively buried in the upper portion of the pixel layer 22. The surface-buried region 25 implements a photodiode in the light-receiving area, by forming a junction with the pixel layer 22. The surface-buried region 25 extends from the light-receiving area toward plural portions shielded by the shielding plate 51 along the upper portion of the pixel layer 22 so as to delineate a plurality of branches, implementing a T-shaped configuration on the end side. A first charge-accumulation region 24b, a second charge-accumulation region 24d and a third charge-accumulation region 24c of n-type conductivity are connected to the tips of the branches. The first charge-accumulation region 24b, the second charge-accumulation region 24d and the third charge-accumulation region 24c have a higher impurity concentration than the surface-buried region 25. A first transfer-control mechanism (31, 42), a second transfer-control mechanism (31, 44) and a third transfer-control mechanism (31, 43) are provided at the branches adjacent to the first charge-accumulation region 24b, the second charge-accumulation regions 24d and the third charge-accumulation region 24c, respectively, so as to control a transfer of signal charges to the first charge-accumulation region 24b, the second charge-accumulation regions 24d and the third charge-accumulation region 24c. A guide region 26a of n-type conductivity is buried in a part of the upper portion of the surface-buried region 25. One end of the guide region 26a is provided below a part of the aperture, and other protruding-edges of the guide region 26a extend to at least a part of the respective transfer-control mechanisms. The guide region 26a has a higher impurity concentration than the surface-buried region 25 and a lower impurity concentration than the first charge-accumulation region 24b, the second charge-accumulation regions 24d and the third charge-accumulation region 24c. As used herein, the term "branch" denotes each of protruding portions defining a branched configuration in a planar pattern. Each of the branches may be a convex portion having a rectangular shape in a mask level in photolithography.

As understood from the cross-sectional views of FIG. 2 to FIG. 4, the range sensor according to the first embodiment further includes a p-type pinning layer 27, which is in contact with the surface of the surface-buried region 25. The pixel layer 22 is laminated on a p-type semiconductor substrate 21.

In the range sensor according to the first embodiment shown in FIG. 1, the surface-buried region 25 of n-type conductivity; which implements a photodiode, has a comb-like (fork-like) shape in a planar pattern. The surface-buried region 25 collects photoelectrons as signal charges in the central portion at the base of the fork-like shape, and rapidly transfers the photoelectrons generated in the light-receiving area to a charge-modulation portion. The light-receiving area is defined in a large area of pixel. Here, the pixel size is five micrometers square or greater. The charge-modulation portion includes the first transfer-control mechanism (31, 42), the second transfer-control mechanism (31, 44) and the third transfer-control mechanism (31, 43). Each of prongs of the fork-like shape has a stepped shape gradually increased in width from upper-side to lower-side in the drawing of FIG. 1. The range sensor according to the first embodiment generates a high drift field in the entire depleted prongs of the surface-buried region 25 having a fork-like shape gradually increased in width in the planar pattern in the light-receiving area, so as to rapidly transfer the photoelectrons as signal charges in the longitudinal direction of the prongs of the fork-like shape even when the light-receiving area has a large area of which a pixel size is five micrometers square or greater.

The guide region 26a in the range sensor according to the first embodiment is a semiconductor region for guiding the photoelectrons collected in the central portion at the base of the fork-like shape to the respective narrow transfer channels in the charge-modulation portion. The guide region 26a has a stepped shape of which the width in the direction perpendicular to the longitudinal direction of the guide region 26a (in the vertical direction in FIG. 1) is gradually increased from upper-side to lower-side in the drawing of FIG. 1. The range sensor according to the first embodiment generates a high drift field in the entire depleted guide region 26a gradually increased in width in the planar pattern. Accordingly, the photoelectrons as signal charges can rapidly be transferred in the longitudinal direction of the guide region 26a. As understood from the plan view of FIG. 1 and the potential profile of FIG. 5B, the narrow tip of the guide region 26a is in contact with the surface-buried region 25 at the bottom of the potential profile, because carriers generated are transferred to a position at the bottom of the potential profile in the surface-buried region 25. For example, the guide region 26a is formed as a semiconductor region having a higher impurity concentration than the surface-buried region 25 such that a part of an ion-implanted area for forming the surface-buried region 25 is doubly ion-implanted in the planar pattern shown in FIG. 1.

Figure 4A:
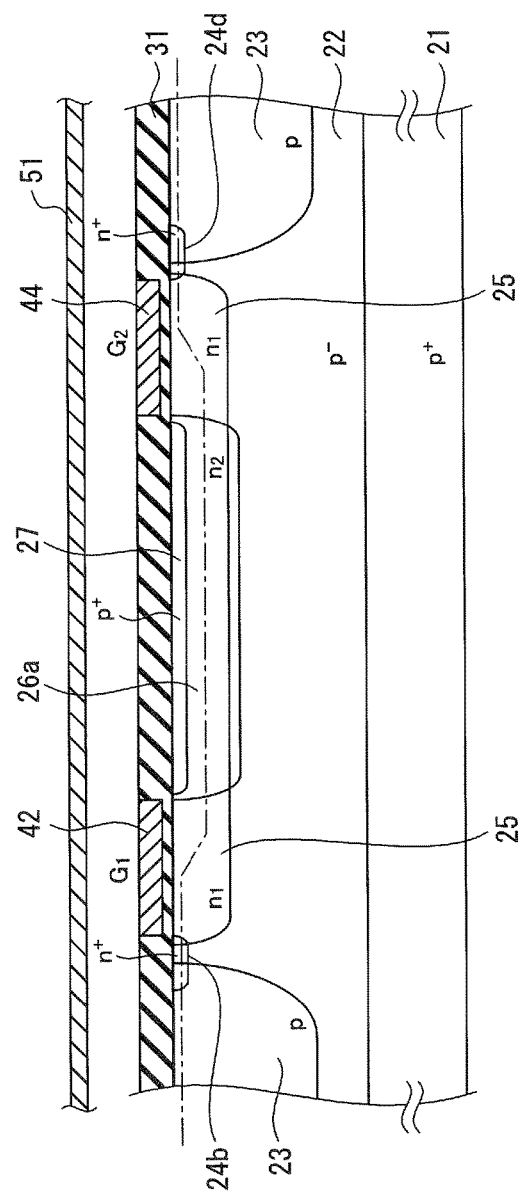
FIG. 4A is a cross-sectional view of the range sensor according to the first embodiment as viewed from direction IV-IV in FIG. 1.

As shown in. FIG. 3A and FIG. 4A, the first transfer-control mechanism (31, 42), the second transfer-control mechanism (31, 44) and the third transfer-control mechanism (31, 43) implementing the range sensor according to the first embodiment include an insulating film 31 provided on the respective branches, and further include a first transfer gate electrode 42, a second transfer gate electrode 44 and a third transfer gate electrode 43, respectively, provided on the insulating film 31. As shown in the cross-sectional views of FIG. 3A and FIG. 4A, the thickness of the insulating film 31 immediately below the respective first transfer gate electrode 42, second transfer gate electrode 44 and third transfer gate electrode 43 is thinner than the other sites, and the thinner parts of the insulating film 31 each serve as a "gate insulating film". The voltage applied to each of the first transfer gate electrode 42, the second transfer gate electrode 44 and the third transfer gate electrode 43 controls potentials in the transfer channels defined by the respective branches, so as to control the signal charge transferred to the first charge-accumulation region 24b, the second charge-accumulation regions 24d and the third charge-accumulation region 24c.

As understood from FIG. 3A, FIG. 4A and FIG. 5A, the p-type pinning layer 27 is buried in a part of the surface-buried region 25, and a part of the insulating film 31 having a greater thickness is provided in contact with the pinning layer 27. Although the guide region 26a cannot be viewed from above because of the upper elements such as the insulating film 31 and the pinning layer 27, the guide region 26a has a planar pattern in which the end portion of the guide region 26a toward the photodiode is exposed to the aperture of the shielding plate 51, and other portions are shielded by the shielding plate 51, in the plan view of the shielding plate 51 as viewed from above. The guide region 26a shown in FIG. 3A either has a constant depth or varies in depth, but preferably has a constant depth because of easiness of manufacture.

The insulating film 31, when serving as a gate insulating film, is preferably a silicon oxide film ($SiO_2$ film), but may use various kinds of film other than the $SiO_2$ film to have an insulating gate structure for an insulated gate transistor (MIS transistor). For example, the insulating film 31 may be an ONO film having a triple-layered structure including a silicon oxide film ($SiO_2$ film), a silicon nitride film ($Si_3N_4$ film), and a silicon oxide film ($SiO_2$ film). Further, a gate insulating film may be used including an oxide containing at least one element selected from strontium (Sr), aluminum (Al), magnesium (Mg), yttrium (Y), hafnium (Hf), zirconium (Zr), tantalum (Ta), and bismuth (Bi), or silicon nitride containing at least one element selected from the above-listed elements.

The actual structure of the insulating film 31 may be a double-layered structure having a stepped shape obtained such that an interlayer insulating film is selectively deposited on a thin insulating film serving as a gate insulating film to surround the first transfer gate electrode 42, the second transfer gate electrode 44 and the third transfer gate electrode 43. Alternatively, the insulating film 31 having a stepped shape may be obtained such that an interlayer insulating film or a field insulating film having a thickness different from that of a gate insulating film is selectively deposited on a region other than the gate insulating film to surround the first transfer gate electrode 42, the second transfer gate electrode 44 and the third transfer gate electrode 43.

The material used for the interlayer insulating film or the field insulating film may be the same as that used for the gate insulating film or may be a different dielectric. For example, the interlayer insulating film may be a dielectric of which relative dielectric constant is smaller than the gate insulating film. Reference numeral 32 shown in FIG. 1 denotes an edge of the field insulating film, and the edge 32 defines an active area. As shown in FIG. 3A, FIG. 4A and FIG. 5A, a p-type well region 23 is buried below the field insulating film.

As understood from FIG. 3A and FIG. 4A, the first charge-accumulation region 24b, the second charge-accumulation regions 24d and the third charge-accumulation region 24c are surrounded by the well region 23 to serve as floating diffusion layers provided above the pixel layer 22. Although the range sensor according to the first embodiment has a structure for illustration purposes in which the number of the floating diffusion layers in which signal charges are accumulated is three, the number of the floating diffusion layers may be two or more than three. FIG. 3A, FIG. 4A and FIG. 5A merely illustrate the case in which the well region 23 is provided to cover regions other than the photodiode per pixel. Since the well region 23 is preferably restrictedly buried only in transistors (see FIG. 10) of the "charge-modulation portion" implemented by the first transfer-control mechanism (31, 42), the second transfer-control mechanism (31, 44) and the third transfer-control mechanism (31, 43) so as not to have an influence on the potential profile, the present invention is not intended to be limited to the arrangement pattern of the well region 23 shown in FIG. 3A, FIG. 4A and FIG. 5A (the arrangement pattern of the well region 23 in the second to seventh embodiments is also the same, and overlapping explanations will not be repeated below).

A portion extending to the middle bar of the T shape of the surface-buried region 25 in the top view of FIG. 1 and corresponding to a straight portion provided toward the light-receiving area is defined as a "trunk path" in the present invention. The range sensor according to the first embodiment is further provided with additional branches extending adjacent to the light-receiving area in the direction perpendicular to the longitudinal direction of the trunk path of the surface-buried region 25. The branches provided in the trunk path adjacent to the light-receiving area have a planar topology; as the entire shape of the surface-buried region 25 provided below the shielding plate 51, having a fishbone shape in which the trunk path in the extending direction corresponds to a backbone part. The respective tips of the additional branches formed into the fishbone shape are connected with a first extraction region 24a and a second extraction region 24e of n-type conductivity having a higher impurity concentration than the surface-buried region 25.

As shown in FIG. 1, the range sensor according to the first embodiment further includes a first extraction control mechanism (31, 41a) provided adjacent to the first extraction region 24a and configured to control extraction of charges toward the first extraction region 24a via one of the additional branches extending in the left direction of the surface-buried region 25, and a second extraction control mechanism (31, 41b) provided adjacent to the second extraction region 24e and configured to control extraction of charges toward the second extraction region 24e via the other branch extending in the right direction of the surface-buried region 25.

As shown in FIG. 2A, the first extraction control mechanism (31, 41a) and the second extraction control mechanism (31, 41b) include the insulating film 31 provided on the respective additional branches, and further include a first extraction gate electrode 41a and a second extraction gate electrode 41b, respectively, provided on the insulating film 31. As shown in the cross-sectional view of FIG. 2A, the thickness of the insulating film 31 immediately below the respective first extraction gate electrode 41a and second extraction gate electrode 41b is thinner than the other sites, and the thinner parts of the insulating film 31 each serve as a gate insulating film. As understood from FIG. 2A, the p-type pinning layer 27 is buried in a part of the surface-buried region 25, and a part of the insulating film 31 having a greater thickness is provided in contact with the pinning layer 27. As shown in FIG. 2A, the p-type well region 23 is provided below the thicker portion of the insulating film 31 serving as a field insulating film.

In other words, as shown in FIG. 1., the range sensor according to the first embodiment is provided with the first extraction gate electrode 41a and the second extraction gate electrode 41 b symmetrically arranged to interpose the trunk path in front of the branch portions of the T shape between the photodiode and the charge-modulation portion. Accordingly, the first extraction gate electrode 41a and the second extraction gate electrode 41b can switch the operation between the extraction of photoelectrons toward the first extraction region 24a and the second extraction region 24e and the transport of the photoelectrons toward the charge-modulation portion including the first transfer-control mechanism (31, 42), the second transfer-control mechanism (31, 44) and the third transfer-control mechanism (31, 43).

FIG. 2A is a cross-sectional view as viewed from direction II-II in FIG. 1, and FIG. 2B is a view illustrating a potential profile corresponding to the cross section of FIG.

2A. FIG. 3A is a cross-sectional view as viewed from direction in FIG. 1, and FIG. 3B is a view illustrating a potential profile corresponding to the cross section of FIG. 3A. When an intermediate potential (M) is applied to the first extraction gate electrode 41a and the second extraction gate electrode 41b arranged symmetrically, a U-shaped potential channel is thrilled in a static induction channel of the trunk path extending to the middle bar of the T shape, while potential barriers remain in the cross-sectional direction as viewed from direction II-II as shown in FIG. 2B. As shown in the potential profile in FIG. 3B, no potential barrier appears in a static induction channel in the cross-sectional view as viewed from direction III-III from the trunk path toward the third charge-accumulation region 24c of the charge-modulation portion. The photoelectrons generated in the photodiode are rapidly transferred to the charge-modulation portion as signal charges via the U-shaped potential channel formed in the static induction channel.

Figure 9:
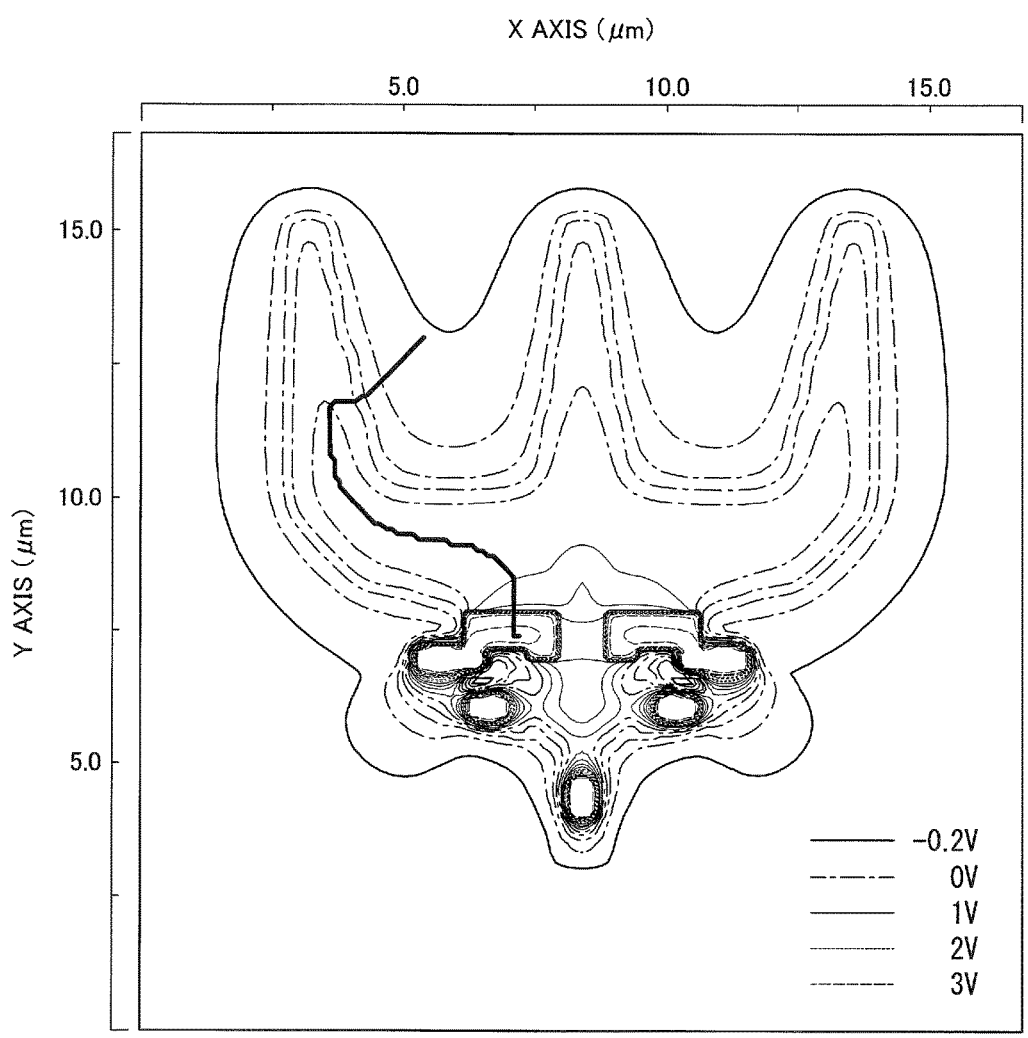
FIG. 9 is a diagram illustrating a potential profile and an extraction path of charges on equipotential lines in the principal part of the range sensor according to the first embodiment when a gate signal of an intermediate potential (M) is applied to a first extraction gate electrode.

When gate signal $G_D$ of a high potential (H) higher than the intermediate potential (M) is applied to the first extraction gate electrode 41a and the second extraction gate electrode 41b in the range sensor according to the first embodiment, the potential barriers on both sides disappear, as indicated by the broken line in the potential profile in the cross-sectional view as viewed from direction II-II as shown in FIG. 2B. Namely, when the gate signal $G_D$ of the high potential (H) higher than the intermediate potential (M) is applied to the first extraction gate electrode 41a, a potential profile indicated by equipotential lines in the plane as shown in FIG. 9 appears. Electrons reached the static induction channel formed in the trunk path are directed to the first extraction region 24a to be extracted along the path as indicated by the very thick solid line shown in FIG. 9. The thick solid line in FIG. 9 indicates an equipotential line in which a potential is −0.2 V (indicated by "−0.2 V" in FIG. 9). The dashed-dotted line in FIG. 9 indicates an equipotential line in which a potential is 0 V or greater and less than 1 V (indicated by "0 V" in FIG. 9) (at 0.25 V intervals from 0 V). The thin solid line in FIG. 9 indicates an equipotential line in which a potential is 1 V or greater and less than 2 V (indicated by "1 V" in FIG. 9) (at 0.25 V intervals from 1 V). The fine broken line in FIG. 9 indicates an equipotential line in which a potential is 2 V or greater and less than 3 V (indicated by "2 V" in FIG. 9) (at 0.25 V intervals from 2 V). The long broken line in FIG. 9 indicates an equipotential line in which a potential is 3 V or greater and less than 4 V (indicated by "3 V" in FIG. 9) (at 0.25 V intervals from 3 V). When the gate signal $G_D$ of the high potential (H) is applied to the second extraction gate electrode 41b, although the potential profile is not shown in the drawing, electrons reached the static induction channel formed in the trunk path are directed to the second extraction region 24e to be extracted.

When the high potential (H) is applied to the first extraction gate electrode 41a and the second extraction gate electrode 41b, the potential profile toward the third charge-accumulation region 24c of the charge-modulation portion shows a topology in which the potential is high in the static induction channel adjacent to a portion immediately below the third transfer gate electrode 43, and a dip is provided at the guide region 26a as indicated by the broken line in FIG. 3B. Thus, the photoelectrons generated in the photodiode cannot reach the third charge-accumulation region 24c of the charge-modulation portion.

When the potential applied to the respective first extraction gate electrode 41a and second extraction gate electrode 41b is set at the intermediate potential (M), the dip at the guide region 26a disappears, as indicated by the solid line in FIG. 3B, so that the photoelectrons generated in the photodiode as signal charges reach the third charge-accumulation region 24c of the charge-modulation portion. The trunk path adjacent to the photodiode, the static induction channel from the trunk path to the charge-modulation portion, and the first transfer-control mechanism (31, 42), the second transfer-control mechanism (31, 44) and the third transfer-control mechanism (31, 43) implementing the charge-modulation portion are shielded from light by the shielding plate 51 so as to prevent direct incident light.

It is characteristic of the range sensor according to the first embodiment to provide the static induction channel with a sufficient length from the trunk path adjacent to the light-receiving area to the charge-modulation portion, and shield the charge-modulation portion including the static induction channel by the shielding plate 51. These characteristics achieve remarkable effects upon reducing the influence of background light while using a pulse at short intervals.

Figure 7:
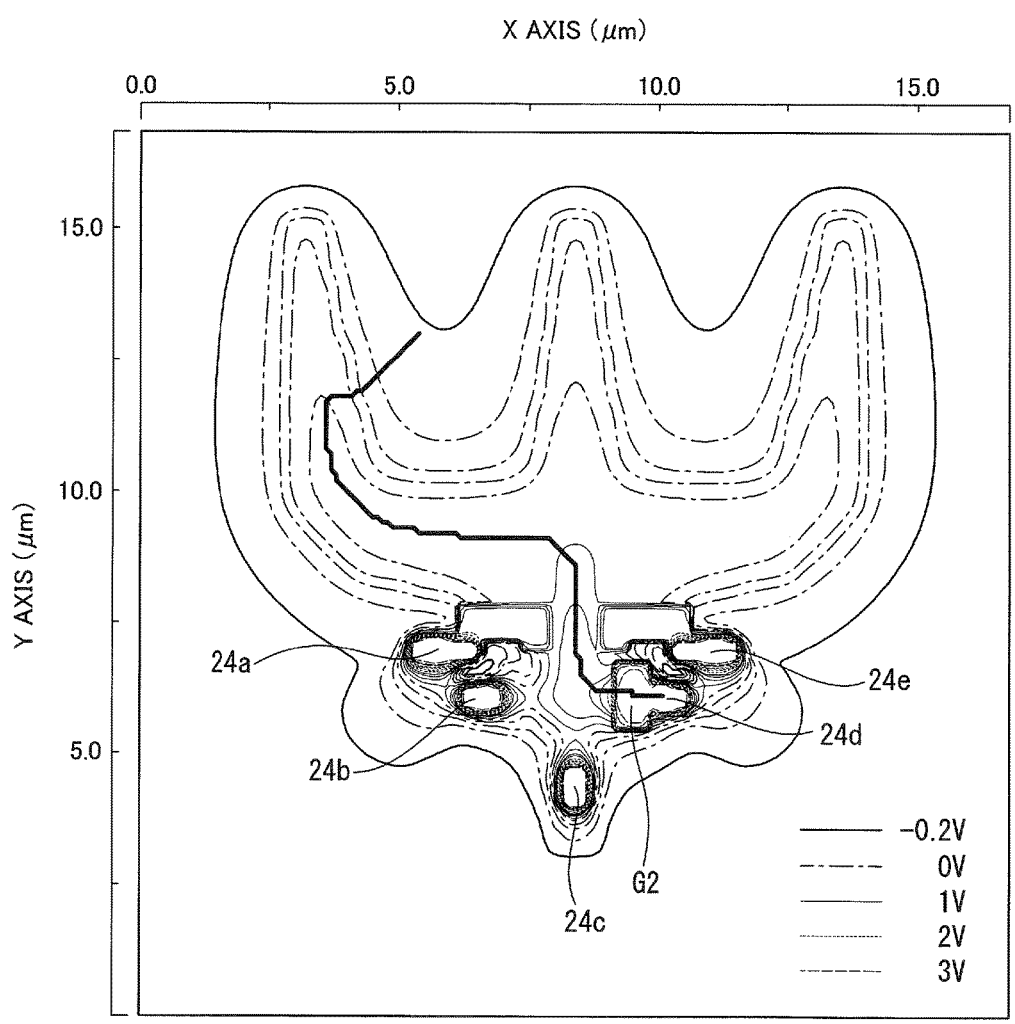
FIG. 7 is a diagram illustrating a potential profile and a transport path of signal charges on equipotential lines in the principal part of the range sensor according to the first embodiment when a gate signal of an intermediate potential (M) is applied to a second transfer gate electrode.
Figure 8:
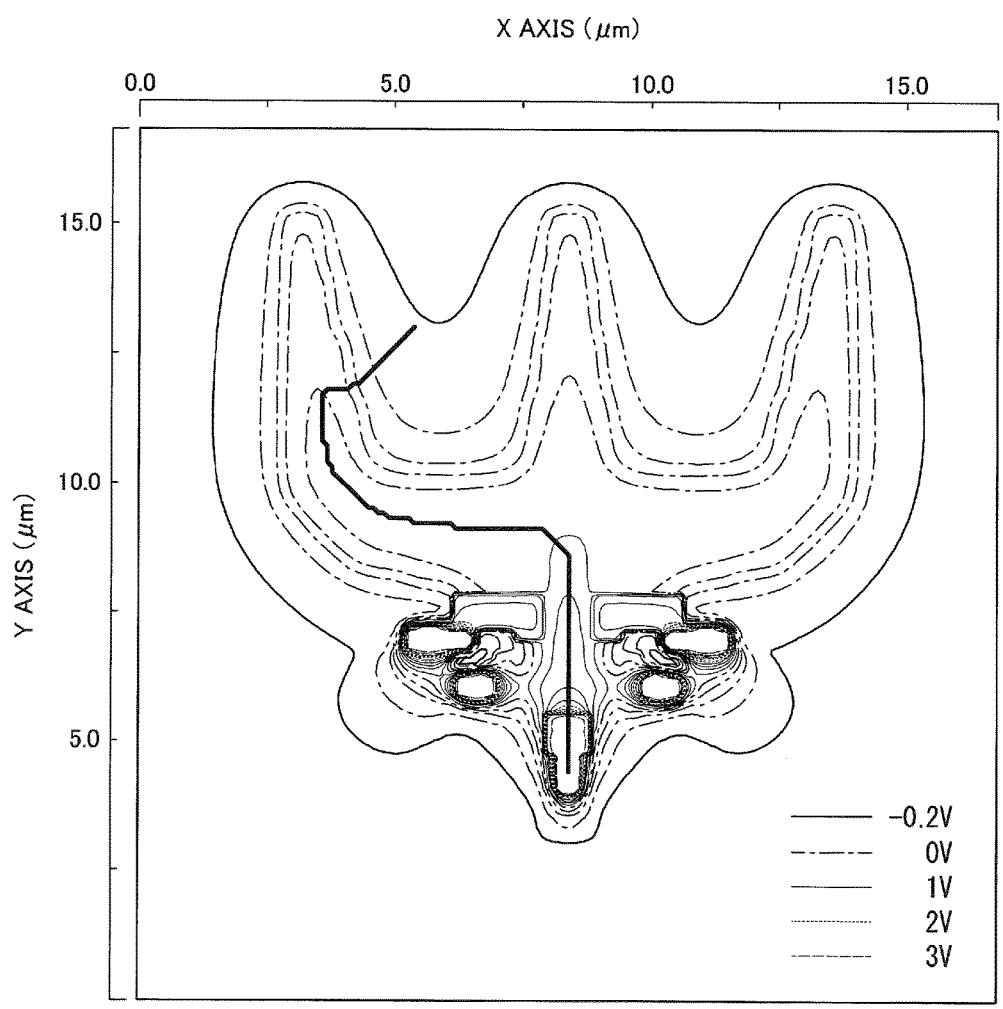
FIG. 8 is a diagram illustrating a potential profile and a transport path of signal charges on equipotential lines in the principal part of the range sensor according to the first embodiment when a gate signal of an intermediate potential (M) is applied to a third transfer gate electrode.

As shown in FIG. 1, the charge-modulation portion in the range sensor according to the first embodiment is provided with three transfer gate electrodes: the first transfer gate electrode 42, the second transfer gate electrode 44, and the third transfer gate electrode 43. When gate signal $G_1$ of the intermediate potential (M) is applied to the first transfer gate electrode 42, the potential profile as shown in FIG. 6 appears. When gate signal $G_2$ of the intermediate potential (M) is applied to the second transfer gate electrode 44, the potential profile as shown in FIG. 7 appears. When gate signal $G_3$ of the intermediate potential (M) is applied to the third transfer gate electrode 43, the potential profile as shown in FIG. 8 appears. Thus, the gate signal of the intermediate potential (M) is applied to each of the first transfer gate electrode 42, the second transfer gate electrode 44 and the third transfer gate electrode 43, so as to rapidly transfer the signal charges to the corresponding first charge-accumulation region 24b, second charge-accumulation regions 24d and third charge-accumulation region 24c along the respective paths as indicated by the thick solid lines in FIG. 6 to FIG. 8. This is the principal operation of the range sensor for detecting photoelectrons in synchronization with a light pulse. In FIG. 6 to FIG. 8, the thick solid line indicates an equipotential line in which a potential is −0.2 V (indicated by "−0.2 V" in FIG. 6 to FIG. 8). The dashed-dotted line indicates an equipotential line in which a potential is 0 V or greater and less than 1 V (indicated by "0 V" in FIG. 6 to FIG. 8) (at 0.25 V intervals from 0 V). The thin solid line indicates an equipotential line in which a potential is 1 V or greater and less than 2 V (indicated by "1 V" in FIG. 6 to FIG. 8) (at 0.25 V intervals from 1 V). The fine broken line indicates an equipotential line in which a potential is 2 V or greater and less than 3 V (indicated by "2 V" in FIG. 6 to FIG. 8) (at 0.25 V intervals from 2 V). The long broken line indicates an equipotential line in which a potential is 3 V or greater and less than 4 V (indicated by "3 V" in FIG. 6 to FIG. 8) (at 0.25 V intervals from 3 V).

The number of the transfer gate electrodes provided in the charge-modulation portion may be two or four or more. However, the area of the charge-modulation portion is preferably reduced as much as possible. For example, the area of the charge-modulation portion is preferably set at less than or equal to a quarter of the area of the photodiode.

Figure 4B:
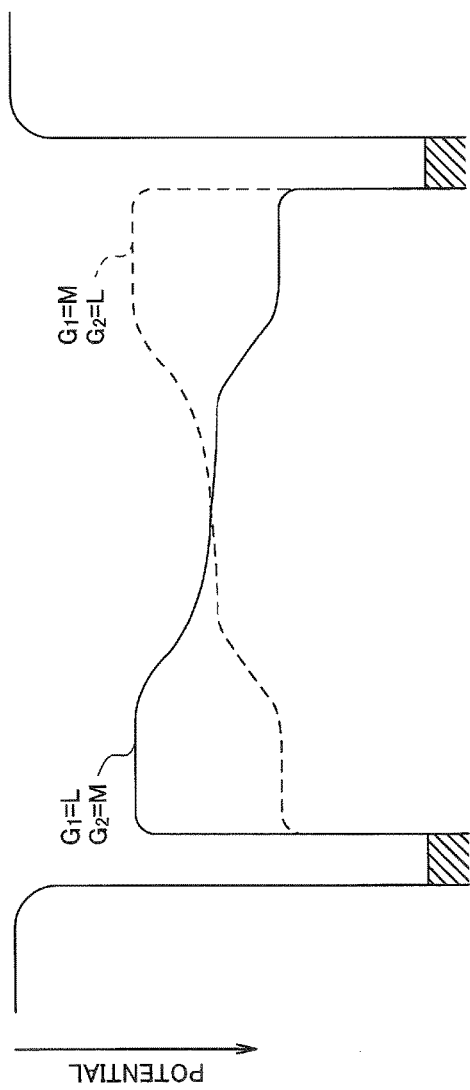
FIG. 4B is a view illustrating a potential profile for the structure illustrated in FIG. 4A.

When the range sensor according to the first embodiment is used as a range image sensor for implementing time-of-flight measurement while canceling the influence (offset) of background light, the use of three outputs is effective. FIG. 3B and FIG. 4B show a voltage level of the gate signal $G_1$ applied to the first transfer gate electrode 42, a voltage level of the gate signal $G_3$ applied to the third transfer gate electrode 43, a voltage level of the gate signal $G_2$ applied to the second transfer gate electrode 44, and a change in the potential profile of the corresponding charge-modulation portion when the range sensor according to the first embodiment is provided with three outputs.

While the intermediate potential (M) is applied to each of the first extraction gate electrode 41a and the second extraction gate electrode 41b, the voltage level G1 of the gate signal applied to the first transfer gate electrode 42 is set at the low potential (L), the voltage level G2 of the gate signal applied to the second transfer gate electrode 44 is set at the low potential (L), and the voltage level G3 of the gate signal applied to the third transfer gate electrode 43 is set at the intermediate potential (M) or the low potential (L) lower than the intermediate potential (M), so as to control whether to transfer the photoelectrons to the third charge-accumulation region 24c implemented as a floating diffusion layer, as shown in FIG. 3.

In addition, the voltage level G3 of the gate signal applied to the third transfer gate electrode 43 is set at the low potential (L), and the voltage level G1 of the gate signal applied to the first transfer gate electrode 42 and the voltage level G2 of the gate signal applied to the second transfer gate electrode 44 are set at either the low potential (L) or the intermediate potential (M) differently from each other, so as to transfer the photoelectrons to either the first charge-accumulation region 24b or the second charge-accumulation region 24d, as shown in FIG. 4.

Figure 10:
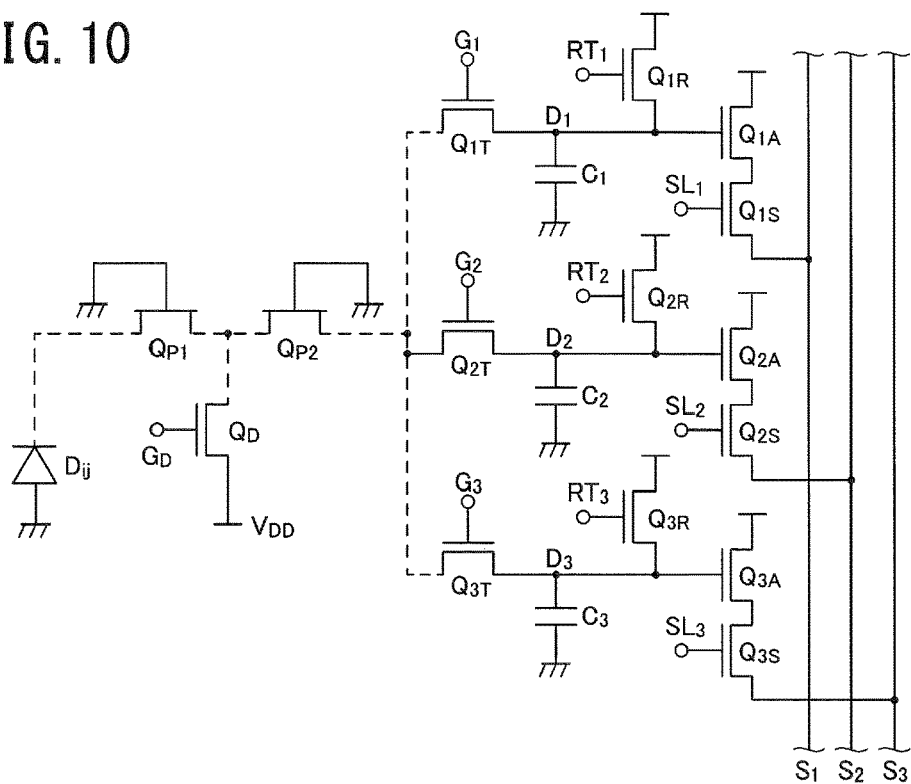
FIG. 10 is a circuit diagram of the principal part of the range sensor according to the first embodiment illustrated with an equivalent circuit.

FIG. 10 illustrates a circuit diagram of an actual one pixel in the range sensor according to the first embodiment. The "charge-modulation portion" in the range sensor according to the first embodiment is implemented by three transistors connected in parallel in the middle in FIG. 10: a first transfer transistor $Q_{1T}$ as the first transfer-control mechanism (31, 42), a second transfer transistor $Q_{2T}$ as the second transfer-control mechanism (31, 44), and a third transfer transistor $Q_{3T}$ as the third transfer-control mechanism (31, 43).

In FIG. 10, the static induction channel from the photo-diode to the charge-modulation portion is indicated by junction field-effect transistors $Q_{P1}$ and $Q_{P2}$ of which own gates are grounded. A source terminal of a MOS transistor $Q_D$ for charge extraction is connected to a center tap of the two junction field-effect transistors $Q_{P1}$ and $Q_{P2}$ connected in series, and a drain terminal of the MOS transistor $Q_D$ is connected to a power source $V_{DD}$ having a high potential.

The broken lines in FIG. 10 indicate paths in which electrons flow rapidly due to a depletion electric field because of the connection in the semiconductor region in FIG. 10, photoelectrons generated in the photodiode $D_{ij}$ immediately reach the charge-modulation portion when the voltage $G_D$ applied to each of the two first extraction gate electrode 41a and second extraction gate electrode 41b implementing the MOS transistor $Q_D$ is set at the low potential (L). When the voltage at the intermediate potential (M) is applied to one of the first transfer gate electrode 42, the second transfer gate electrode 44 and the third transfer gate electrode 43, and the voltage at the low potential (L) is applied to the other two electrodes, the photoelectrons are transferred to one of the first charge-accumulation region 24b, the second charge-accumulation regions 24d and the third charge-accumulation region 24c. The equivalent circuit is illustrated with the first transfer transistor $Q_{1T}$, the second transfer transistor $Q_{2T}$ and the third transfer transistor $Q_{3T}$ implementing the charge-modulation portion, each of which one end is connected to the junction field-effect transistor $Q_{P2}$ in the T-shaped manner.

In the circuit diagram, the other terminals of the first transfer transistor $Q_{1T}$, the second transfer transistor $Q_{2T}$ and the third transfer transistor $Q_{3T}$ are connected to the first charge-accumulation region 24b serving as node $D_1$, the second charge-accumulation region 24d serving as node $D_2$ and the third charge-accumulation region 24c serving as node $D_3$, respectively.

The first charge-accumulation region 24b, the second charge-accumulation regions 24d and the third charge-accumulation region 24c serving as the three nodes $D_1$, $D_3$ and $D_2$ shown in the circuit diagram in FIG. 10 are connected to capacitors $C_1$, $C_3$ and $C_2$, for charge-accumulation. The capacitors $C_1$, $C_3$ and $C_2$ are preferably depletion-mode MOS capacitors in which a threshold voltage is set at a negative voltage so as to reduce voltage dependence. The first node $D_1$ is connected to a gate terminal of a first amplification transistor $Q_{1A}$ implementing a source follower circuit for reading out a potential change in association with a change in the charge amount of the first node $D_1$. The first node $D_1$ is further connected to a first reset transistor $Q_{1R}$ for initializing signal charges after signal readout. A source terminal of the first amplification transistor $Q_{1A}$ is connected to a first selection transistor $Q_{1S}$, serving as a switch for readout image selection. An output of the first selection transistor $Q_{1S}$ is connected to a signal readout line extending in the vertical direction.

The second node $D_2$ is connected to a gate terminal of a second amplification transistor $Q_{2A}$ implementing a source follower circuit for reading out a potential change in association with a change in the charge amount of the second node $D_2$. The second node $D_2$ is further connected to a second reset transistor $Q_{2R}$ for initializing signal charges after signal readout. A source terminal of the second amplification transistor $Q_{2A}$ is connected to a second selection transistor $Q_{2S}$, serving as a switch for readout image selection. An output of the second selection transistor $Q_{2S}$ is connected to a signal readout line extending in the vertical direction.

The third node $D_3$ is connected to a gate terminal of a third amplification transistor $Q_{3A}$ implementing a source follower circuit for reading out a potential change in association with a change in the charge amount of the third node $D_3$. The third node $D_3$ is further connected to a third reset transistor $Q_{3R}$ for initializing signal charges after signal readout. A source terminal of the third amplification transistor $Q_{3A}$ is connected to a third selection transistor $Q_{3S}$, serving as a switch for readout image selection. An output of the third selection transistor $Q_{3S}$ is connected to a signal readout line extending in the vertical direction.

Figure 11:
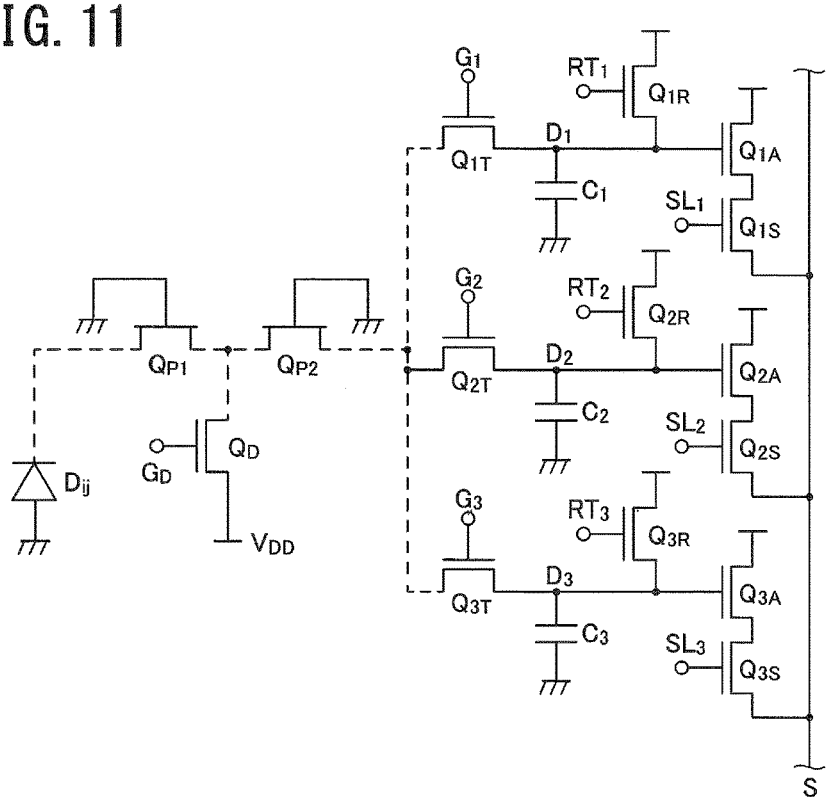
FIG. 11 is another circuit diagram of the principal part of the range sensor according to the first embodiment illustrated with an equivalent circuit.

The signal readout method in the range sensor according to the first embodiment may be either a method of reading out a signal from each of three signal readout lines arranged in parallel as shown in FIG. 10, or a method of turning on a switch sequentially by selection signals SL1, SL2 and SL3 to read out each signal as a time-series signal from a single signal readout line as shown in FIG. 11.

Figure 12:
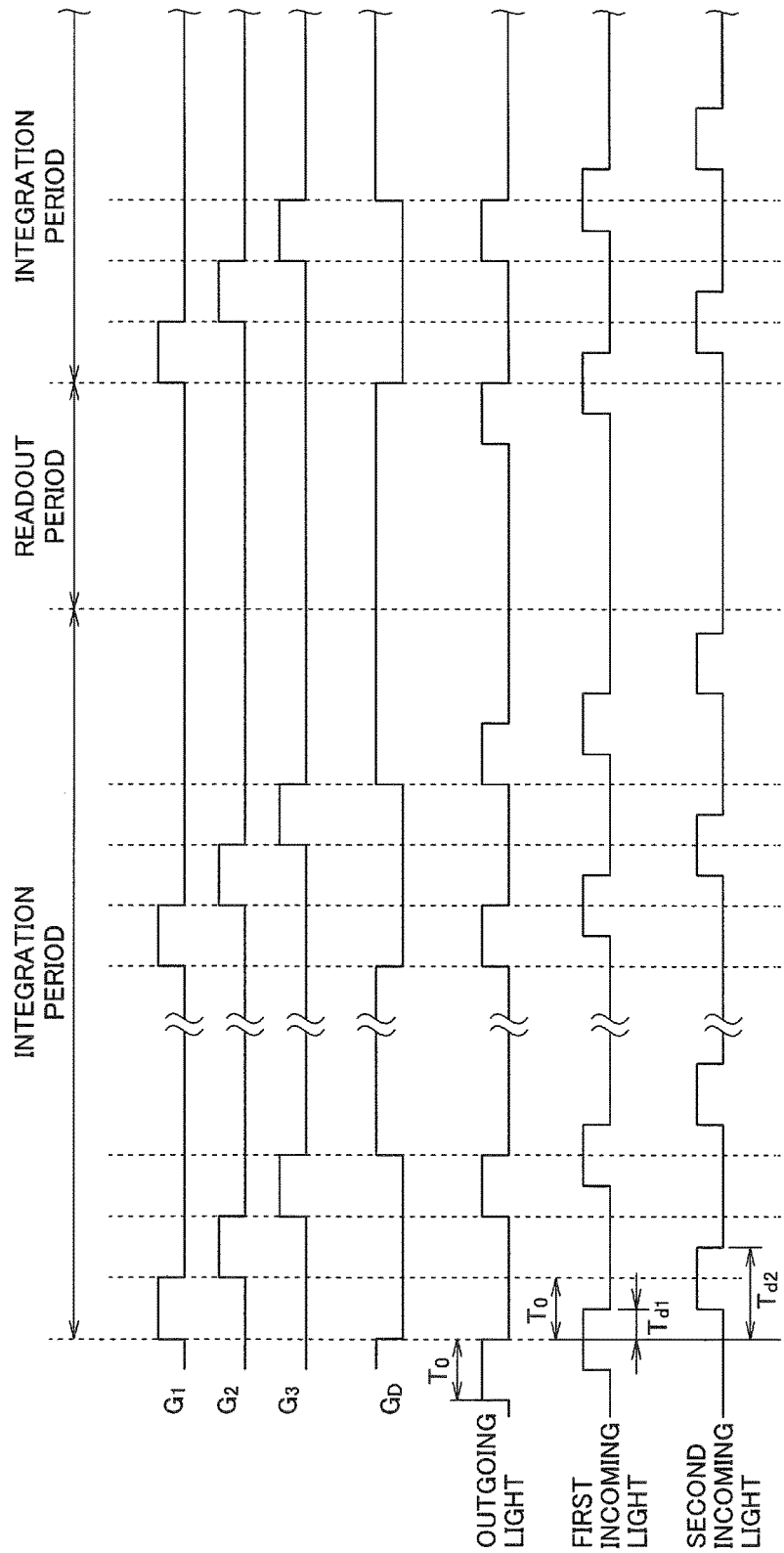
FIG. 12 is a timing diagram when the range sensor according to the first embodiment is operated as a pixel of a range image sensor.

FIG. 12 is a timing diagram when the range sensor according to the first embodiment is used as a range image sensor. A pulse width $T_0$ of outgoing light is the same as a pulse width of each of the gate signal $G_1$ applied to the first transfer gate electrode 42, the gate signal $G_3$ applied to the third transfer gate electrode 43 and the gate signal $G_2$ applied to the second transfer gate electrode 44. When a delay time (time-of-flight) of a pulse of first incoming light (received light) is $T_{d1}$ with respect to the pulse of the outgoing light in FIG. 12, a first stored charges Q1 accumulated in the first charge-accumulation region 24b, a second stored charges Q2 accumulated in the second charge-accumulation region 24d, and a third stored charges Q3 accumulated in the third charge-accumulation region 24c are each obtained according to the following Eq. (a photocurrent generated is defined as $I_{ph}$):

$$Q1 = I_{ph}(T_0 - T_d) + 1_a T_0 \quad (1)$$

$$Q2 = I_{ph} T_d + 1_a T_0 \quad (2)$$

$$Q3 = 1_a T_0 \quad (3)$$

The delay time $T_{d1}$ of the first incoming light is obtained according to the following Eq. with reference to the Eq. (1) to (3):

$$T_{d1} = T_0(Q2 - Q3)/(Q1 + Q2 - 2Q3) \quad (4)$$

As shown in FIG. 12, when a delay time (time-of-flight) of a pulse of second incoming light is $T_{d2}$ with respect to the pulse of the outgoing light, the first stored charges Q1 accumulated in the first charge-accumulation region 24b, the second stored charges Q2 accumulated in the second charge-accumulation region 24d, and the third stored charges Q3 accumulated in the third charge-accumulation region 24c are each obtained according to the following Eq.:

$$Q1 = 1_a T_0 \quad (5)$$

$$Q2 = I_{ph}(2T_0 - T_{d2}) + 1_a T_0 \quad (6)$$

$$Q3 = I_{ph}(T_{d2} - T_0) + 1_a T_0 \quad (7)$$

The delay time $T_{d2}$ of the second incoming light is obtained according to the following Eq. with reference to the Eq. (5) to (7):

$$T_{d2} = T_0 + T_0(Q3 - Q1)/(Q2 + Q3 - 2Q1) \quad (8)$$

Whether or not the time-of-flight of the light pulse is greater than the pulse width $T_0$ of the outgoing light can be confirmed by the comparison between the first stored charges Q1 and the third stored charges Q3. If Q1>Q3, the time-of-flight of the light pulse is calculated according to the Eq. (4). If Q1≤Q3, the time-of-flight of the light pulse is calculated according to the Eq. (8).

The range sensor according to the first embodiment has the function suitable for the time-of-flight measurement by use of the Eq. (4) or the Eq. (8). The range sensor according to the first embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

<Modified Example of First Embodiment>

Figure 13:
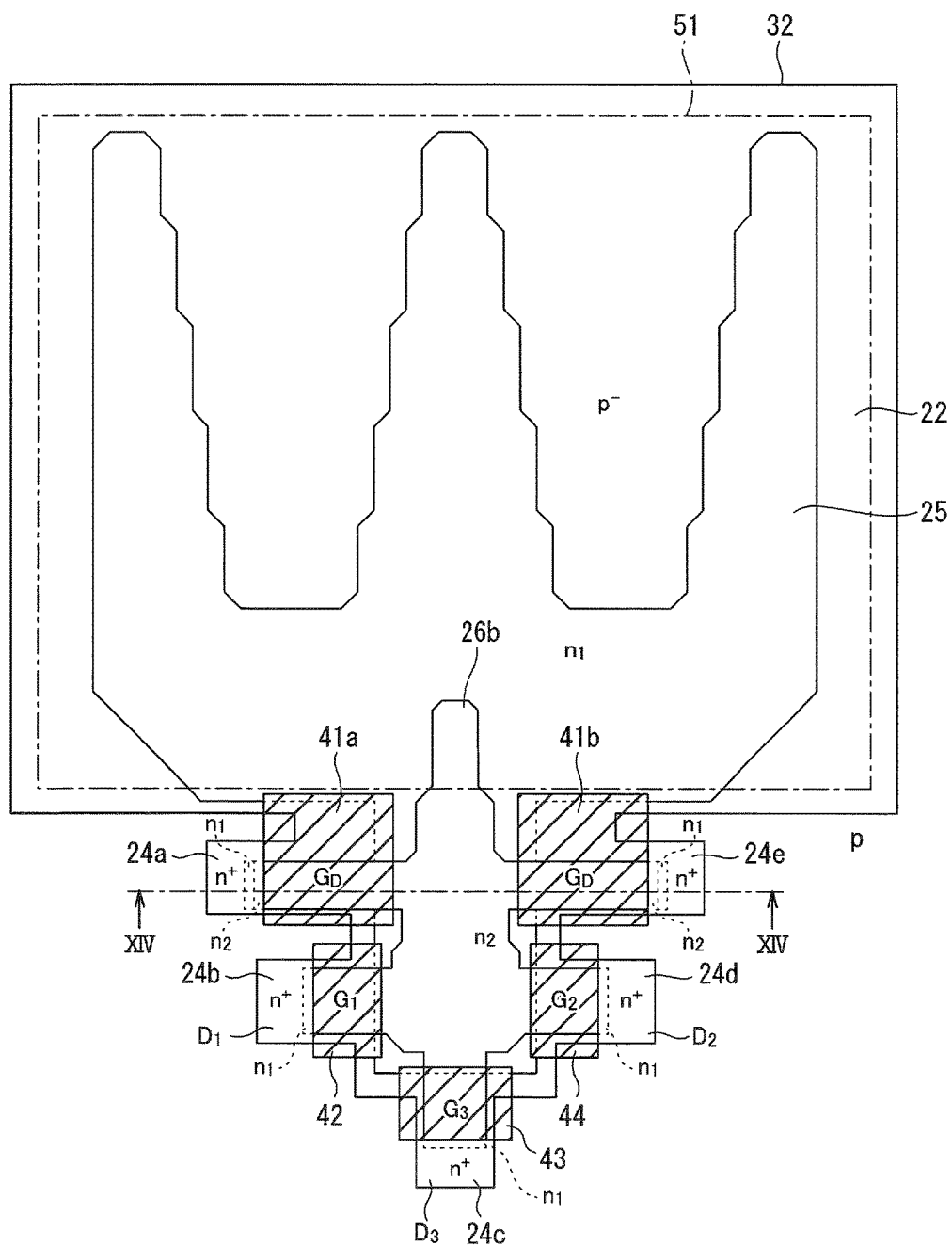
FIG. 13 is a schematic plan view from above of a principal part of a range sensor according to a modified example of the first embodiment of the present invention.

As shown in the schematic plan view from above of the principal part in FIG. 13, a range sensor according to a modified example of the first embodiment is a lock-in pixel including a shielding plate 51 having an aperture defining a light-receiving area. Although not shown in the drawings, the range sensor according to the modified example of the first embodiment has the same cross sections as shown in FIG. 2 to FIG. 4 and includes: a pixel layer 22 made of a semiconductor of a first conductivity type (p-type); the shielding plate 51 having the aperture and provided above the pixel layer 22 to define the light-receiving area on the pixel layer 22 below the aperture; a surface-buried region 25 of a second conductivity type (n-type) selectively buried in the upper portion of the pixel layer 22 to implement a photodiode in the light-receiving area by forming a junction with the pixel layer 22, and extending from the light-receiving area toward plural portions shielded by the shielding plate 51 along the upper portion of the pixel layer 22 so as to delineate a plurality of branches, implementing a T-shaped configuration on the end side; a first charge-accumulation region 24b, a second charge-accumulation region 24d and a third charge-accumulation region 24c of n-type conductivity; which is connected to the tips of the branches and having a higher impurity concentration than the surface-buried region 25; and a first transfer-control mechanism (31, 42), a second transfer-control mechanism (31, 44) and a third transfer-control mechanism (31, 43) provided at the branches adjacent to the first charge-accumulation region 24b, the second charge-accumulation regions 24d and the third charge-accumulation region 24c, respectively, to control a transfer of signal charges to the first charge-accumulation region 24b, the second charge-accumulation regions 24d and the third charge-accumulation region 24c.

The range sensor according to the modified example of the first embodiment is also provided with additional branches extending adjacent to the light-receiving area in the direction perpendicular to the longitudinal direction of the trunk path of the surface-buried region 25, in the same manner as the topology shown in FIG. 1. The respective tips of the branches are connected with a first extraction region 24a and a second extraction region 24e of n-type conductivity having a higher impurity concentration than the surface-buried region 25.

Figure 14:
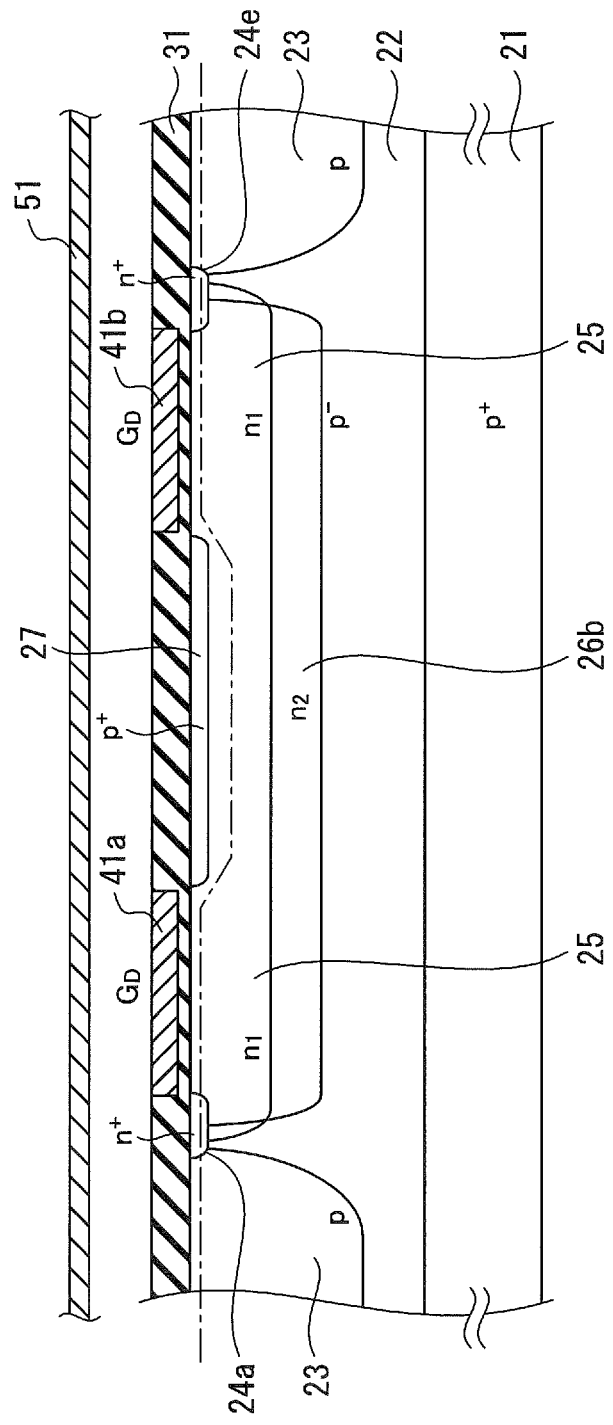
FIG. 14 is a cross-sectional view of the range sensor according to the modified example of the first embodiment as viewed from direction XIV-XIV in FIG. 13.

As understood from the cross-sectional view of FIG. 14, a guide region 26b buried in a part of the upper portion of the surface-buried region 25 and having a higher impurity concentration than the surface-buried region 25 and a lower impurity concentration than the first charge-accumulation region 24b, the second charge-accumulation regions 24d and the third charge-accumulation region 24c, differs in the topology from the guide region 26a shown in FIG. 1. In the range sensor according to the modified example of the first embodiment, the guide region 26b differs from the guide region 26a shown in FIG. 1 in the topology including a path from one end provided below a part of the aperture of the shielding plate 51 to other ends extending to at least part of the respective transfer-control mechanisms, and a path extending to the first extraction region 24a and the second extraction region 24e along the additional branches extending in the direction perpendicular to the longitudinal direction of the trunk path.

As shown in FIG. 13, the range sensor according to the modified example of the first embodiment includes a first extraction control mechanism (31, 41a) provided in the guide region 26b provided at the branch extending in the left direction of the surface-buried region 25 adjacent to the first extraction region 24a and configured to control extraction of charges toward the first extraction region 24a via one of the additional branches on the left side, and a second extraction control mechanism (31, 41b) provided in the guide region 26b provided at the branch extending in the right direction of the surface-buried region 25 adjacent to the second extraction region 24e and configured to control extraction of charges toward the second extraction region 24e via the other branch on the right side.

Namely, as shown in FIG. 14, the guide region 26b is buried below a first extraction gate electrode 41a implementing the first extraction control mechanism (31, 41a) and below a second extraction gate electrode 41b implementing the second extraction control mechanism (31, 41b). As shown in FIG. 13, the guide region 26b extends below the first extraction gate electrode 41a and the second extraction gate electrode 41b to reach the first extraction region 24a and the second extraction region 24e, so as to control extraction of photoelectrons at relatively low extraction gate voltage $G_D$.

The range sensor according to the modified example of the first embodiment has the same structure as shown in FIG. 3A and FIG. 4A, in which a p-type pinning layer 27 is provided in contact with the surface of the surface-buried region 25, and the pixel layer 22 is laminated on a p-type semiconductor substrate 21. The other elements, including the surface-buried region 25 of n-type conductivity, which implements a photodiode having a comb-like (fork-like) shape in a plan view to collect photoelectrons in the central portion at the base of the fork-like shape so as to rapidly transfer the photoelectrons generated in the light-receiving area having a large area of which the pixel size is five micrometers square or greater to the charge-modulation portion including the first transfer-control mechanism (31, 42), the second transfer-control mechanism (31, 44) and the third transfer-control mechanism (31, 43), are also the same as in the range sensor according to the first embodiment shown in FIG. 1, and overlapping explanations are not repeated below.

Since the range sensor according to the modified example of the first embodiment includes the guide region 26b having the planar topology as shown in FIG. 13, the first extraction gate electrode 41a and the second extraction gate electrode 41b can switch the operation between the extraction of photoelectrons toward the first extraction region 24a and the second extraction region 24e and the transport of the photoelectrons toward the charge-modulation portion including the first transfer-control mechanism (31, 42), the second transfer-control mechanism (31, 44) and the third transfer-control mechanism (31, 43).

(Second Embodiment)

Figure 15:
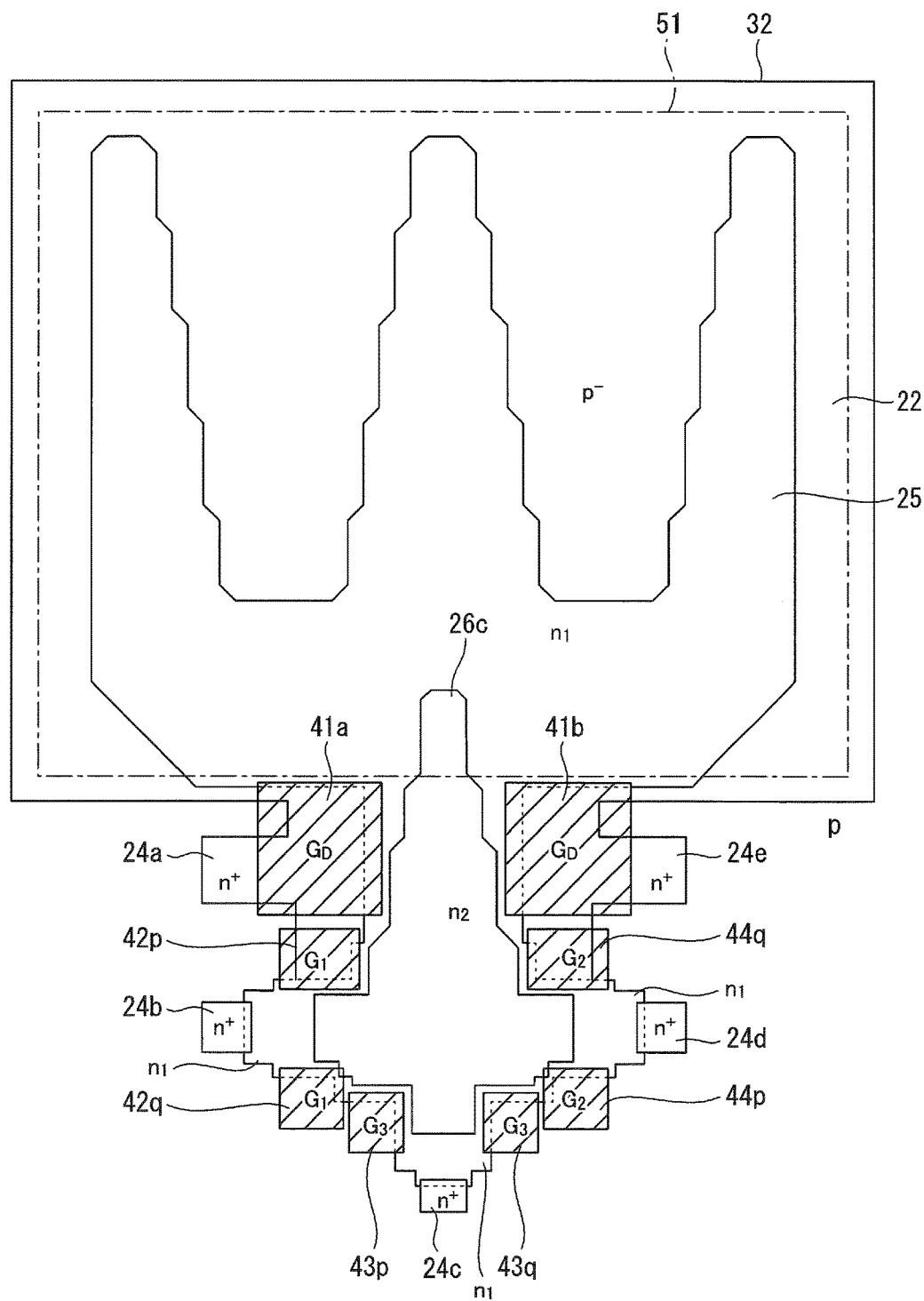
FIG. 15 is a schematic plan view from above of a principal part of a range sensor according to a second embodiment of the present invention.

A range sensor according to the second embodiment of the present invention is a lock-in pixel including a shielding plate 51 having an aperture indicated by the dashed-dotted line in FIG. 15 to define a light-receiving area. The range sensor according to the second embodiment fundamentally has the same structure as the range sensor according to the first embodiment, as shown in the cross-sectional views of FIG. 2 to FIG. 4, and serves as a lock-in pixel including: a pixel layer 22 made of a semiconductor of a first conductivity type (p-type); the shielding plate 51 having the aperture and provided above the pixel layer 22 to define the light-receiving area on the pixel layer 22 below the aperture; a surface-buried region 25 of a second conductivity type (n-type) selectively buried in the upper portion of the pixel layer 22 to implement a photodiode in the light-receiving area by forming a junction with the pixel layer 22, and extending from the light-receiving area toward plural portions shielded by the shielding plate 51 along the upper portion of the pixel layer 22 so as to delineate a plurality of branches, implementing a T-shaped configuration on the end side; a first charge-accumulation region 24b, a second charge-accumulation region 24d and a third charge-accumulation region 24c of n-type conductivity, which is connected to the tips of the branches and having a higher impurity concentration than the surface-buried region 25; a first transfer-control mechanism (31, 42p, 42q), a second transfer-control mechanism (31, 44p, 44q) and a third transfer-control mechanism (31, 43p, 43q) provided at the branches adjacent to the first charge-accumulation region 24b, the second charge-accumulation regions 24d and the third charge-accumulation region 24c, respectively, to control a transfer of signal charges to the first charge-accumulation region 24b, the second charge-accumulation regions 24d and the third charge-accumulation region 24c; and an n-type guide region 26a buried in a part of the upper portion of the surface-buried region 25 with one end provided below a part of the aperture and other protruding-edges extending to at least a part of the respective transfer-control mechanisms, and having a higher impurity concentration than the surface-buried region 25 and a lower impurity concentration than the first charge-accumulation region 24b, the second charge-accumulation regions 24d and the third charge-accumulation region 24c.

The first transfer-control mechanism (31, 42p, 42q) implementing the range sensor according to the second embodiment differs from the transfer-control mechanism in the range sensor according to the first embodiment in that the first transfer-control mechanism (31, 42p, 42q) includes a pair of first field-control electrodes 42p and 42q deposited on the pixel layer 22 via an insulating film while interposing the branch extending on the left side of the T-shaped topology. The insulating film is a "gate insulating film" of which the thickness immediately below the pair of the first field-control electrodes 42p and 42q is thinner than the other sites, as in the case of the insulating film 31 provided immediately below the first transfer gate electrode 42, the second transfer gate electrode 44 and the third transfer gate electrode 43 as shown in FIG. 3A and FIG. 4A. The insulating film in the range sensor according to the second embodiment may use the same material as the insulating film 31 in the range sensor according to the first embodiment.

The first field-control electrodes 42p and 42q are opposed to each other while interposing the branch extending on the left side and provided in the direction perpendicular to the transfer direction of signal charges along the branch on the left side. The operation mechanism of the first field-control electrodes 42p and 42q differs from the transfer-control mechanism in the range sensor according to the first embodiment in exhibiting a "lateral electric field control effect" of controlling the movement of signal charge transferred in the branch extending on the left side by applying an field-control voltage to the respective first field-control electrodes 42p and 42q to change a depletion potential in the branch extending on the left side.

The second transfer-control mechanism (31, 44p, 44q) implementing the range sensor according to the second embodiment includes a pair of second field-control electrodes 44p and 44q deposited on the pixel layer 22 via an insulating film while interposing the branch extending on the right side of the T-shaped topology. The insulating film is a "gate insulating film" of which the thickness immediately below the second field-control electrodes 44p and 44q is thinner than the other sites. The second field-control electrodes 44p and 44q are opposed to each other while interposing the branch extending on the right side and provided in the direction perpendicular to the transfer direction of signal charges along the branch on the right side. An field-control voltage, which is different from that applied to the respective second field-control electrodes 42p and 42q, is applied to the respective second field-control electrodes 44p and 44q to change a depletion potential in the branch extending on the right side, so as to control the movement of signal charge transferred in the branch extending on the right side.

The third transfer-control mechanism (31, 43p, 43q) implementing the range sensor according to the second embodiment includes a pair of third field-control electrodes 43p and 43q deposited on the pixel layer 22 via an insulating film while interposing the branch extending on the bottom side of the T-shaped topology. The insulating film is a "gate insulating film" of which the thickness immediately below the third field-control electrodes 43p and 43q is thinner than the other sites. The third field-control electrodes 43p and 43q are opposed to each other while interposing the branch extending on the bottom side and provided in the direction perpendicular to the transfer direction of signal charges along the branch on the bottom side. An field-control voltage, which is different from that applied to the first field-control electrodes 42p and 42q and the second field-control electrodes 44p and 44q, is applied to the respective third field-control electrodes 43p and 43q to change a depletion potential in the branch extending on the bottom side, so as to control the movement of signal charge transferred in the branch extending on the bottom side.

The range sensor according to the second embodiment s also provided with additional branches extending adjacent to the light-receiving area in the direction perpendicular to the longitudinal direction of the trunk path of the surface-buried region 25, as shown in the top view of FIG. 15. The respective tips of the branches are connected with a first extraction region 24a and a second extraction region 24e of n-type conductivity having a higher impurity concentration than the surface-buried region 25.

As shown in FIG. 15, the range sensor according to the second embodiment includes a first extraction control mechanism (31, 41a) provided adjacent to the first extraction region 24a and configured to control extraction of charges toward the first extraction region 24a via one of the additional branches extending in the left direction of the surface-buried region 25, and a second extraction control mechanism (31, 41b) provided adjacent to the second extraction region 24e and configured to control extraction of charges toward the second extraction region 24e via the other branch extending in the right direction of the surface-buried region 25, as in the case of the range sensor according to the first embodiment.

The range sensor according to the second embodiment has substantially the same structure with regard to the other elements as the range sensor according to the first embodiment, in which the first extraction control mechanism (31, 41a) and the second extraction control mechanism (31, 41b) include an insulating film provided on the respective additional branches and further include a first extraction gate electrode 41a and a second extraction gate electrode 41b, respectively, provided on the insulating film, as in the case of the cross section shown in FIG. 2A; a p-type pinning layer 27 is provided in contact with the surface of the surface-buried region 25, as in the case of the cross sections of FIG. 2 to FIG. 4; and the pixel layer 22 is laminated on a p-type semiconductor substrate 21. Thus, overlapping explanations are not repeated below.

As shown in FIG. 15, the range sensor according to the second embodiment is provided with the first extraction gate electrode 41a and the second extraction gate electrode 41b symmetrically arranged to interpose the trunk path in front of the branch portions of the T shape between the photodiode and the charge-modulation portion. Accordingly,the first extraction gate electrode 41a and the second extraction gate electrode 41b can switch the operation between the extraction of photoelectrons toward the first extraction region 24a and the second extraction region 24e and the transport of the photoelectrons toward the charge-modulation portion including the first transfer-control mechanism (31, 42p, 42q), the second transfer-control mechanism (31, 44p, 44q) and the third transfer-control mechanism (31, 43p, 43q).

The range sensor according to the second embodiment also has the function suitable for the time-of-flight measurement by use of the Eq. (4) or the Eq. (8) as described in the first embodiment. The range sensor according to the second embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

As in the case of the range sensor according to the first embodiment, the range sensor according to the second embodiment is provided with the static induction channel having a sufficient length from the trunk path adjacent to the light-receiving area to the charge-modulation portion, which is shielded by the shielding plate 51, so as to achieve remarkable effects upon reducing the influence of background light while using a pulse at short intervals.

The range sensor and the solid-state imaging device according to the second embodiment exhibit the lateral electric field control effect by applying the field-control voltage to each of the first field-control electrodes 42p and 42q, the second field-control electrodes 44p and 44q and the third field-control electrodes 43p and 43q, so as to transfer charges to the first charge-accumulation region 24b, the second charge-accumulation region 24d and the third charge-accumulation region 24c shown in FIG. 15 more rapidly than the case of using "the transfer gate method" as described in the first embodiment.

(Third Embodiment)

Figure 16:
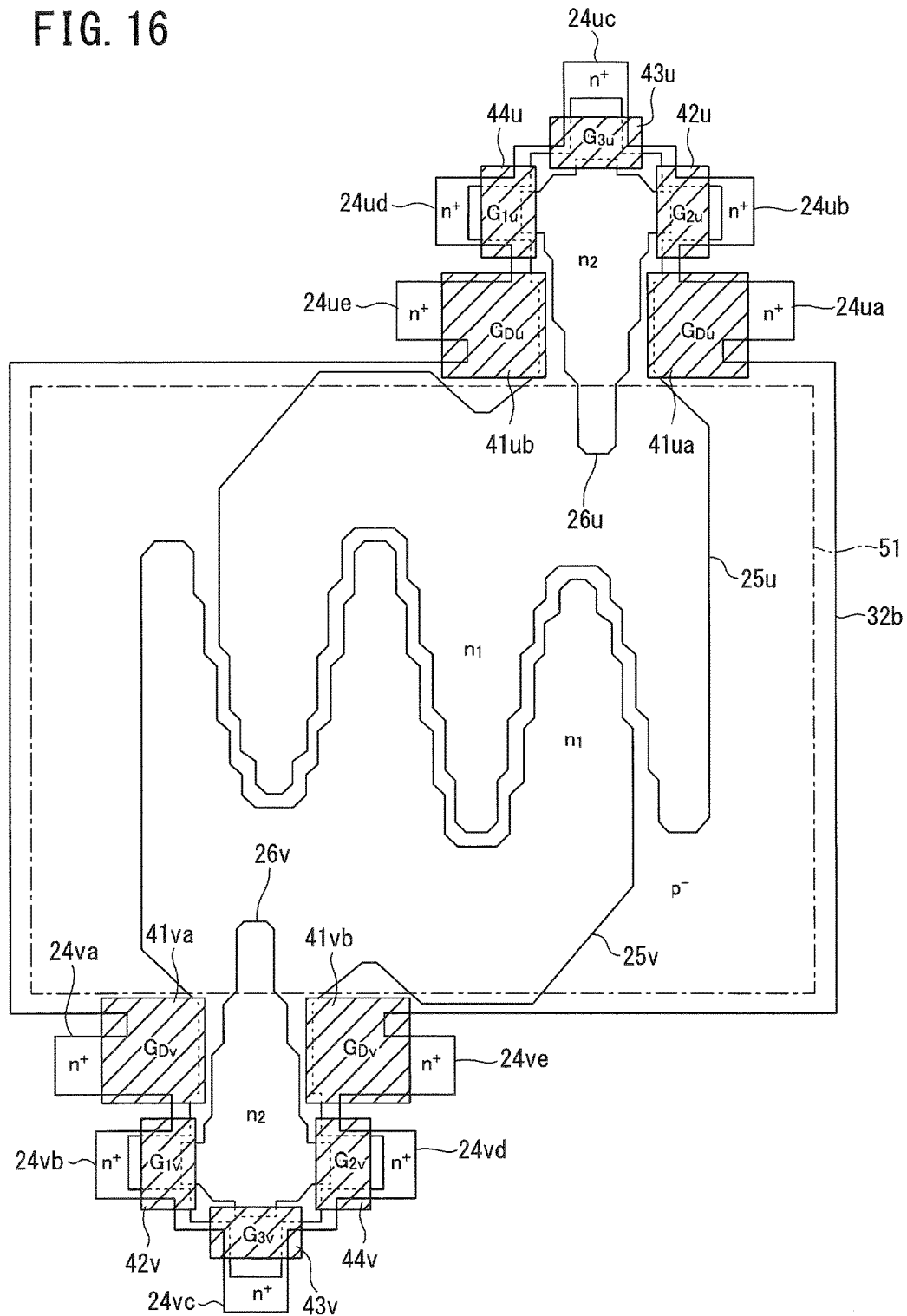
FIG. 16 is a schematic plan view from above of a principal part of a range sensor according to a third embodiment of the present invention.

A range sensor according to the third embodiment of the present invention is a lock-in pixel including a first surface-buried region 25u and a second surface-buried region 25v opposed in an interdigital manner inside a light-receiving area defined by a shielding plate 51 having a single aperture indicated by the dashed-dotted line as shown in the schematic plan view from above of the principal part in FIG. 16. Reference numeral 32b shown in FIG. 16 denotes an edge of a field insulating film. Namely, an area surrounded by the edge 32b defines an active area of the lock-in pixel. The range sensor according to the third embodiment thus includes two surface-buried regions in one pixel. As in the case shown in the cross sections of FIG. 2A, FIG. 3A and FIG. 4A, a p-type well region 23 is buried below the field insulating film (not shown).

When focused on the first surface-buried region 25u provided in the light-receiving area on the upper side in FIG. 16, the range sensor according to the third embodiment has a structure on one side of the lock-in pixel similar to that shown in the cross sections of FIG. 2 to FIG. 4, including: a pixel layer 22 made of a semiconductor of a first conductivity type (p-type); the first surface-buried region 25u of a second conductivity type (n-type) selectively buried in the upper portion of the pixel layer 22 to implement a first photodiode in the light-receiving area by forming a junction with the pixel layer 22, and having a first branch structure extending from the light-receiving area toward plural portions shielded by the shielding plate 51 along the upper portion of the pixel layer 22 so as to delineate a plurality of branches, implementing a T-shaped configuration on the end side; a first upper charge-accumulation region 24ub, a second upper charge-accumulation region 24*ud* and a third upper charge-accumulation region 24*uc* of n-type conductivity, which are connected to the respective tips of the T-shaped first branch structure and having a higher impurity concentration than the first surface-buried region 25*u* ; a first upper transfer-control mechanism (31, 42*u*), a second upper transfer-control mechanism (31, 44*u*) and a third upper transfer-control mechanism (31, 43*u*) provided at the branches of the T-shaped first branch structure adjacent to the first upper charge-accumulation region 24*ub*, the second upper charge-accumulation region 24*ud* and the third upper charge-accumulation region 24*uc*, respectively; to control a transfer of signal charges to the first upper charge-accumulation region 24*ub*, the second upper charge-accumulation region 24*ud* and the third upper charge-accumulation region 24*uc*; and a first guide region 26*u* of n-type conductivity, which is buried in a part of the upper portion of the first surface-buried region 25*u* with one end provided below a part of the first surface-buried region 25*u* and other protruding-edges extending to at least a part of the respective transfer-control mechanisms, and having a higher impurity concentration than the first surface-buried region 25*u* and a lower impurity concentration than the first upper charge-accumulation region 24*ub*, the second upper charge-accumulation region 24*ud* and the third upper charge-accumulation region 24*uc*.

Although not shown in the drawings, the first upper charge-accumulation region 24*ub*, the second upper charge-accumulation region 24*ud* and the third upper charge-accumulation region 24*uc* have the same cross sections as shown in FIG. 2A, FIG. 3A and FIG. 4A and are surrounded by the well region 23 to serve as floating diffusion layers provided above the pixel layer 22. Although the range sensor according to the third embodiment has a structure for illustration purposes in which the number of the floating diffusion layers in which signal charges from the light-receiving area are accumulated is three, the number of the floating diffusion layers may be two or more than three.

The range sensor according to the third embodiment includes a first p-type pinning layer, which is in contact with the surface of the first surface-buried region 25*u* (not shown), as in the case shown in the cross-sectional views of FIG. 2 to FIG. 4. The pixel layer 22 is laminated on a p-type semiconductor substrate.

In the range sensor according to the third embodiment, the first surface-buried region 25*u* of n-type conductivity, which implements the first photodiode, has a fork-like shape in a planar pattern to collect photoelectrons as signal charges generated in the light-receiving area shown in FIG. 16 to the base of the fork-like shape so as to rapidly transfer the photoelectrons to a first charge-modulation portion including the first upper transfer-control mechanism (31, 42*u*), the second upper transfer-control mechanism (31, 44*u*) and the third upper transfer-control mechanism (31, 43*u*). Each of prongs of the fork-like shape has a stepped shape gradually increased in width from bottom to top in the drawing of FIG. 16. The range sensor according to the third embodiment generates a high drift field in the entire depleted branches of the first surface-buried region 25*u* having a fork-like shape gradually increased in width in the planar pattern in the light-receiving area, so as to rapidly transfer the photoelectrons as signal charges in the longitudinal direction of the prongs of the fork-like shape even when the light-receiving area has a large area of which a pixel size is five micrometers square or greater.

The first guide region 26*u* in the range sensor according to the third embodiment is a semiconductor region for guiding the photoelectrons collected in the central portion at the base of the fork-like shape to the respective narrow transfer channels in the charge-modulation portion. The first guide region 26*u* has a stepped shape of which the width in the direction perpendicular to the longitudinal direction (the vertical direction in FIG. 16) of the first guide region 26*u* is gradually increased from bottom to top in the drawing of FIG. 16. The range sensor according to the third embodiment generates a high drift field in the entire depleted first guide region 26*u* gradually increased in width in the planar pattern. Accordingly, the photoelectrons as signal charges can rapidly be transferred along the first guide region 26*u* in the longitudinal direction. As shown in the plan view of FIG. 16, the narrow tip of the first guide region 26*u* is in contact with the first surface-buried region 25*u* to which carriers generated are transferred at a position corresponding to the bottom of the potential profile.

As in the case of the structure shown in FIG. 3A and FIG. 4A, the first upper transfer-control mechanism (31, 42*u*), the second upper transfer-control mechanism (31, 44*u*) and the third upper transfer-control mechanism (31, 43*u*) implementing the range sensor according to the third embodiment include an insulating film 31 provided on the respective branches of the T-shaped first branch structure, and further include a first upper transfer gate electrode 42*u*, a second upper transfer gate electrode 44*u* and a third upper transfer gate electrode 43*u*, respectively, provided on the insulating film 31.

As in the case of the structure shown in FIG. 3A and FIG. 4A, the thickness of the insulating film 31 immediately below the respective first upper transfer gate electrode 42*u*, second upper transfer gate electrode 44*u* and third upper transfer gate electrode 43*u* is thinner than the other sites, and the thinner parts of the insulating film 31 each serve as a "gate insulating film". The voltage applied to each of the first upper transfer gate electrode 42*u*, the second upper transfer gate electrode 44*u* and the third upper transfer gate electrode 43*u* controls potentials in the transfer channels defined by the respective branches of the T-shaped first branch structure, so as to control the signal charge transferred to the first upper charge-accumulation region 24*ub*, the second upper charge-accumulation region 24*ud* and the third upper charge-accumulation region 24*uc*.

The actual structure of the insulating film 31 may be a double-layered structure having a stepped shape obtained such that an interlayer insulating film is selectively deposited on a thin insulating film serving as a gate insulating film to surround the first upper transfer gate electrode 42*u*, the second upper transfer gate electrode 44*u* and the third upper transfer gate electrode 43*u*. Alternatively, the insulating film 31 having a stepped shape may be obtained such that an interlayer insulating film or a field insulating film having a thickness different from that of a gate insulating film is selectively deposited on a region other than the gate insulating film to surround the first upper transfer gate electrode 42*u*, the second upper transfer gate electrode 44*u* and the third upper transfer gate electrode 43*u*. The material used for the interlayer insulating film or the field insulating film may be the same as that used for the gate insulating film or may be a different dielectric. For example, the interlayer insulating film may be a dielectric of which relative dielectric constant is smaller than the gate insulating film.

Although the first guide region 26*u* cannot be viewed from above because of the upper elements such as the insulating film 31 and the first pinning layer, the first guide region 26*u* has a planar pattern in which the end portion of the first guide region 26*u* toward the first photodiode is exposed to the aperture of the shielding plate 51, and other portions are shielded by the shielding plate 51, in the plan view of the shielding plate 51 as viewed from above.

The range sensor according to the third embodiment is provided with additional branches extending on both sides of the trunk path in the direction perpendicular to the longitudinal direction of the trunk path which is a trunk portion of the first branch structure of the first surface-buried region 25u. The respective tips of the additional branches extending in the lateral direction are connected with a first upper extraction region 24ua and a second upper extraction region 24ue of n-type conductivity having a higher impurity concentration than the first surface-buried region 25u. As shown in FIG. 16, the range sensor according to the third embodiment further includes a first upper extraction control mechanism (31, 41ua) provided adjacent to the first upper extraction region 24ua and configured to control extraction of charges toward the first upper extraction region 24ua via one of the additional branches extending in the right direction of the first surface-buried region 25u, and a second upper extraction control mechanism (31, 41ub) provided adjacent to the second upper extraction region 24ue and configured to control extraction of charges toward the second upper extraction region 24ue via the other branch extending in the left direction of the first surface-buried region 25u.

As in the case of the structure shown in FIG. 2A, the first upper extraction control mechanism (31, 41ua) and the second upper extraction control mechanism (31, 41ub) include an insulating film 31 provided on the respective additional branches of the first surface-buried region 25u, and further include a first upper extraction gate electrode 41ua and a second upper extraction gate electrode 41ub, respectively, provided on the insulating film 31. As in the case of the structure shown in FIG. 2A, the thickness of the insulating film 31 immediately below the respective first upper extraction gate electrode 41ua and the second upper extraction gate electrode 41ub is thinner than the other sites, and the thinner parts of the insulating film 31 each serve as a "gate insulating film".

When focused on the second surface-buried region 25v provided in the light-receiving area on the lower side in FIG. 16, the range sensor according to the third embodiment has a structure on the other side of the lock-in pixel including: the second surface-buried region 25v of a second conductivity type (n-type) selectively buried in the upper portion of the pixel layer 22 to implement a second photodiode in the light-receiving area by forming a junction with the pixel layer 22, and having a second branch structure extending from the light-receiving area toward plural portions shielded by the shielding plate 51 along the upper portion of the pixel layer 22 so as to delineate a plurality of branches, implementing a T-shaped configuration on the end side; a first lower charge-accumulation region 24vb, a second lower charge-accumulation region 24vd and a third lower charge-accumulation region 24vc of n-type conductivity, which is connected to the tips of the T-shaped second branch structure and having a higher impurity concentration than the second surface-buried region 25v; a first lower transfer-control mechanism (31, 42v), a second lower transfer-control mechanism (31, 44v) and a third lower transfer-control mechanism (31, 43v) provided at the branches of the T-shaped second branch structure adjacent to the first lower charge-accumulation region 24vb, the second lower charge-accumulation region 24vd and the third lower charge-accumulation region 24vc, respectively, to control a transfer of signal charges to the first lower charge-accumulation region 24vb, the second lower charge-accumulation region 24vd and the third lower charge-accumulation region 24vc; and a second guide region 26v of n-type conductivity, which is buried in a part of the upper portion of the second surface-buried region 25v with one end provided below a part of the second surface-buried region 25v and other protruding-edges extending to at least a part of the respective transfer-control mechanisms, and having a higher impurity concentration than the second surface-buried region 25v and a lower impurity concentration than the first lower charge-accumulation region 24vb, the second lower charge-accumulation region 24vd and the third lower charge-accumulation region 24vc.

Although not shown in the drawings, the first lower charge-accumulation region 24vb, the second lower charge-accumulation region 24vd and the third lower charge-accumulation region 24vc have the same cross sections as shown in FIG. 2A, FIG. 3A and FIG. 4A and are surrounded by the well region 23 to serve as floating diffusion layers provided above the pixel layer 22. Although the range sensor according to the third embodiment has a structure for illustration purposes in which the number of the floating diffusion layers in which signal charges from the light-receiving area are accumulated is three, the number of the floating diffusion layers may be two or more than three.

The range sensor according to the third embodiment includes a second p-type pinning layer, which is in contact with the surface of the second surface-buried region 25v (not shown), as in the case shown in the cross-sectional views of FIG. 2 to FIG. 4. In the range sensor according to the third embodiment, the second surface-buried region 25v of n-type conductivity, which implements the second photodiode has a fork-like shape in a plan view to collect photoelectrons generated in the light-receiving area shown in FIG. 16 to the base of the fork-like shape so as to rapidly transfer the photoelectrons to a second charge-modulation portion including the first lower transfer-control mechanism (31, 42v), the second lower transfer-control mechanism (31, 44v) and the third lower transfer-control mechanism (31, 43v). Each of prongs of the fork-like shape has a stepped shape gradually increased in width from upper-side to lower-side in the drawing of FIG. 16. The range sensor according to the third embodiment generates a high drift field in the entire depleted branches of the second surface-buried region 25v having a fork-like shape gradually increased in width in the planar pattern in the light-receiving area, so as to rapidly transfer the photoelectrons as signal charges in the longitudinal direction of the prongs of the fork-like shape even when the light-receiving area has a large area of which a pixel size is five micrometers square or greater.

The second guide region 26v in the range sensor according to the third embodiment is a semiconductor region for guiding the photoelectrons collected in the central portion at the base of the fork-like shape to the respective narrow transfer channels in the charge-modulation portion. The second guide region 26v has a stepped shape of which the width in the direction perpendicular to the longitudinal direction (the vertical direction in FIG. 16) of the second guide region 26v is gradually increased from upper-side to lower-side in the drawing of FIG. 16. The range sensor according to the third embodiment generates a high drift field in the entire depleted second guide region 26v gradually increased in width in the planar pattern. Accordingly, the photoelectrons as signal charges can rapidly be transferred along the second guide region 26v in the longitudinal direction. As shown in the plan view of FIG. 16, the narrow tip of the second guide region 26v is in contact with the second surface-buried region 25v to which carriers generated are transferred at a position corresponding to the bottom of the potential profile.

For example, the first guide region 26u and the guide region 26v are formed as a semiconductor region having a higher impurity concentration than the first surface-buried region 25u and the second surface-buried region 25v such that parts of areas in which ions are implanted to form the respective first surface-buried region 25u and second surface-buried region 25v are doubly ion-implanted according to the planar pattern shown in FIG. 16.

As in the case of the structure shown in FIG. 3A and FIG. 4A, the first lower transfer-control mechanism (31, 42v), the second lower transfer-control mechanism (31, 44v) and the third lower transfer-control mechanism (31, 43v) implementing the range sensor according to the third embodiment include the insulating film 31 provided on the respective branches of the T-shaped second branch structure, and further include a first lower transfer gate electrode 42v, a second lower transfer gate electrode 44v and a third lower transfer gate electrode 43v, respectively, provided on the insulating film 31.

As in the case of the structure shown in FIG. 3A and FIG. 4A, the thickness of the insulating film 31 immediately below the respective first lower transfer gate electrode 42v, second lower transfer gate electrode 44v and third lower transfer gate electrode 43v is thinner than the other sites, and the thinner parts of the insulating film 31 each serve as a "gate insulating film". The voltage applied to each of the first lower transfer gate electrode 42v, the second lower transfer gate electrode 44v and the third lower transfer gate electrode 43v controls potentials in the transfer channels defined by the respective branches of the T-shaped second branch structure, so as to control the signal charge transferred to the first lower charge-accumulation region 24vb, the second lower charge-accumulation region 24vd and the third lower charge-accumulation region 24vc.

The actual structure of the insulating film 31 may be a double-layered structure having a stepped shape obtained such that an interlayer insulating film is selectively deposited on a thin insulating film serving as a gate insulating film to surround the first lower transfer gate electrode 42v, the second lower transfer gate electrode 44v and the third lower transfer gate electrode 43v. Alternatively, the insulating film 31 having a stepped shape may be obtained such that an interlayer insulating film or a field insulating film having a thickness different from that of a gate insulating film is selectively deposited on a region other than the gate insulating film to surround the first lower transfer gate electrode 42v, the second lower transfer gate electrode 44v and the third lower transfer gate electrode 43v.

Although the second guide region 26v cannot be viewed from above because of the upper elements such as the insulating film 31 and the second pinning layer, the second guide region 26v has a planar pattern in which the end portion of the second guide region 26v toward the second photodiode is exposed to the aperture of the shielding plate 51, and other portions are shielded by the shielding plate 51, in the plan view of the shielding plate 51 as viewed from above.

The range sensor according to the third embodiment is provided with additional branches extending on both sides of the trunk path in the direction perpendicular to the longitudinal direction of the trunk path which is a trunk portion of the second branch structure of the second surface-buried region 25v. The respective tips of the additional branches extending in the lateral direction are connected with a first lower extraction region 24va and a second lower extraction region 24ve of n-type conductivity having a higher impurity concentration than the second surface-buried region 25v. As shown in FIG. 16, the range sensor according to the third embodiment further includes a first lower extraction control mechanism (31, 41va) provided adjacent to the first lower extraction region 24va and configured to control extraction of charges toward the first lower extraction region 24va via one of the additional branches extending in the left direction of the second surface-buried region 25v, and a second lower extraction control mechanism (31, 41vb) provided adjacent to the second lower extraction region 24ve and configured to control extraction of charges toward the second lower extraction region 24ve via the other branch extending in the right direction of the second surface-buried region 25v.

As in the case of the structure shown in the cross-sectional view of FIG. 2A, the first lower extraction control mechanism (31, 41va) and the second lower extraction control mechanism (31, 41vb) include the insulating film 31 provided on the respective additional branches of the second surface-buried region 25v, and further include a first lower extraction gate electrode 41va and a second lower extraction gate electrode 41vb, respectively, provided on the insulating film 31. As in the case of the structure shown in the cross-sectional view of FIG. 2A, the thickness of the insulating film 31 immediately below the respective first lower extraction gate electrode 41 and second lower extraction gate electrode 41vb is thinner than the other sites, and the thinner parts of the insulating film 31 each serve as a "gate insulating film".

When a solid-state imaging device (image sensor) having a large pixel area and using a single photodiode, as in the case of the range sensors according to the first and second embodiments, cannot ensure a sufficiently rapid response, a plurality of photodiodes may be provided in one pixel, as shown in FIG. 16, so as to accumulate output from the plural photodiodes to amplify a signal. The range sensor according to the third embodiment corresponds to a case in which two range sensors each corresponding to the first and second embodiments are provided in one pixel.

As shown in FIG. 16, the range sensor according to the third embodiment is provided with the first upper extraction gate electrode 41ua and the second upper extraction gate electrode 41ub symmetrically arranged to interpose the trunk path in front of (below) the branch portions of the T shape between the first photodiode provided on the lower side of the range sensor and the first charge-modulation portion extending upward from the first photodiode on the right side. Accordingly, the first upper extraction gate electrode 41ua and the second upper extraction gate electrode 41ub can switch the operation between the extraction of photoelectrons toward the first upper extraction region 24ua and the second upper extraction region 24ue and the transport of the photoelectrons toward the first charge-modulation portion including the first upper transfer-control mechanism (31, 42u), the second upper transfer-control mechanism (31, 44u) and the third upper transfer-control mechanism (31, 43u).

Similarly, the range sensor according to the third embodiment is provided with the first lower extraction gate electrode 41va and the second lower extraction gate electrode 41vb symmetrically arranged to interpose the trunk path in front of (above) the branch portions of the T shape between the second photodiode provided on the upper side of the range sensor and the second charge-modulation portion extending downward from the second photodiode on the left side. Accordingly, the range sensor according to the third embodiment uses the first lower extraction gate electrode 41va and the second lower extraction gate electrode 41vb so as to switch the operation between the extraction of photoelectrons toward the first lower extraction region 24va and the second lower extraction region 24ve and the transport of the photoelectrons toward the second charge-modulation portion including the first lower transfer-control mechanism (31, 42v), the second lower transfer-control mechanism (31, 44v) and the third lower transfer-control mechanism (31, 43v).

Figure 17:
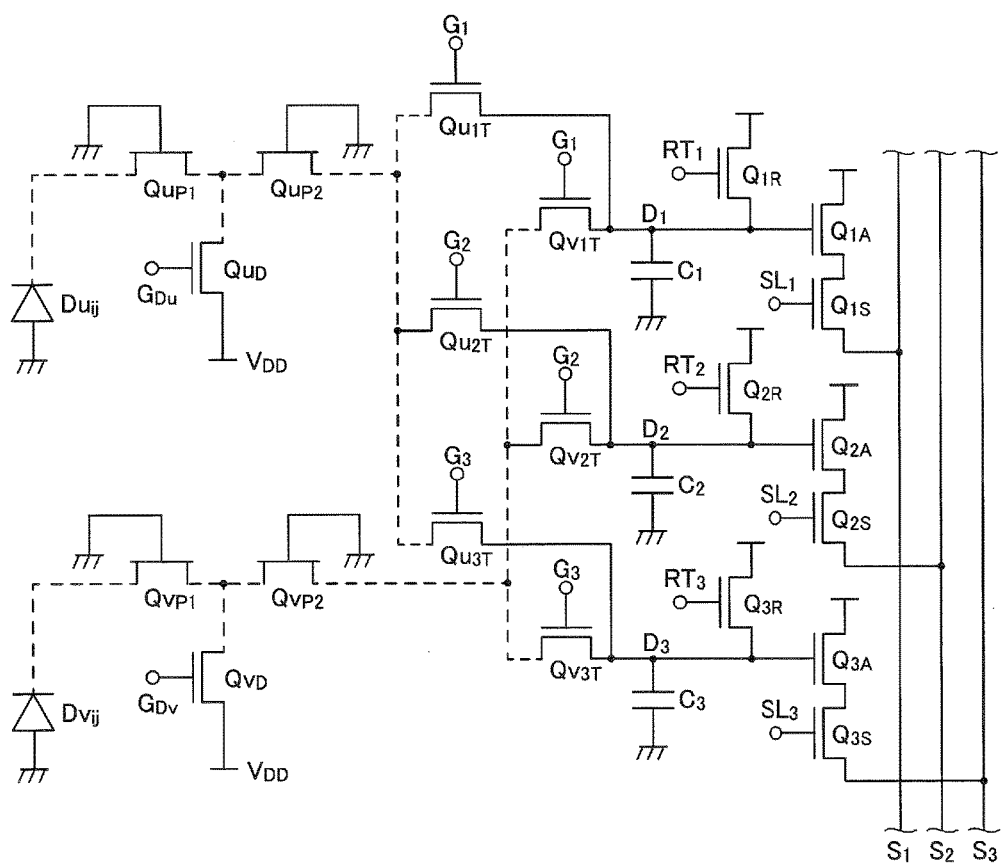
FIG. 17 is a circuit diagram of the principal part of the range sensor according to the third embodiment illustrated with an equivalent circuit.

FIG. 17 illustrates an equivalent circuit of the range sensor according to the third embodiment including two photodiodes in one pixel: a first photodiode $Du_{ij}$ and a second photodiode $Dv_{ij}$. The "first charge-modulation portion" is implemented by a first upper transfer transistor $Qu_{1T}$ as the first upper transfer-control mechanism (31, 42u), a second upper transfer transistor $Qu_{2T}$ as the second upper transfer-control mechanism (31, 44u), and a third upper transfer transistor $Qu_{3T}$ as the third upper transfer-control mechanism (31, 43u), as indicated in the middle in FIG. 17. The "second charge-modulation portion" provided on the right side of the first charge-modulation portion is implemented by a first lower transfer transistor $Qv_{1T}$ as the first lower transfer-control mechanism (31, 42v), a second lower transfer transistor $Qv_{2T}$ as the second lower transfer-control mechanism (31, 44v), and a third lower transfer transistor $Qv_{3T}$ as the third lower transfer-control mechanism (31, 43v).

The static induction channel from the first photodiode $Du_{ij}$ indicated on the upper left side to the first charge-modulation portion is shown as a circuit indicated by the broken line in FIG. 17. The static induction channel is indicated on the upper left side by two first junction field-effect transistors $Qu_{P1}$ and $Qu_{P2}$ of which own gates are grounded. A source terminal of a first charge-extraction MOS transistor $Qu_D$ for charge extraction is connected to a center tap of the two first junction field-effect transistors $Qu_{P1}$ and $Qu_{P1}$ connected in series, and a drain terminal of the first charge-extraction MOS transistor $Qu_D$ is connected to a power source $V_{DD}$ having a high potential.

The broken lines in FIG. 17 on the upper left side indicate paths in which electrons flow rapidly due to a depletion electric field because of the connection in the semiconductor region in FIG. 17, photoelectrons generated in the first photodiode $Du_{ij}$ immediately reach the first charge-modulation portion when the voltage $G_{Du}$ applied to each of the first upper extraction gate electrode 41ua and the second upper extraction gate electrode 41ub implementing the first charge-extraction MOS transistor $Qu_D$ is set at a low potential (L). Since the first charge-modulation portion includes the first upper transfer transistor $QU_{1T}$, the second upper transfer transistor $Qu_{2T}$ and the third upper transfer transistor $Qu_{3T}$, the equivalent circuit is illustrated with the case in which one end of each of the first upper transfer transistor $Qu_{1T}$, the second upper transfer transistor $Qu_{2T}$ and the third upper transfer transistor $Qu_{3T}$ is connected to the first junction field-effect transistor $Qu_{P2}$ in the T-shaped manner.

In the circuit diagram, the other ends of the first upper transfer transistor $Qu_{1T}$, the second upper transfer transistor $Qu_{2T}$ and the third upper transfer transistor $Qu_{3T}$ are connected to the first upper charge-accumulation region 24ub serving as node $D_1$, the second upper charge-accumulation region 24ud serving as node $D_2$ and the third upper charge-accumulation region 24uc serving as node $D_3$, respectively. When the voltage at the intermediate potential (M) is applied to one of the first upper transfer gate electrode 42u, the second upper transfer gate electrode 44u and the third upper transfer gate electrode 43u, and the voltage at the low potential (L) is applied to the other two electrodes, the photoelectrons are transferred to one of the first upper charge-accumulation region 24ub, the second upper charge-accumulation region 24ud and the third upper charge-accumulation region 24uc.

The static induction channel from the second photodiode $Dv_{ij}$ indicated on the lower left side to the lower side of the second charge-modulation portion indicated in the middle is indicated by two second junction field-effect transistors $Qv_{P1}$ and $Qv_{P2}$ of which own gates are grounded. FIG. 17 indicates on the lower left side a circuit diagram in which a source terminal of a second charge-extraction MOS transistor $Qv_D$ for charge extraction is connected to a center tap of the two second junction field-effect transistors $Qv_{P1}$ and $Qv_{P2}$ is connected in series, and a drain terminal of the second charge-extraction MOS transistor $Qv_D$ is connected to a power source $V_{DD}$ having a high potential.

The broken lines in FIG. 17 on the lower left side indicate paths in which electrons flow rapidly due to a depletion electric field because of the connection in the semiconductor region in FIG. 17, photoelectrons generated in the second photodiode $Dv_{ij}$ immediately reach the second charge-modulation portion when the voltage $G_{Dv}$ applied to each of the first lower extraction gate electrode 41va and the second lower extraction gate electrode 41vb implementing the second charge-extraction MOS transistor $Qv_D$ is set at a low potential (L). Since the second charge-modulation portion includes the first lower transfer transistor $Qv_{1T}$, the second lower transfer transistor $Qv_{2T}$ and the third lower transfer transistor $Qv_{3T}$, the equivalent circuit is illustrated with the case in which one end of each of the first lower transfer transistor $Qv_{1T}$, the second lower transfer transistor $Qv_{2T}$ and the third lower transfer transistor $Qv_{3T}$ is connected to the second junction field-effect transistor $Qv_{P2}$ in the T-shaped manner.

The other ends of the first lower transfer transistor $Qv_{1T}$, the second lower transfer transistor $Qv_{2T}$ and the third lower transfer transistor $Qv_{3T}$ are connected to the first lower charge-accumulation region 24vb, the second lower charge-accumulation region 24vd and the third lower charge-accumulation region 24vc, respectively.

The first lower charge-accumulation region 24vb is short-circuited with the first upper charge-accumulation region 24ub via a surface line such as a metal wire, the second lower charge-accumulation region 24vd is short-circuited with the second upper charge-accumulation region 24ud via a surface line, and the third lower charge-accumulation region 24vc is short-circuited with the third upper charge-accumulation region 24uc via a surface line, although not shown in FIG. 16. When the voltage at the intermediate potential (M) is applied to one of the first lower transfer gate electrode 42v, the second lower transfer gate electrode 44v and the third lower transfer gate electrode 43v, and the voltage at the low potential (L) is applied to the other two electrodes, the photoelectrons are transferred to one of the first lower charge-accumulation region 24vb serving as common node $D_1$, the second lower charge-accumulation region 24vd serving as common node $D_2$ and the third lower charge-accumulation region 24vc serving as common node $D_3$.

The three common nodes $D_1$, $D_3$ and $D_2$ shown in FIG. 17 are connected to capacitors $C_1$, $C_3$ and $C_2$ for charge-accumulation. The capacitors $C_1$, $C_3$ and $C_2$ are preferably depletion-mode MOS capacitors in which a threshold voltage is set at a negative voltage so as to reduce voltage dependence. The first common node $D_1$ is connected to a gate terminal of a first amplification transistor $Q_{1A}$ implementing a source follower circuit for reading out a potential change in association with a change in the charge amount of the first common node $D_1$. The first common node $D_1$ is further connected to a first reset transistor $Q_{1R}$, for initializing signal charges after signal readout. A source terminal of the first amplification transistor $Q_{1A}$ is connected to a first selection transistor $Q_{1S}$, serving as a switch for readout image selection. An output of first selection transistor $Q_{1S}$ is connected to a signal readout line extending in the vertical direction.

The second common node $D_2$ is connected to a gate terminal of a second amplification transistor $Q_{2A}$ implementing a source follower circuit for reading out a potential change in association with a change in the charge amount of the second common node $D_2$. The second common node $D_2$ is further connected to a second reset transistor $Q_{2R}$ for initializing signal charges after signal readout. A source terminal of the second amplification transistor $Q_{2A}$ is connected to a second selection transistor $Q_{2S}$, serving as a switch for readout image selection. An output of the second selection transistor $Q_{2S}$ is connected to a signal readout line extending in the vertical direction. The third common node $D_3$ is connected to a gate terminal of a third amplification transistor $Q_{3A}$ implementing a source follower circuit for reading out a potential change in association with a change in the charge amount of the third common node $D_3$. The third common node $D_3$ is further connected to a third reset transistor $Q_{3R}$ for initializing signal charges after signal readout. A source terminal of the third amplification transistor $Q_{3A}$ is connected to a third selection transistor $Q_{3S}$, serving as a switch for readout image selection. An output of the third selection transistor $Q_{3S}$ is connected to a signal readout line extending in the vertical direction.

The signal readout method in the range sensor according to the third embodiment may be either a method of reading out a signal from each of three signal readout lines arranged in parallel as shown in FIG. 17, or a method of turning on a switch sequentially by selection signals SL1, SL2 and SL3 to read out each signal as a time-series signal from a single signal readout line as shown in FIG. 11.

In the range sensor and the solid-state imaging device according to the third embodiment, the first lower charge-accumulation region 24vb is short-circuited with the first upper charge-accumulation region 24ub, the second lower charge-accumulation region 24vd is short-circuited with the second upper charge-accumulation region 24ud, and the third lower charge-accumulation region 24vc is short-circuited with the third upper charge-accumulation region 24uc, so as to receive light in both the first photodiode $Du_{ij}$ and the second photodiode $Dv_{ij}$, and accumulate signals as charges after subjected to charge modulation in both the first and second charge-modulation portions to amplify the signals.

As in the case of the range sensor according to the first and second embodiments, the range sensor according to the third embodiment is provided with the static induction channel having a sufficient length from the trunk path adjacent to the light-receiving area to the respective first and second charge-modulation portions, which are shielded by the shielding plate 51, so as to achieve remarkable effects upon reducing the influence of background light while using a pulse at short intervals.

The range sensor according to the third embodiment has the function suitable for the time-of-flight measurement by use of the Eq. (4) or the Eq. (8) as described in the first embodiment. The range sensor according to the third embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

(Fourth Embodiment)

Figure 18:
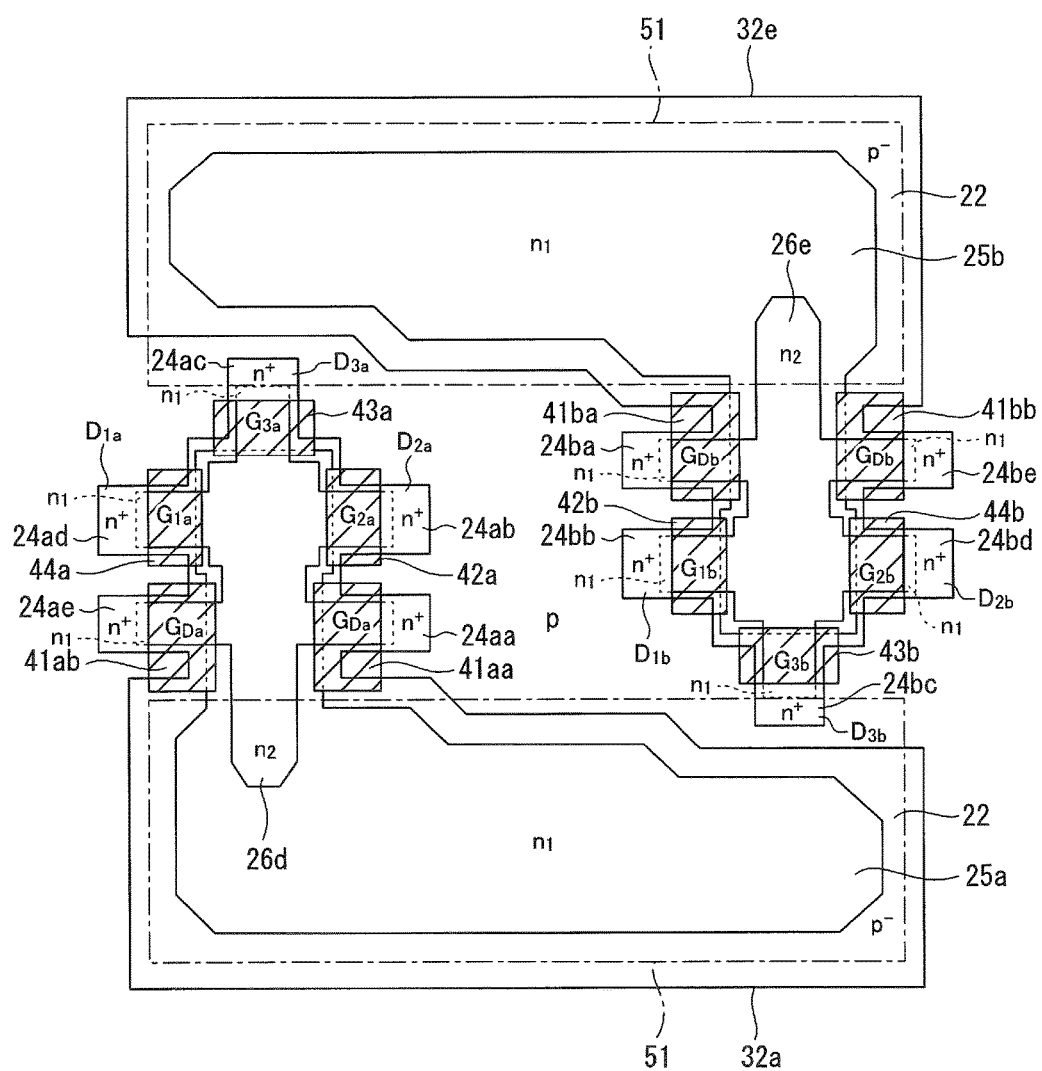
FIG. 18 is a schematic plan view from above of a principal part of a range sensor according to a fourth embodiment of the present invention.

A range sensor according to the fourth embodiment of the present invention is a lock-in pixel including a shielding plate 51 having two apertures indicated by the dashed-dotted lines to define a plurality of light-receiving areas in one pixel as shown in the schematic plan view from above of the principal part in FIG. 18. Reference numerals 32a and 32e shown in FIG. 18 each denote an edge of a field insulating film. Namely, the edges 32a and 32e define active areas of the lock-in pixel. The range sensor according to the fourth embodiment thus includes two active areas in one pixel. A p-type well region 23 is buried below the respective field insulating films (not shown), as in the case shown in the cross sections of FIG. 2A, FIG. 3A and FIG. 4A.

When focused on the first aperture indicated by the dashed-dotted line provided on the lower side in FIG. 18, the range sensor according to the fourth embodiment has a structure on one side of the lock-in pixel similar to that shown in the cross sections of FIG. 2 to FIG. 4, including: a pixel layer 22 made of a semiconductor of a first conductivity type (p-type); a first surface-buried region 25a of a second conductivity type (n-type) selectively buried in the upper portion of the pixel layer 22 to implement a first photodiode in a first light-receiving area defined by a first aperture by forming a junction with the pixel layer 22, and having a first branch structure extending from the light-receiving area toward plural portions shielded by the shielding plate 51 along the upper portion of the pixel layer 22 so as to delineate a plurality of branches, implementing a T-shaped configuration on the end side; a first left charge-accumulation region 24ab, a second left charge-accumulation region 24ad and a third left charge-accumulation region 24ac of n-type conductivity, which is connected to the tips of the T-shaped first branch structure and having a higher impurity concentration than the first surface-buried region 25a ; a first left transfer-control mechanism (31, 42a), a second left transfer-control mechanism (31, 44a) and a third left transfer-control mechanism (31, 43a) provided at the branches of the T-shaped first branch structure adjacent to the first left charge-accumulation region 24ab, the second left charge-accumulation region 24ad and the third left charge-accumulation region 24a c, respectively, to control a transfer of signal charges to the first left charge-accumulation region 24ab, the second left charge-accumulation region 24ad and the third left charge-accumulation region 24ac; and a first guide region 26d of n-type conductivity; which is buried in a part of the upper portion of the first surface-buried region 25a with one end provided below a part of the first aperture and other protruding-edges extending to at least a part of the respective transfer-control mechanisms, and having a higher impurity concentration than the first surface-buried region 25a and a lower impurity concentration than the first left charge-accumulation region 24ab, the second left charge-accumulation region 24ad and the third left charge-accumulation region 24ac.

Although not shown in the drawings, the first left charge-accumulation region 24ab, the second left charge-accumulation region 24ad and the third left charge-accumulation region 24ac have the same cross sections as shown in FIG.

2A, FIG. 3A and FIG. 4A and are surrounded by the well region 23 to serve as floating diffusion layers provided above the pixel layer 22. Although the range sensor according to the fourth embodiment has a structure for illustration purposes in which the number of the floating diffusion layers in which signal charges from the first light-receiving area are accumulated is three, the number of the floating diffusion layers may be two or more than three.

The range sensor according to the fourth embodiment includes a first p-type pinning layer, which is in contact with the surface of the first surface-buried region 25a (not shown), as in the case shown in the cross-sectional views of FIG. 2 to FIG. 4. The pixel layer 22 is laminated on a p-type semiconductor substrate.

In the range sensor according to the fourth embodiment, the first surface-buried region 25a of n-type conductivity, which implements the first photodiode has a gun shape in a planar pattern to collect photoelectrons as signal charges generated in the first light-receiving area shown in FIG. 18 to a grip portion of the gun shape so as to rapidly transfer the photoelectrons to a first charge-modulation portion including the first left transfer-control mechanism (31, 42a), the second left transfer-control mechanism (31, 44a) and the third left transfer-control mechanism (31, 43a).

The first guide region 26d in the range sensor according to the fourth embodiment is a semiconductor region for guiding the photoelectrons collected to the grip portion of the gun shape to the respective narrow transfer channels in the first charge-modulation portion, and has a higher impurity concentration than the first surface-buried region 25a. As in the case of the structure shown in FIG. 3A and FIG. 4A, the first left transfer-control mechanism (31, 42a), the second left transfer-control mechanism (31, 44a) and the third left transfer-control mechanism (31, 43a) implementing the range sensor according to the fourth embodiment include an insulating film 31 provided on the respective branches of the T-shaped first branch structure, and further include a first left transfer gate electrode 42a, a second left transfer gate electrode 44a and a third left transfer gate electrode 43a, respectively, provided on the insulating film 31.

As in the case of the structure shown in FIG. 3A and FIG. 4A, the thickness of the insulating film 31 immediately below the respective first left transfer gate electrode 42a, second left transfer gate electrode 44a and third left transfer gate electrode 43a is thinner than the other sites, and the thinner parts of the insulating film 31 each serve as a "gate insulating film". The voltage applied to each of the first left transfer gate electrode 42a, the second left transfer gate electrode 44a and the third left transfer gate electrode 43a controls potentials in the transfer channels defined by the respective branches of the T-shaped first branch structure, so as to control the signal charge transferred to the first left charge-accumulation region 24ab, the second left charge-accumulation region 24ad and the third left charge-accumulation region 24ac.

The actual structure of the insulating film 31 may be a double-layered structure having a stepped shape obtained such that an interlayer insulating film is selectively deposited on a thin insulating film serving as a gate insulating film to surround the first left transfer gate electrode 42a, the second left transfer gate electrode 44a and the third left transfer gate electrode 43a. Alternatively, the insulating film 31 having a stepped shape may be obtained such that an interlayer insulating film or a field insulating film having a thickness different from that of a gate insulating film is selectively deposited on a region other than the gate insulating film to surround the first left transfer gate electrode 42a, the second left transfer gate electrode 44a and the third left transfer gate electrode 43a. The material used for the interlayer insulating film or the field insulating film may be the same as that used for the gate insulating film or may be a different dielectric. For example, the interlayer insulating film may be a dielectric of which relative dielectric constant is smaller than the gate insulating film.

Although the first guide region 26d cannot be viewed from above because of the upper elements such as the insulating film 31 and the first pinning layer, the first guide region 26d has a planar pattern in which the end portion of the first guide region 26d toward the first photodiode is exposed to the aperture of the shielding plate 51, and other portions are shielded by the shielding plate 51, in the plan view of the shielding plate 51 as viewed from above.

The range sensor according to the fourth embodiment is provided with additional branches extending on both sides of the trunk path in the direction perpendicular to the longitudinal direction of the trunk path which is a trunk portion of the first branch structure of the first surface-buried region 25a. The respective tips of the additional branches extending in the lateral direction are connected with a first left extraction region 24aa and a second left extraction region 24ae of n-type conductivity having a higher impurity concentration than the first surface-buried region 25a.

As shown in FIG. 18, the range sensor according to the fourth embodiment further includes a first left extraction control mechanism (31, 41aa) provided adjacent to the first left extraction region 24aa and configured to control extraction of charges toward the first left extraction region 24aa via one of the additional branches extending in the right direction of the first surface-buried region 25a, and a second left extraction control mechanism (31, 41ab) provided adjacent to the second left extraction region 24ae and configured to control extraction of charges toward the second left extraction region 24ae via the other branch extending in the left direction of the first surface-buried region 25a.

As in the case of the structure shown in FIG. 2A, the first left extraction control mechanism (31, 41aa) and the second left extraction control mechanism (31, 41ab) include an insulating film 31 provided on the respective additional branches of the first surface-buried region 25a, and further include a first left extraction gate electrode 41aa and a second left extraction gate electrode 41ab, respectively, provided on the insulating film 31. As in the case of the structure shown in FIG. 2A, the thickness of the insulating film 31 immediately below the respective first left extraction gate electrode 41aa and second left extraction gate electrode 41ab is thinner than the other sites, and the thinner parts of the insulating film 31 each serve as a "gate insulating film".

When focused on the second aperture indicated by the dashed-dotted line provided on the upper side in FIG. 18, the range sensor according to the fourth embodiment has a structure on the other side of the lock-in pixel including: a second surface-buried region 25b of a second conductivity type (n-type) selectively buried in the upper portion of the pixel layer 22 to implement a second photodiode in a second light-receiving area by forming a junction with the pixel layer 22, and having a second branch structure extending from the light-receiving area toward plural portions shielded by the shielding plate 51 along the upper portion of the pixel layer 22 so as to delineate a plurality of branches, implementing a T-shaped configuration on the end side; a first right charge-accumulation region 24bb, a second right charge-accumulation region 24bd and a third right charge-accumulation region 24bc of n-type conductivity, which is connected to the tips of the T-shaped second branch structure and having a higher impurity concentration than the second surface-buried region 25b; a first right transfer-control mechanism (31, 42b), a second right transfer-control mechanisms (31, 42b) and a third right transfer-control mechanism (31, 43b) provided at the branches of the T-shaped second branch structure adjacent to the first right charge-accumulation region 24bb, the second right charge-accumulation region 24bd and the third right charge-accumulation region 24bc, respectively, to control a transfer of signal charges to the first right charge-accumulation region 24bb, the second right charge-accumulation region 24bd and the third right charge-accumulation region 24bc; and a second guide region 26e of n-type conductivity; which is buried in a part of the upper portion of the second surface-buried region 25b with one end provided below a part of the second aperture and other protruding-edges extending to at least a part of the respective transfer-control mechanisms, and having a higher impurity concentration than the second surface-buried region 25b and a lower impurity concentration than the first right charge-accumulation region 24bb, the second right charge-accumulation region 24bd and the third right charge-accumulation region 24bc.

Although not shown in the drawings, the first right charge-accumulation region 24bb, the second right charge-accumulation region 24bd and the third right charge-accumulation region 24bc have the same cross sections as shown in FIG. 2A, FIG. 3A and FIG. 4A and are surrounded by the well region 23 to serve as floating diffusion layers provided above the pixel layer 22. Although the range sensor according to the fourth embodiment has a structure for illustration purposes in which the number of the floating diffusion layers in which signal charges from the second light-receiving area are accumulated is three, the number of the floating diffusion layers may be two or more than three.

The range sensor according to the third embodiment includes a second p-type pinning layer, which is in contact with the surface of the second surface-buried region 25b (not shown), as in the case shown in the cross-sectional views of FIG. 2 to FIG. 4. In the range sensor according to the fourth embodiment, the second surface-buried region 25b of n-type conductivity; which implements the second photodiode has a gun shape in a planar pattern to collect photoelectrons generated in the light-receiving area shown in FIG. 18 to the grip portion of the gun shape so as to rapidly transfer the photoelectrons to a second charge-modulation portion including the first right transfer-control mechanism (31, 42b), the second right transfer-control mechanisms (31, 42b) and the third right transfer-control mechanism (31, 43b).

The second guide region 26e in the range sensor according to the fourth embodiment is a semiconductor region for guiding the photoelectrons collected to the grip portion of the gun shape to the respective narrow transfer channels in the second charge-modulation portion, and has a higher impurity concentration than the second surface-buried region 25b. As in the case of the structure shown in FIG. 3A and FIG. 4A, the first right transfer-control mechanism (31, 42b), the second right transfer-control mechanisms (31, 42b) and the third right transfer-control mechanism (31, 43b) implementing the range sensor according to the fourth embodiment include the insulating film 31 provided on the respective branches of the T-shaped second branch structure, and further include a first right transfer gate electrode 42b, a second right transfer gate electrode 44b and a third right transfer gate electrode 43b, respectively; provided on the insulating film 31.

As in the case of the structure shown in FIG. 3A and FIG. 4A, the thickness of the insulating film 31 immediately below the respective first right transfer gate electrode 42b, second right transfer gate electrode 44b and third right transfer gate electrode 43b is thinner than the other sites, and the thinner parts of the insulating film 31 each serve as a "gate insulating film". The voltage applied to each of the first right transfer gate electrode 42b, the second right transfer gate electrode 44b and the third right transfer gate electrode 43b controls potentials in the transfer channels defined by the respective branches of the T-shaped second branch structure, so as to control the signal charge transferred to the first right charge-accumulation region 24bb, the second right charge-accumulation region 24bd and the third right charge-accumulation region 24bc.

The actual structure of the insulating film 31 may be a double-layered structure having a stepped shape obtained such that an interlayer insulating film is selectively deposited on a thin insulating film serving as a gate insulating film to surround the first right transfer gate electrode 42b, the second right transfer gate electrode 44b and the third right transfer gate electrode 43b. Alternatively, the insulating film 31 having a stepped shape may be obtained such that an interlayer insulating film or a field insulating film having a thickness different from that of a gate insulating film is selectively deposited on a region other than the gate insulating film to surround the first right transfer gate electrode 42b, the second right transfer gate electrode 44b and the third right transfer gate electrode 43b.

Although the second guide region 26e cannot be viewed from above because of the upper elements such as the insulating film 31 and the second pinning layer, the second guide region 26e has a planar pattern in which the end portion of the second guide region 26e toward the second photodiode is exposed to the aperture of the shielding plate 51, and other portions are shielded by the shielding plate 51, in the plan view of the shielding plate 51 as viewed from above.

The range sensor according to the fourth embodiment is provided with additional branches extending on both sides of the trunk path in the direction perpendicular to the longitudinal direction of the trunk path which is a trunk portion of the second branch structure of the second surface-buried region 25b. The respective tips of the additional branches extending in the lateral direction are connected with a first right extraction region 24ba and a second right extraction region 24be of n-type conductivity having a higher impurity concentration than the second surface-buried region 25b. As shown in FIG. 18, the range sensor according to the fourth embodiment further includes a first right extraction control mechanism (31, 41ba) provided adjacent to the first right extraction region 24ba and configured to control extraction of charges toward the first right extraction region 24ba via one of the additional branches extending in the left direction of the second surface-buried region 25b, and a second right extraction control mechanism (31, 41bb) provided adjacent to the second right extraction region 24be and configured to control extraction of charges toward the second right extraction region 24be via the other branch extending in the right direction of the second surface-buried region 25b.

As in the case of the structure shown in the cross-sectional view of FIG. 2A, the first right extraction control mechanism (31, 41ba) and the second right extraction control mechanism (31, 41bb) include the insulating film 31 provided on the respective additional branches of the second surface-buried region 25b, and further include a first right extraction gate electrode 41*ba* and a second right extraction gate electrode 41*bb*, respectively, provided on the insulating film 31. As in the case of the structure shown in the cross-sectional view of FIG. 2A, the thickness of the insulating film 31 immediately below the respective first right extraction gate electrode 41*ba* and second right extraction gate electrode 41*bb* is thinner than the other sites, and the thinner parts of the insulating film 31 each serve as a "gate insulating film".

When a solid-state imaging device (image sensor) having a large pixel area and using a single photodiode, as in the case of the range sensors according to the first and second embodiments, cannot ensure a sufficiently rapid response, a plurality of photodiodes may be provided in one pixel, as shown in FIG. 18, so as to accumulate output from the plural photodiodes to amplify a signal. The range sensor according to the fourth embodiment corresponds to a case in which two range sensors each corresponding to the first and second embodiments are provided in one pixel.

As shown in FIG. 18, the range sensor according to the fourth embodiment is provided with the first left extraction gate electrode 41*aa* and the second left extraction gate electrode 41*ab* symmetrically arranged to interpose the trunk path in front of (below) the branch portions of the T shape between the first photodiode provided on the lower side of the range sensor and the first charge-modulation portion extending upward from the first photodiode on the left side. Accordingly; the first left extraction gate electrode 41*aa* and the second left extraction gate electrode 41*ab* can switch the operation between the extraction of photoelectrons toward the first left extraction region 24*aa* and the second left extraction region 24*ae* and the transport of the photoelectrons toward the first charge-modulation portion including the first left transfer-control mechanism (31, 42*a*), the second left transfer-control mechanism (31, 44*a*) and the third left transfer-control mechanism (31, 43*a*).

Similarly, the range sensor according to the fourth embodiment is provided with the first right extraction gate electrode 41*ba* and the second right extraction gate electrode 41*bb* symmetrically arranged to interpose the trunk path in front of (above) the branch portions of the T shape between the second photodiode provided on the upper side of the range sensor and the second charge-modulation portion extending downward from the second photodiode on the right side. Accordingly, the first right extraction gate electrode 41*ba* and the second right extraction gate electrode 41*bb* can switch the operation between the extraction of photoelectrons toward the first right extraction region 24*va* and the second right extraction region 24*ve* and the transport of the photoelectrons toward the second charge-modulation portion including the first right transfer-control mechanism (31, 42*b*), the second right transfer-control mechanisms (31, 42*b*) and the third right transfer-control mechanism (31, 43*b*).

Figure 19:
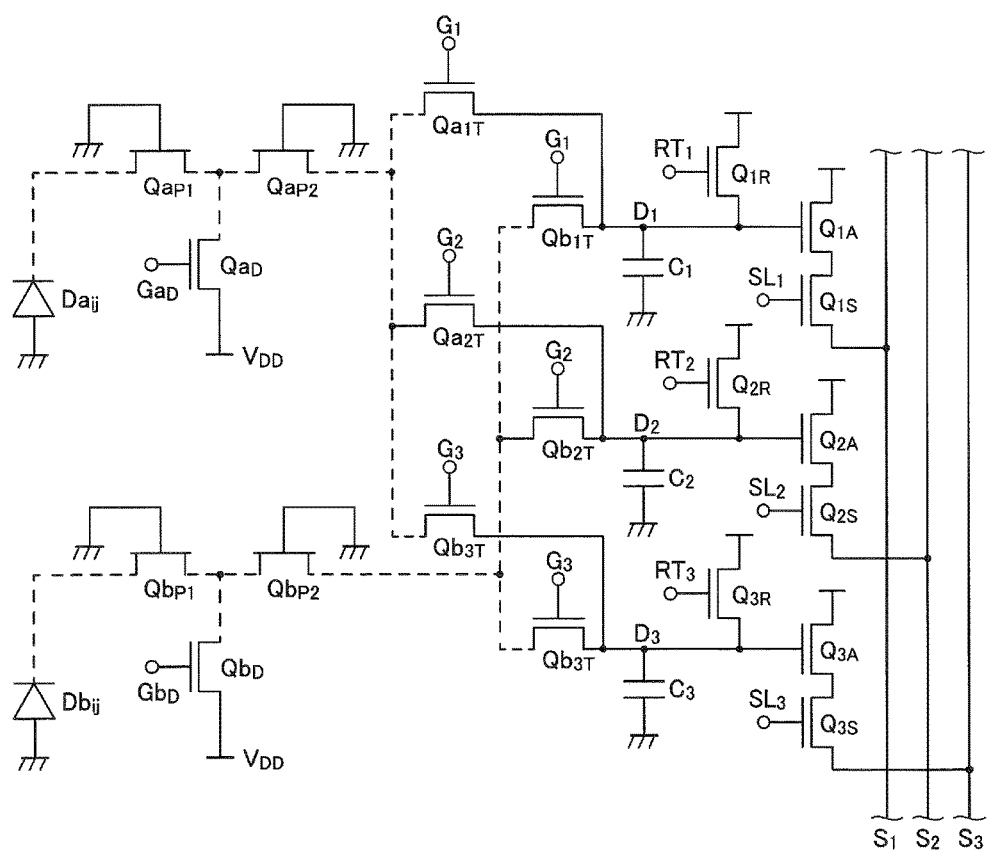
FIG. 19 is a circuit diagram of the principal part of the range sensor according to the fourth embodiment illustrated with an equivalent circuit.

FIG. 19 illustrates an equivalent circuit of the range sensor according to the fourth embodiment including two photodiodes in one pixel: a first photodiode $Da_{ij}$ and a second photodiode $Db_{ij}$. The "first charge-modulation portion" in the range sensor according to the fourth embodiment is implemented by a first left transfer transistor $Qa_{1T}$ as the first left transfer-control mechanism (31, 42*a*), a second left transfer transistor $Qa_{2T}$ as the second left transfer-control mechanism (31, 44*a*), and a third left transfer transistor $Qa_{3T}$ as the third left transfer-control mechanism (31, 43*a*), as indicated in the middle in FIG. 19. The "second charge-modulation portion" provided on the right side of the first charge-modulation portion is implemented by a first right transfer transistor $Qb_{1T}$ as the first right transfer-control mechanism (31, 42*b*), a second right transfer transistor $Qb_{2T}$, as the second right transfer-control mechanism (31, 44*b*), and a third right transfer transistor $Qb_{3T}$ as the third lower transfer-control mechanism (31, 43*b*).

The static induction channel from the first photodiode $Da_{ij}$ indicated on the upper left side to the first charge-modulation portion is shown as a circuit indicated by the broken line in FIG. 19. The static induction channel is indicated on the upper left side by two first junction field-effect transistors $Qa_{P1}$ and $Qa_{P2}$ of which own gates are grounded. A source terminal of a first charge-extraction MOS transistor $Qa_D$ for charge extraction is connected to a center tap of the two first junction field-effect transistors $Qa_{P1}$ and $Qa_{P2}$ connected in series, and a drain terminal of the first charge-extraction MOS transistor $Qa_D$ is connected to a power source $V_{DD}$ having a high potential.

The broken lines in FIG. 19 on the upper left side indicate paths in which electrons flow rapidly due to a depletion electric field because of the connection in the semiconductor region in FIG. 19, photoelectrons generated in the first photodiode $Da_{ij}$ immediately reach the first charge-modulation portion when the voltage $Ga_D$, applied to each of the first left extraction gate electrode 41*aa* and the second left extraction gate electrode 41*ab* implementing the first charge-extraction MOS transistor $Qa_D$ is set at a low potential (L). Since the first charge-modulation portion includes the first left transfer transistor $Qa_{1T}$, the second left transfer transistor $Qa_{2T}$ and the third left transfer transistor $Qa_{3T}$, the equivalent circuit is illustrated with the case in which one end of each of the first left transfer transistor $Qa_{1T}$, the second left transfer transistor $Qa_{2T}$ and the third left transfer transistor $Qa_{3T}$ is connected to the first junction field-effect transistor $Qa_{P2}$ in the T-shaped manner.

In the circuit diagram, the other ends of the first left transfer transistor $Qa_{1T}$, the second left transfer transistor $Qa_{2T}$ and the third left transfer transistor $Qa_{3T}$ are connected to the first left charge-accumulation region 24*ab* serving as node $D_1$, the second left charge-accumulation region 24*ad* serving as node $D_2$ and the third left charge-accumulation region 24*ac* serving as node $D_3$, respectively. When the voltage at the intermediate potential (M) is applied to one of the first left transfer gate electrode 42*a*, the second left transfer gate electrode 44*a* and the third left transfer gate electrode 43*a*, and the voltage at the low potential (L) is applied to the other two electrodes, the photoelectrons are transferred to one of the first left charge-accumulation region 24*ab*, the second left charge-accumulation region 24*ad* and the third left charge-accumulation region 24*ac*.

The static induction channel from the second photodiode $Db_{ij}$ indicated on the lower left side to the lower side of the second charge-modulation portion indicated in the middle is indicated by two second junction field-effect transistors $Qb_{P1}$ and $Qb_{P2}$, of which own gates are grounded in FIG. 19. FIG. 19 indicates on the lower left side a circuit diagram in which a source terminal of a second ch/arge-extraction MOS transistor $Qb_D$ for charge extraction is connected to a center tap of the two second junction field-effect transistors $Qb_{P1}$ and $Qb_{P2}$ connected in series, and a drain terminal of the second charge-extraction MOS transistor $QU_D$ is connected to a power source $V_{DD}$ having a high potential.

The broken lines in FIG. 19 on the lower left side indicate paths in which electrons flow rapidly due to a depletion electric field because of the connection in the semiconductor region in FIG. 19, photoelectrons generated in the second photodiode $Db_{ij}$ immediately reach the second charge-modulation portion when the voltage $Gb_D$ applied to each of the first right extraction gate electrode 41ba and the second right extraction gate electrode 41bb implementing the second charge-extraction MOS transistor $Qb_D$ is set at a low potential (L), Since the second charge-modulation portion includes the first right transfer transistor $QU_{1T}$, the second right transfer transistor $Qb_{2T}$ and the third right transfer transistor $Qb_{3T}$, the equivalent circuit is illustrated with the case in which one end of each of the first right transfer transistor $Qb_{1T}$, the second right transfer transistor $Qb_{2T}$ and the third right transfer transistor $Qb_{3T}$, is connected to the second junction field-effect transistor $Qb_{P2}$ in the T-shaped manner.

The other ends of the first right transfer transistor $Qb_{1T}$, the second right transfer transistor $Qb_{1T}$ and the third right transfer transistor $Qb_{3T}$ are connected to the first right charge-accumulation region 24bb, the second right charge-accumulation region 24bd and the third right charge-accumulation region 24bc, respectively.

The first right charge-accumulation region 24bb is short-circuited with the first left charge-accumulation region 24ab via a surface line such as a metal wire, the second right charge-accumulation region 24bd is short-circuited with the second left charge-accumulation region 24ad via a surface line, and the third right charge-accumulation region 24bc is short-circuited with the third left charge-accumulation region 24ac via a surface line, although not shown in FIG. 18. When the voltage at the intermediate potential (M) is applied to one of the first right transfer gate electrode 42b, the second right transfer gate electrode 44b and the third right transfer gate electrode 43b, and the voltage at the low potential (L) is applied to the other two electrodes, the photoelectrons are transferred to one of the first right charge-accumulation region 24bb serving as common node $D_1$, the second right charge-accumulation region 24bd serving as common node $D_2$ and the third right charge-accumulation region 24bc serving as common node $D_3$.

The three common nodes $D_1$, $D_3$ and $D_2$ shown in FIG. 19 are connected to capacitors $C_1$, $C_3$ and $C_2$ for charge-accumulation. The capacitors $C_1$, $C_3$ and $C_2$ are preferably depletion-mode MOS capacitors in which a threshold voltage is set at a negative voltage so as to reduce voltage dependence. The first common node $D_1$ is connected to a gate terminal of a first amplification transistor $Q_{1A}$ implementing a source follower circuit for reading out a potential change in association with a change in the charge amount of the first common node $D_1$. The first common node $D_1$ is further connected to a first reset transistor $Q_{1R}$ for initializing signal charges after signal readout. A source terminal of the first amplification transistor $Q_{1A}$ is connected to a first selection transistor $Q_{1S}$, serving as a switch for readout image selection. An output of the first selection transistor $Q_{1S}$ is connected to a signal readout line extending in the vertical direction.

The second common node $D_2$ is connected to a gate terminal of a second amplification transistor $Q_{2A}$ implementing a source follower circuit for reading out a potential change in association with a change in the charge amount of the second common node $D_2$. The second common node is further connected to a second reset transistor $Q_{2R}$ for initializing signal charges after signal readout. A source terminal of the second amplification transistor $Q_{2A}$ is connected to a second selection transistor $Q_{2S}$, serving as a switch for readout image selection. An output of the second selection transistor $Q_{2S}$ is connected to a signal readout line extending in the vertical direction. The third common node $D_3$ is connected to a gate terminal of a third amplification transistor $Q_{3A}$ implementing a source follower circuit for reading out a potential change in association with a change in the charge amount of the third common node $D_3$. The third common node $D_3$ is further connected to a third reset transistor $Q_{3R}$ for initializing signal charges after signal readout. A source terminal of the third amplification transistor $Q_{3A}$ is connected to a third selection transistor $Q_{3S}$, serving as a switch for readout image selection. An output of the third selection transistor $Q_{3S}$ is connected to a signal readout line extending in the vertical direction.

The signal readout method in the range sensor according to the fourth embodiment may be either a method of reading out a signal from each of three signal readout lines arranged in parallel as shown in FIG. 19, or a method of turning on a switch sequentially by selection signals SL1, SL2 and SL3 to read out each signal as a time-series signal from a single signal readout line as shown in FIG. 11.

In the range sensor and the solid-state imaging device according to the fourth embodiment, the first right charge-accumulation region 24bb is short-circuited with the first left charge-accumulation region 24ab, the second right charge-accumulation region 24bd is short-circuited with the second left charge-accumulation region 24ad, and the third right charge-accumulation region 24bc is short-circuited with the third left charge-accumulation region 24ac, so as to receive light in both the first photodiode $Da_{ij}$ and the second photodiode $Db_{ij}$, and accumulate signals as charges after subjected to charge modulation in both the first and second charge-modulation portions to amplify the signals.

As in the case of the range sensor according to the first and second embodiments, the range sensor according to the fourth embodiment is provided with the static induction channel having a sufficient length from the trunk path adjacent to the first and second light-receiving areas to the respective first and second charge-modulation portions, which are shielded by the shielding plate 51, so as to achieve remarkable effects upon reducing the influence of background light while using a pulse at short intervals.

The range sensor according to the fourth embodiment has the function suitable for the time-of-flight measurement by use of the Eq. (4) or the Eq. (8) as described in the first embodiment. The range sensor according to the fourth embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

(Fifth Embodiment)

Figure 20:
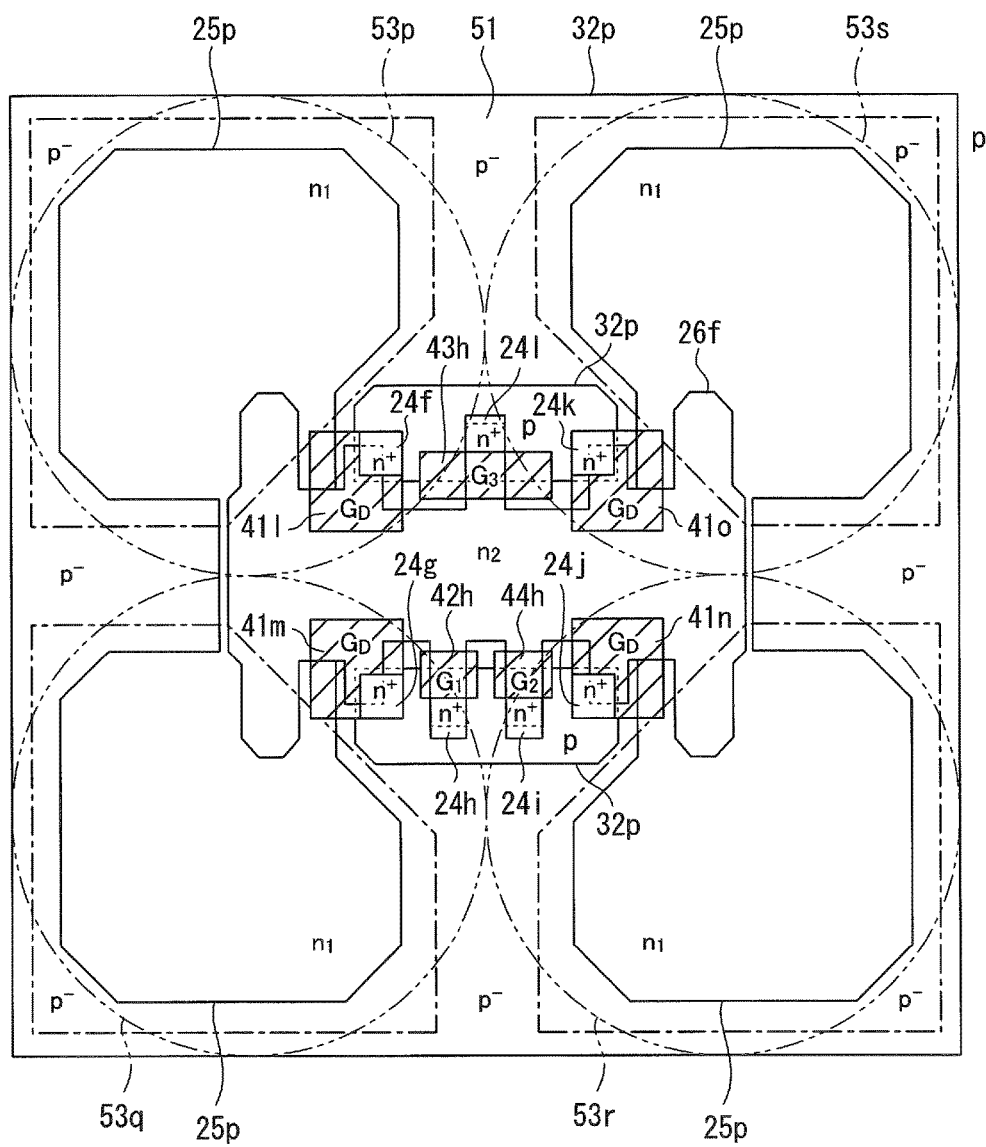
FIG. 20 is a schematic plan view from above of a principal part of a range sensor according to a fifth embodiment of the present invention.

A range sensor according to the fifth embodiment of the present invention is a lock-in pixel including a shielding plate 51 having four apertures: a first aperture indicated by the dashed-dotted line on the upper left side, a second aperture indicated by the dashed-dotted line on the lower left side, a third aperture indicated by the dashed-dotted line on the lower right side, and a fourth aperture indicated by the dashed-dotted line on the upper right side, to define tour light-receiving areas, as shown in the schematic plan view from above of the principal part in FIG. 20.

As indicated by the two-dot dashed lines in FIG. 20, a first microlens 53p is provided over a first light-receiving area defined by the first aperture, a second microlens 53q is provided over a second light-receiving area defined by the second aperture, a third microlens 53r is provided over a third light-receiving area defined by the third aperture, and a fourth microlens 53s is provided over a fourth light-receiving area defined by the fourth aperture. Four photodiodes provided in the four light-receiving areas receive light collected by the independent microlenses 53*p*, 53*q*, 53*r* and 53*s*. The microlenses 53*p*, 53*q*, 53*r* and 53*s* are not necessarily provided and may be omitted when the intensity of incident light (incoming light) is high.

When focused on the first aperture provided on the upper left side and the second aperture provided on the lower left side in FIG. 20, the range sensor according to the fifth embodiment has a structure similar to that shown in the cross sections of FIG. 2 to FIG. 4, including: a pixel layer 22 made of a semiconductor of a first conductivity type (p-type); and a surface-buried region 25*p* of a second conductivity type (n-type) selectively buried in the upper portion of the pixel layer 22 to implement a first photodiode in the first light-receiving area defined by the first aperture by forming a junction with the pixel layer 22 and a second photodiode in the second light-receiving area defined by the second aperture by forming a junction with the pixel layer 22, connecting the upper and second light-receiving areas in the vertical direction, and including a charge-modulation arrangement-region extending from the portion where the first and second light-receiving areas are connected toward the portion shielded by the shielding plate 51 along the upper portion of the pixel layer 22 in the right direction.

The surface-buried region 25*p* in the range sensor according to the fifth embodiment includes first to fourth light-receiving terminal-portions extending into a four-leaf clover shape on both sides of the charge-modulation arrangement-region in which the first light-receiving terminal-portion extending on the upper left side protrudes toward the first light-receiving area, the second light-receiving terminal-portion extending on the lower left side protrudes toward the second light-receiving area, the third light-receiving terminal-portion extending on the lower right side protrudes toward the third light-receiving area, and the fourth light-receiving terminal-portion extending on the upper right side protrudes toward the fourth light-receiving area.

As shown in the enlarged plan view of FIG. 21, the charge-modulation arrangement-region of the surface-buried region 25*p* further extends toward the right on the pixel layer 22 shielded by the shielding plate 51 to implement a third photodiode in the third light-receiving area defined below the third aperture indicated on the lower right side by forming a junction with the pixel layer 22 and a fourth photodiode in the fourth light-receiving area defined below the fourth aperture indicated on the upper right side by forming a junction with the pixel layer 22. Thus, the entire surface-buried region 25*p* has a symmetrical four-leaf clover shape as shown in FIG. 20 and is provided with the charge-modulation arrangement-region in the central portion to implement a continuous semiconductor region.

Figure 21:
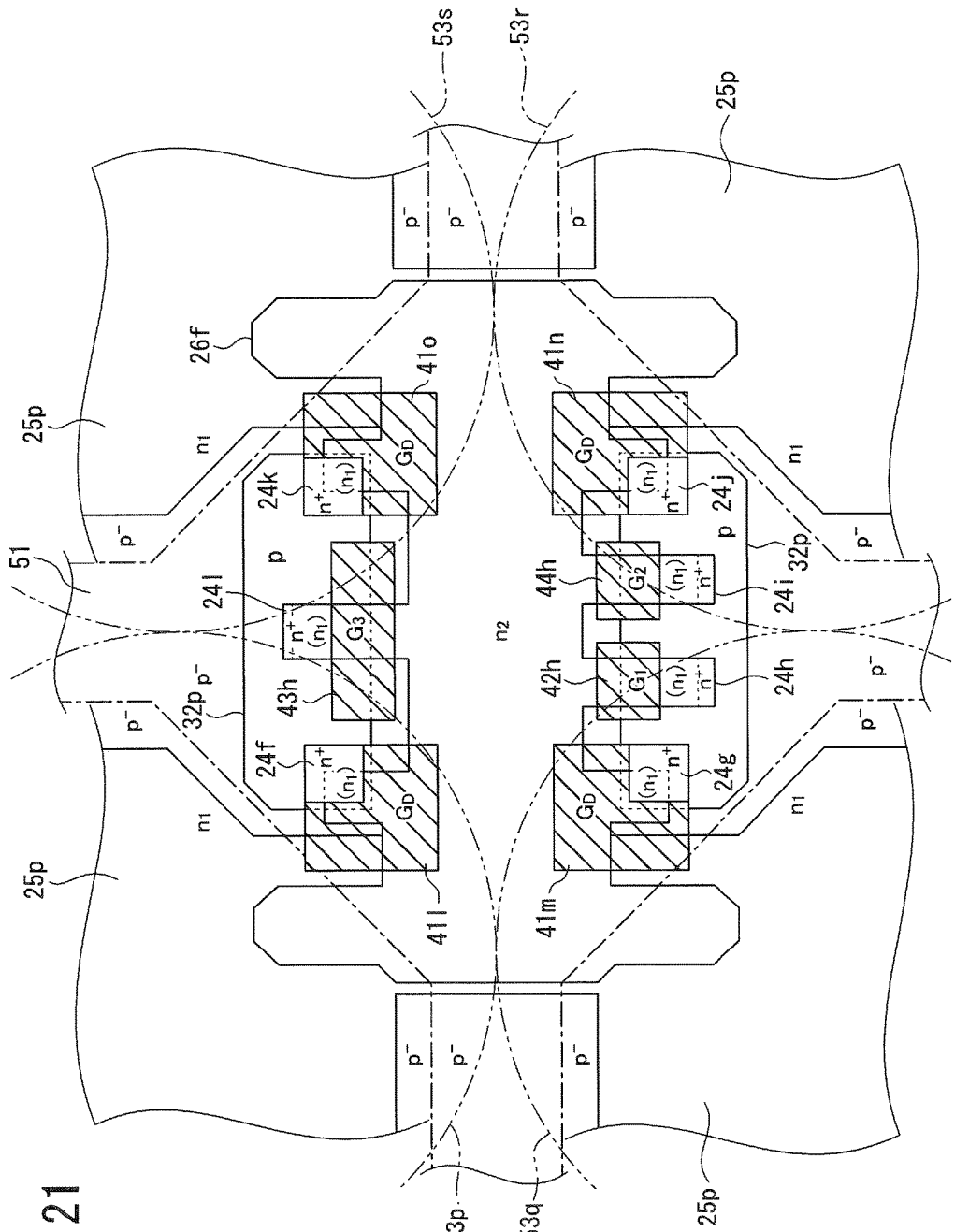
FIG. 21 is an enlarged plan view of the central portion of the range sensor according to the fifth embodiment shown in FIG. 20.

As shown in the enlarged plan view of FIG. 21, the charge-modulation arrangement-region in the central portion of the surface-buried region 25*p* has a polygonal shape including fishbone-shaped branches extending in the vertical direction, instead of a rectangular shape extending straight in the horizontal direction. In other words, the surface-buried region 25*p* including the charge-modulation arrangement-region in the central portion is provided with first and second branches extending downward in parallel on the lower side of the charge-modulation arrangement-region, and a third branch extending upward on the upper side of the charge-modulation arrangement-region on the opposite side of the first and second branches.

As shown in FIG. 20, the first light-receiving terminal-portion on the upper left side has an area sufficient to cover substantially the entire first aperture, the second light-receiving terminal-portion on the lower left side has an area sufficient to cover substantially the entire second aperture, the third light-receiving terminal-portion on the lower right side has an area sufficient to cover substantially the entire third aperture, and the fourth light-receiving terminal-portion on the upper right side has an area sufficient to cover substantially the entire fourth aperture.

In the central portion of the charge-modulation arrangement-region, a first charge-accumulation region 24*h* and a second charge-accumulation region 24*i* of n-type conductivity having a higher impurity concentration than the first surface-buried region 25*p* are connected to the tips of the branches of the first and second branches, respectively, and a third charge-accumulation region 24*l* of n-type conductivity having a higher impurity concentration than the first surface-buried region 25*p* is connected to the tip of the branch of the third branch.

Reference numeral 32*p* shown in FIG. 20 denotes an edge of a thick field insulating film. A well region of p-type conductivity is buried below the field insulating film (not shown), as in the case shown in the cross sections of FIG. 2A, FIG. 3A and FIG. 4A. The first charge-accumulation region 24*h*, the second charge-accumulation region 24*i* and the third charge-accumulation region 24*l* are surrounded by the well region to serve as floating diffusion layers provided above the pixel layer 22. Although the range sensor according to the fifth embodiment has a structure for illustration purposes in which the number of the floating diffusion layers in which signal charges from the four light-receiving areas are accumulated is three, the number of the floating diffusion layers may be two or more than three.

The range sensor according to the fifth embodiment includes a first transfer-control mechanism (31, 42*h*), a second transfer-control mechanism (31, 44*h*) and a third transfer-control mechanism (31, 43*h*) provided adjacent to the first charge-accumulation region 24*h*, the second charge-accumulation region 24*i* and the third charge-accumulation region 24*l*, respectively; to control a transfer of signal charges to the first charge-accumulation region 24*h*, the second charge-accumulation region 24*i* and the third charge-accumulation region 24*l*.

The range sensor according to the fifth embodiment further includes a guide region 26*f* of n-type conductivity, which is buried in a part of the upper portion of the surface-buried region 25*p*, having an H-shape including first and second protruding-edges connecting the ends of the first and second photodiodes in the vertical direction on the left side in FIG. 21 and third and fourth protruding-edges connecting the ends of the third and fourth photodiodes in the vertical direction on the right side in FIG. 21, and having a higher impurity concentration than the first surface-buried region 25*p* and a lower impurity concentration than the first charge-accumulation region 24*h*, the second charge-accumulation region 24*i* and the third charge-accumulation region 24*l*.

Since the range sensor according to the fifth embodiment is a lock-in pixel including the four light-receiving areas, the H-shaped guide region 26*f* includes the four protruding-edges corresponding to the four apertures. The central portion surrounded by the four protruding-edges of the H-shaped guide region 26*f* is not formed into a rectangular shape extending straight in the horizontal direction but is provided with branches extending in the vertical direction as shown in the enlarged plan view of FIG. 21. The entire shape of the guide region 26*f* is thus not an exact H-shape.

The range sensor according to the fifth embodiment includes a first p-type pinning layer, which is in contact with the surface of the surface-buried region 25p (not shown), as in the case shown in the cross-sectional views of FIG. 2 to FIG. 4. The pixel layer 22 is laminated on a p-type semiconductor substrate.

The range sensor according to the fifth embodiment includes a charge-modulation portion implemented by the first transfer-control mechanism (31, 42h), the second transfer-control mechanism (31, 44h) and the third transfer-control mechanism (31, 43h). The guide region 26f having a substantially H-shaped planar structure is a semiconductor region for collecting photoelectrons as signal charges from the four regions and guiding the collected photoelectrons to the narrow transfer channels in the charge-modulation portion provided in the central portion of the H-shape, and has a higher impurity concentration than the first surface-buried region 25p.

As in the case of the structure shown in FIG. 3A and FIG. 4A, the first transfer-control mechanism (31, 42h), the second transfer-control mechanism (31, 44h) and the third transfer-control mechanism (31, 43h) implementing the range sensor according to the fifth embodiment respectively include an insulating film 31 provided on the respective first, second and third branches, and further include a first transfer gate electrode 42h, a second transfer gate electrode 44h and a third transfer gate electrode 43h provided on the insulating film 31.

As in the case of the structure shown in FIG. 3A and FIG. 4A, the thickness of the insulating film 31 immediately below the respective first transfer gate electrode 42h, second transfer gate electrode 44h and third transfer gate electrode 43h is thinner than the other sites, and the thinner parts of the insulating film 31 each serve as a "gate insulating film".

Although the guide region 26f cannot be viewed from above because of the upper elements such as the insulating film 31 and the first pinning layer, the guide region 26f has a planar pattern in which the four ends of the substantially H-shaped guide region 26f toward the four photodiodes are exposed to the four apertures of the shielding plate 51, and the other area is shielded by the shielding plate 51, in the plan view of the shielding plate 51 as viewed from above.

In the range sensor according to the fifth embodiment, the voltage applied to each of the first transfer gate electrode 42h, the second transfer gate electrode 44h and the third transfer gate electrode 43h controls potentials in the transfer channels defined by the respective branches, so as to control the signal charge transferred to the first charge-accumulation region 24h, the second charge-accumulation region 24i and the third charge-accumulation region 24l.

As described above, the surface-buried region 25p in the range sensor according to the fifth embodiment has a fishbone shape in the central portion. The charge-modulation arrangement-region corresponding to a backbone part of the fishbone shape is provided at both ends with additional branches extending in the vertical direction perpendicular to the extending direction of the charge-modulation arrangement-region, a first extraction region 24g and a second extraction region 24f of n-type conductivity having a higher impurity concentration than the surface-buried region 25p are connected to the tips of the additional branches extending in the vertical direction on the left side of the charge-modulation arrangement-region, a third extraction region 24j and a fourth extraction region 24k of n-type conductivity having a higher impurity concentration than the surface-buried region 25p are connected to the tips of the additional branches extending in the vertical direction on the right side of the charge-modulation arrangement-region.

As shown in FIG. 20, the range sensor according to the fifth embodiment further includes a first extraction control mechanism (31, 41m) provided adjacent to the first extraction region 24g and configured to control extraction of charges toward the first extraction region 24g via the branch extending in the lower direction of the surface-buried region 25p, a second extraction control mechanism (31, 41l) provided adjacent to the second extraction region 24f and configured to control extraction of charges toward the second extraction region 24f via the branch extending in the upper direction of the surface-buried region 25p, a third extraction control mechanism (31, 41n) provided adjacent to the third extraction region 24j and configured to control extraction of charges toward the third extraction region 24j via the branch extending in the lower direction of the surface-buried region 25p, and a fourth extraction control mechanism (31, 41o) provided adjacent to the fourth extraction region 24k and configured to control extraction of charges toward the fourth extraction region 24k via the branch extending in the upper direction of the surface-buried region 25p.

As in the case of the structure shown in FIG. 2A, the first extraction control mechanism (31, 41m), the second extraction control mechanism (31, 41l), the third extraction control mechanism (31, 42n) and the fourth extraction control mechanism (31, 41o) include the insulating film 31 provided on the respective additional branches of the surface-buried region 25p, and further include a first extraction gate electrode 41m, a second extraction gate electrode 41l, third extraction gate electrode 41n and a fourth extraction gate electrode 41o, respectively, provided on the insulating film 31. As in the case of the structure shown in FIG. 2A, the thickness of the insulating film 31 immediately below the respective first extraction gate electrode 41m, second extraction gate electrode 41l, third extraction gate electrode 41n and fourth extraction gate electrode 41o is thinner than the other sites, and the thinner parts of the insulating film 31 each serve as a "gate insulating film". The first extraction gate electrode 41m, the second extraction gate electrode 41l, the third extraction gate electrode 41n and the fourth extraction gate electrode 41o are symmetrically provided at four corners of the planar structure of the substantially H-shaped guide region 26f.

When a solid-state imaging device (image sensor) having a large pixel area and using a single photodiode, as in the case of the range sensors according to the first and second embodiments, cannot ensure a sufficiently rapid response, a plurality of photodiodes may be provided in one pixel, as shown in FIG. 20, so as to accumulate output from the plural photodiodes to amplify a signal. The range sensor according to the fifth embodiment shown in FIG. 20 corresponds to a case in which four range sensors each corresponding to the first and second embodiments are provided in one pixel.

As shown in FIG. 20, the range sensor according to the fifth embodiment is provided with the first extraction gate electrode 41m and the second extraction gate electrode 41l symmetrically arranged to interpose the charge-modulation arrangement-region in the vertical direction between a portion vertically connecting the first and second photodiodes provided on the upper left side and the lower left side and the charge-modulation portion provided in the central portion of the charge-modulation arrangement-region extending toward the right from the connecting portion. Accordingly, the first extraction gate electrode 41m and the second extraction gate electrode 41l can switch the operation between the extraction of photoelectrons toward the first extraction region 24g and the second extraction region 24f and the transport of the photoelectrons toward the charge-modulation portion including the first transfer-control mechanism (31, 42h), the second transfer-control mechanism (31, 44h) and the third transfer-control mechanism (31, 43h).

Similarly, the range sensor according to the fifth embodiment is provided with the third extraction gate electrode 41n and the fourth extraction gate electrode 41o symmetrically arranged to interpose the charge-modulation arrangement-region in the vertical direction between a portion vertically connecting the third and fourth photodiodes provided on the lower right side and the upper right side and the charge-modulation portion provided in the central portion of the charge-modulation arrangement-region extending toward the left from the connecting portion. Accordingly; the third extraction gate electrode 41n and the fourth extraction gate electrode 41o can switch the operation between the extraction of photoelectrons toward the third extraction region 24j and the fourth extraction region 24k and the transport of the photoelectrons toward the charge-modulation portion including the first transfer-control mechanism (31, 42h), the second transfer-control mechanism (31, 44h) and the third transfer-control mechanism (31, 43h).

Figure 22:
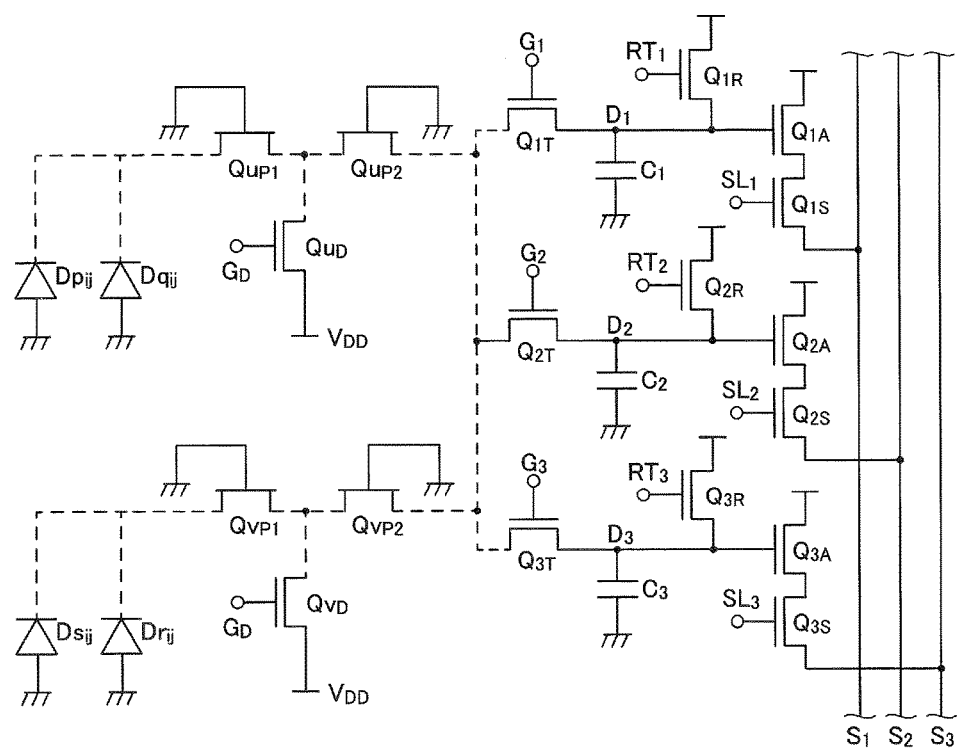
FIG. 22 is a circuit diagram of the principal part of the range sensor according to the fifth embodiment of the present invention illustrated with an equivalent circuit.

FIG. 22 illustrates an equivalent circuit of the range sensor according to the fifth embodiment including four photodiodes in one pixel: a first photodiode $Dp_{ij}$, a second photodiode $Dq_{ij}$, a third photodiode and a fourth photodiode $Ds_{ij}$. The charge-modulation portion common to the four photodiodes in the range sensor according to the fifth embodiment is implemented by three transistors arranged in parallel: a first transfer transistor $Q_{1T}$ as the first transfer-control mechanism (31, 42h), a second transfer transistor $Q_{2T}$ as the second transfer-control mechanism (31, 44h), and a third transfer transistor $Q_{3T}$ as the third left transfer-control mechanism (31, 43h), as indicated in the middle in FIG. 22.

The static induction channels from the respective first photodiode $Dp_{ij}$ and second photodiode $Dq_{ij}$ indicated on the upper left side to the "common charge-modulation portion" are shown as a circuit indicated by the broken lines in FIG. 22. The static induction channel is indicated on the upper left side by two first junction field-effect transistors $Qu_{P1}$ and $Qu_{P2}$ of which own gates are grounded. A source terminal of a first charge-extraction MOS transistor $Qu_D$ for charge extraction is connected to a center tap of the two first junction field-effect transistors $Qu_{P1}$ and $Qu_{P2}$ connected in series, and a drain terminal of the first charge-extraction MOS transistor $Qu_D$ is connected to a power source $V_{DD}$ having a high potential.

The broken lines in FIG. 22 on the upper left side indicate paths in which electrons flow rapidly due to a depletion electric field because of the connection in the semiconductor region in FIG. 22, photoelectrons generated in the first photodiode $Dp_{ij}$ and the second photodiode $Dq_{ij}$ immediately reach the common charge-modulation portion as signal charges when the voltage $G_D$ applied to each of the first extraction gate electrode 41m and the second extraction gate electrode 41l implementing the first charge-extraction MOS transistor $Qu_D$ is set at a low potential (L). The equivalent circuit is illustrated such that one end of each of the first transfer transistor $Q_{1T}$, the second transfer transistor $Q_{2T}$ and the third transfer transistor $Q_{3T}$ implementing the common charge-modulation portion is connected to the first junction field-effect transistor $QU_{P2}$ in the T-shaped manner.

The static induction channel from the respective third photodiode $Dr_{ij}$ and fourth photodiode $Ds_{ij}$ indicated on the lower left side to the common charge-modulation portion is indicated by two second junction field-effect transistors $Qv_{P1}$ and $Qv_{P2}$ of which own gates are grounded. A source terminal of a second charge-extraction MOS transistor $Qv_D$ for charge extraction is connected to a center tap of the two second junction field-effect transistors $Qv_{P1}$ and $Qv_{P2}$ connected in series, and a drain terminal of the second charge-extraction MOS transistor $Qv_D$ is connected to a power source $V_{DD}$ having a high potential.

The broken lines in FIG. 22 on the lower left side indicate paths in which electrons flow rapidly due to a depletion electric field because of the connection in the semiconductor region in FIG. 22, photoelectrons generated in the third photodiode and the fourth photodiode $Ds_{ij}$ immediately reach the common charge-modulation portion when the voltage $G_D$ applied to each of the third extraction gate electrode 41n and the fourth extraction gate electrode 41o implementing the second charge-extraction MOS transistor $Qv_D$ is set at a low potential (L).

The equivalent circuit is illustrated such that one end of each of the first transfer transistor $Q_{1T}$, the second transfer transistor $Q_{2T}$ and the third transfer transistor $Q_{3T}$ is connected to the second junction field-effect transistor $Qv_{P2}$ in the T-shaped manner.

Namely, the output terminal of the first junction field-effect transistor $Qu_{P2}$ and the output terminal of the second junction field-effect transistor $Qv_{P2}$ are connected to the input terminal of each of the first transfer transistor $Q_{1T}$, the second transfer transistor $Q_{2T}$ and the third transfer transistor $Q_{3T}$ arranged in parallel in the T-shaped manner.

In the circuit diagram, the other ends of the first transfer transistor $Q_{1T}$, the second transfer transistor $Q_{2T}$ and the third transfer transistor $Q_{3T}$ are connected to the first charge-accumulation region 24h serving as node $D_1$, the second charge-accumulation region 24i serving as node $D_2$ and the third charge-accumulation region 24l serving as node $D_3$, respectively. When the voltage at the intermediate potential (M) is applied to one of the first transfer gate electrode 42h, the second transfer gate electrode 44h and the third transfer gate electrode 43h, and the voltage at the low potential (L) is applied to the other two electrodes, the photoelectrons are transferred to one of the first charge-accumulation region 24h, the second charge-accumulation region 24i and the third charge-accumulation region 24l.

The three common nodes $D_1$, $D_3$ and $D_2$ shown in FIG. 22 are connected to capacitors $C_1$, $C_3$ and $C_2$ for charge-accumulation. The capacitors $C_1$, $C_3$ and $C_2$ are preferably depletion-mode MOS capacitors in which a threshold voltage is set at a negative voltage so as to reduce voltage dependence. The first node $D_1$ is connected to a gate terminal of a first amplification transistor $Q_{1A}$ implementing a source follower circuit for reading out a potential change in association with a change in the charge amount of the first node $D_1$. The first node $D_1$ is further connected to a first reset transistor $Q_{1R}$ for initializing signal charges after signal readout. A source terminal of the first amplification transistor QiA is connected to a first selection transistor $Q_{1S}$, serving as a switch for readout image selection. An output of the first selection transistor $Q_{1S}$ is connected to a signal readout line extending in the vertical direction.

The second node $D_2$ is connected to a gate terminal of a second amplification transistor $Q_{2A}$ implementing a source follower circuit for reading out a potential change in association with a change in the charge amount of the second node $D_2$. The second node $D_2$ is further connected to a second reset transistor $Q_{2R}$ for initializing signal charges after signal readout. A source terminal of the second amplification transistor $Q_{2A}$ is connected to a second selection transistor $Q_{2S}$, serving as a switch for readout image selection. An output of the second selection transistor $Q_{2S}$ is connected to a signal readout line extending in the vertical direction. The third node $D_3$ is connected to a gate terminal of a third amplification transistor $Q_{3A}$ implementing a source follower circuit for reading out a potential change in association with a change in the charge amount of the third node $D_3$. The third node $D_3$ is further connected to a third reset transistor $Q_{3R}$ for initializing signal charges after signal readout. A source terminal of the third amplification transistor $Q_{3A}$ is connected to a third selection transistor $Q_{3S}$, serving as a switch for readout image selection. An output of the third selection transistor $Q_{3S}$ is connected to a signal readout line extending in the vertical direction.

The signal readout method in the range sensor according to the fifth embodiment may be either a method of reading out a signal from each of three signal readout lines arranged in parallel as shown in FIG. 22, or a method of turning on a switch sequentially by selection signals SL1, SL2 and SL3 to read out each signal as a time-series signal from a single signal readout line as shown in FIG. 11.

In the range sensor and the solid-state imaging device according to the fifth embodiment, the first photodiode $Dp_{ij}$, the second photodiode $Dq_{ij}$, the third photodiode $Dr_{ij}$ and the fourth photodiode $Ds_{ij}$ each receive light and accumulate signals as charges after subjected to charge modulation in the common charge-modulation portion provided in the central portion of the pixel so as to amplify the signals.

When a solid-state imaging device (image sensor) having a large pixel area and using a single photodiode cannot ensure a sufficiently rapid response, a plurality of photodiodes, each based on the structure according to the first embodiment, may be provided around the pixel as illustrated in the fifth embodiment to merge the common part in the central portion of the pixel, so as to strengthen the function of the range sensor according to the first embodiment and exhibit a more rapid response and higher-speed performance (improve the efficiency of charge collection).

The range sensor according to the fifth embodiment has the function suitable for the time-of-flight measurement by use of the Eq. (4) the Eq. (8), as described in the first embodiment. The range sensor according to the fifth embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

As in the case of the range sensor according to the respective first to fourth embodiments, the range sensor according to the fifth embodiment is provided with the static induction channel having a sufficient length from each end of the charge-modulation arrangement-region to the central portion of the charge-modulation portion, which is shielded by the shielding plate 51, so as to achieve remarkable effects upon reducing the influence of background light while using a pulse at short intervals.

Although the range sensor according to the fifth embodiment has a structure for illustration purposes in which the four photodiodes are provided around the pixel to each receive light to accumulate signals as charges after subjected to charge modulation in the common charge-modulation portion provided in the central portion of the pixel to amplify the signals, the number of photodiodes provided around the pixel may be two or the other number such as six or eight, depending on the size of the pixel area or the response speed or sensitivity to be required.

<Modified Example 1 of Fifth Embodiment>

Figure 23:
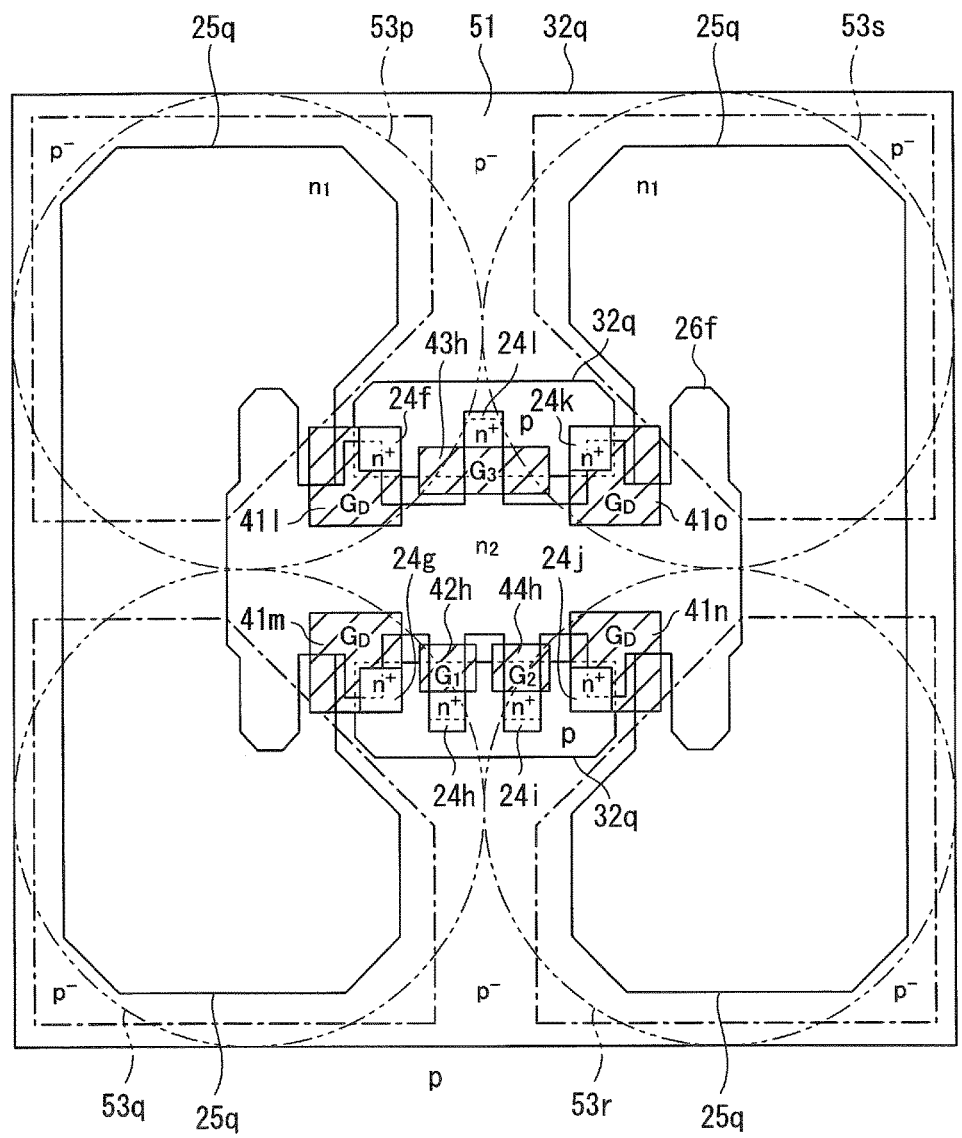
FIG. 23 is a schematic plan view from above of a principal part of a range sensor according to Modified Example 1 of the fifth embodiment of the present invention.

A range sensor according to a modified example (modified example 1) of the fifth embodiment of the present invention is a lock-in pixel having the same structure as shown in FIG. 20 and FIG. 21 including a shielding plate 51 having four apertures: a first aperture on the upper left side, a second aperture on the lower left side, a third aperture on the lower right side, and a fourth aperture on the upper right side, each indicated by the dashed-dotted line, to define four light-receiving areas, as shown in the schematic plan view from above of the principal part in FIG. 23. The range sensor of this example differs in a planar pattern of a surface-buried region 25$q$ of n-type conductivity, which is buried in the pixel layer 22 made of the n-type semiconductor, from the surface-buried region 25$p$ shown in FIG. 20 and FIG. 21 having a four-leaf clover shape in the plan view.

The surface-buried region 25$q$ of the range sensor according to modified example 1 of the fifth embodiment is selectively buried in the upper portion of the pixel layer 22 to implement a first photodiode in a first light-receiving area defined by a first aperture and a second photodiode in a second light-receiving area defined by a second aperture, in which first and second light-receiving terminal-portions are connected to provide a vertically-integrated region in a planar pattern. This topology differs from the surface-buried region 25$p$ in the planar pattern shown in FIG. 20 and FIG. 21.

The surface-buried region 25$q$ is further selectively buried in the upper portion of the pixel layer 22 to implement a third photodiode in a third light-receiving area defined by a third aperture and a fourth photodiode in a fourth light-receiving area defined by a fourth aperture, in which third and fourth light-receiving terminal-portions are connected to provide a vertically-integrated region in a planar pattern. This topology also differs from the surface-buried region 25$p$ shown in FIG. 20 and FIG. 21.

As shown in the plan view of FIG. 23, the first light-receiving terminal-portion in the surface-buried region 25$q$ on the upper left side has an area sufficient to cover substantially the entire first aperture, the second light-receiving terminal-portion in the surface-buried region 25$q$ on the lower left side has an area sufficient to cover substantially the entire second aperture, the third light-receiving terminal-portion in the surface-buried region 25$q$ on the lower right side has an area sufficient to cover substantially the entire third aperture, and the fourth light-receiving terminal-portion in the surface-buried region 25$q$ on the upper right side has an area sufficient to cover substantially the entire fourth aperture.

Since the first and second light-receiving terminal-portions are integrated in a planar pattern, and the third and fourth light-receiving terminal-portions are integrated in a planar pattern, the first and second light-receiving areas implement the common left side of the surface-buried region 25$q$, and the third and fourth light-receiving areas implement the common right side of the surface-buried region 25$q$, so as to provide a simpler planar pattern in lithography. Further, since the first and second light-receiving terminal-portions are integrated in a planar pattern, and the third and fourth light-receiving terminal-portions are integrated in a planar pattern, the area covered with the shielding plate 51 is larger than that in the planar pattern of the surface-buried region 25$p$ shown in FIG. 20 and FIG. 21.

The topology of the surface-buried region 25$q$ in which the integrated region of the first and second light-receiving terminal-portions on the left side and the integrated region of the third and fourth light-receiving terminal-portions on the right side are connected by a charge-modulation arrangement-region including fishbone-shaped branches extending in the vertical direction, is the same as that of the surface-buried region 25p shown in FIG. 20 and FIG. 21.

The topology in the charge-modulation arrangement-region in the central portion of the surface-buried region 25q, including a first charge-accumulation region 24h and a second charge-accumulation region 24i of n-type conductivity having a higher impurity concentration than the surface-buried region 25q which are connected to the tips of branches of first and second branches, respectively, a third charge-accumulation region 24l of n-type conductivity having a higher impurity concentration than the surface-buried region 25q which is connected to the tip of a branch of a third branch, and a guide region 26f, is the same as that of the surface-buried region 25p shown in FIG. 20 and FIG. 21, and overlapping explanations are thus not repeated below.

The range sensor according to modified example 1 of the fifth embodiment having a simple planar pattern in which the first and second light-receiving terminal-portions are connected to provide an integrated region, and the third and fourth light-receiving terminal-portions are connected to provide an integrated region, as shown in FIG. 23, can also receive light in the four photodiodes and accumulate signals as charges after subjected to charge modulation in the common charge-modulation portion provided in the central portion of the pixel so as to amplify the signals.

The range sensor according to modified example 1 of the fifth embodiment including a plurality of photodiodes provided in a simpler planar pattern and having a merged common part in the central portion, can strengthen the function of the range sensor according to the first embodiment and exhibit a more rapid response and higher-speed performance (improve the efficiency of charge collection).

<Modified example 2 of fifth embodiment>

Figure 24:
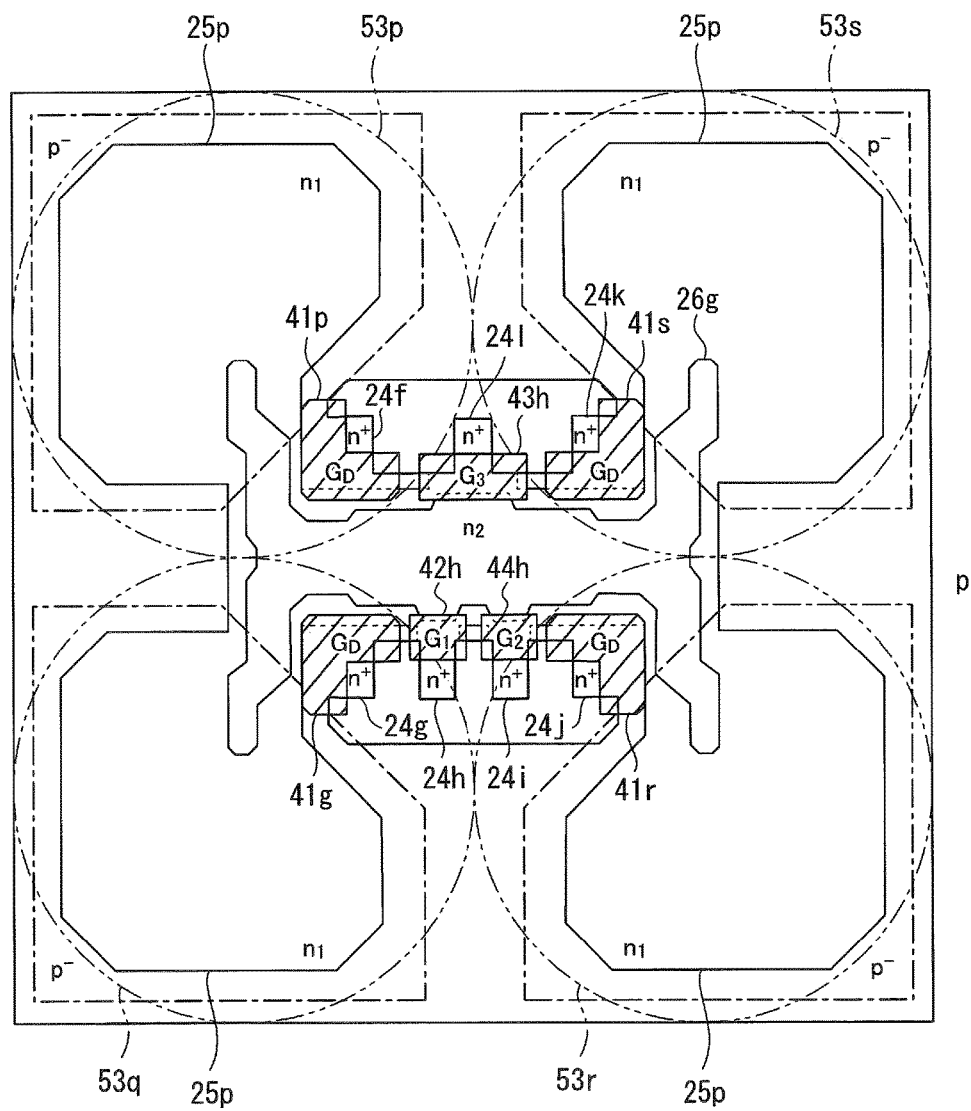
FIG. 24 is a schematic plan view from above of a principal part of a range sensor according to Modified Example 2 of the fifth embodiment of the present invention.

A range sensor according to modified example 2 of the fifth embodiment of the present invention is a lock-in pixel having the same structure as shown in FIG. 20 including a shielding plate 51 having four apertures: a first aperture as indicated by the dashed-dotted line on the upper left side, a second aperture as indicated by the dashed-dotted line on the lower left side, a third aperture as indicated by the dashed-dotted line on the lower right side, and a fourth aperture as indicated by the dashed-dotted line on the upper right side, to define four light-receiving areas, as shown in the schematic plan view from above of the principal part in FIG. 24. The lock-in pixel shown in FIG. 24 also includes four photodiodes provided in the respective four light-receiving areas and receiving light collected in the respective independent microlenses 53p, 53q, 53r and 53s, as in the case of the lock-in pixel shown in FIG. 20.

The range sensor according to modified example 2 of the fifth embodiment includes a guide region 26g including a first protruding-edge tapered into a Z-shape and extending in the upper left direction toward the first photodiode provided on the upper left side in FIG. 24, and a second protruding-edge tapered into a Z-shape and extending in the lower left direction toward the second photodiode provided on the lower left side in FIG. 24. The guide region 26g further includes a third protruding-edge tapered into a Z-shape and extending in the lower left direction toward the third photodiode provided on the lower left side in FIG. 24, and a fourth protruding-edge tapered into a Z-shape and extending in the upper right direction toward the fourth photodiode provided on the upper right side in FIG. 24.

The planar pattern of the lock-in pixel shown in FIG. 24 differs from that shown in FIG. 20 in that the guide region 26g connects the first and second photodiodes in the vertical direction with the Z-shaped first and second protruding-edges and connects the third and fourth photodiodes in the vertical direction with the Z-shaped third and fourth protruding-edges.

As shown in FIG. 24, although the guide region 26g according to modified example 2 of the fifth embodiment has a tour-legged (bronze vessel) shape implemented by the four protruding-edges including the Z-shaped first and second protruding-edges symmetrically opposed in the vertical direction on the left side and the Z-shaped third and fourth protruding-edges symmetrically opposed in the vertical direction on the right side, the guide region 26g entirely has an H-shape and is buried in a part of the surface-buried region 25p on the upper side. The guide region 26g is a semiconductor region of n-type conductivity, which is the same conductivity type as the surface-buried region 25p, and has a higher impurity concentration than the surface-buried region 25p.

However, the central portion surrounded by the four protruding-edges of the H-shaped guide region 26g is not formed into a rectangular shape extending straight in the horizontal direction but is provided with branches extending in the vertical direction as shown in the plan view of FIG. 24. The entire shape of the guide region 26g is thus not an actual H-shape. The range sensor according to modified example 2 of the fifth embodiment includes a charge-modulation portion implemented by a first transfer-control mechanism (31, 42h), a second transfer-control mechanism (31, 44h) and a third transfer-control mechanism (31, 43h). The guide region 26g having a substantially H-shaped planar structure is a semiconductor region for collecting photoelectrons as signal charges from the four regions and guiding the collected photoelectrons to the narrow transfer channels in the charge-modulation portion provided in the central portion of the H-shape, and has a higher impurity concentration than the surface-buried region 25p.

The first to fourth protruding-edges of the guide region 26g each have a stepped shape gradually increased in width from the respective edges on the photodiode side to the central portion of the H-shape. The range sensor according to modified example 2 of the fifth embodiment generates a high drift field in the entire region of the respective first to fourth protruding-edges of the depleted guide region 26g gradually increased in width toward the central portion of the H-shape. Accordingly, photoelectrons as signal charges can rapidly be transferred in the longitudinal direction of the first to fourth protruding-edges of the guide region 26g toward the central portion of the H-shape.

As in the case of the structure shown in FIG. 3A and FIG. 4A, and particularly the structure shown in FIG. 20, the first transfer-control mechanism (31, 42h), the second transfer-control mechanism (31, 44h) and the third transfer-control mechanism (31, 43h) implementing the range sensor according to modified example 2 of the fifth embodiment respectively include an insulating film 31 provided on the respective first, second and third branches, and further include a first transfer gate electrode 42h, a second transfer gate electrode 44h and a third transfer gate electrode 43h provided on the insulating film 31. The range sensor according to modified example 2 of the fifth embodiment has the same topology as that shown in FIG. 20 in which the surface-buried region 25p has a fishbone shape in the central portion, a first extraction region 24g and a second extraction region 24f of n-type conductivity having a higher impurity concentration than the surface-buried region 25p are connected to the tips of additional branches extending in the vertical direction on the left side of the charge-modulation arrangement-region, and a third extraction region 24j and a fourth extraction region 24k of n-type conductivity having a higher impurity concentration than the surface-buried region 25p are connected to the tips of additional branches extending in the vertical direction on the right side of the charge-modulation arrangement-region.

As shown in FIG. 24, the range sensor according to modified example 2 of the fifth embodiment further includes a first extraction control mechanism (31, 41q) provided adjacent to the first extraction region 24g and configured to control extraction of charges toward the first extraction region 24g via the branch extending in the lower direction of the surface-buried region 25p, a second extraction control mechanism (31, 41p) provided adjacent to the second extraction region 24f and configured to control extraction of charges toward the second extraction region 24f via the branch extending in the upper direction of the surface-buried region 25p, a third extraction control mechanism (31, 41r) provided adjacent to the third extraction region 24j and configured to control extraction of charges toward the third extraction region 24j via the branch extending in the lower direction of the surface-buried region 25p, and a fourth extraction control mechanism (31, 41s) provided adjacent to the fourth extraction region 24k and configured to control extraction of charges toward the fourth extraction region 24k via the branch extending in the upper direction of the surface-buried region 25p. The first extraction control mechanism (31, 41q), the second extraction control mechanism (31, 41p), the third extraction control mechanism (31, 41r) and the fourth extraction control mechanism (31, 41s) differ from the respective mechanisms shown in FIG. 20 in that a first extraction gate electrode 41q, a second extraction gate electrode 41p, a third extraction gate electrode 41r and a fourth extraction gate electrode 41s implementing the first extraction control mechanism (31, 41q), the second extraction control mechanism (31, 41p), the third extraction control mechanism (31, 41r) and the fourth extraction control mechanism (31, 41s) each have an L-shape in a planar pattern.

As shown in FIG. 24, a plurality of photodiodes is provided in one pixel, so as to accumulate output from the plural photodiodes to amplify a signal per pixel. As shown in FIG. 24, the range sensor according to modified example 2 of the fifth embodiment is provided with the first extraction gate electrode 41q and the second extraction gate electrode 41p symmetrically arranged to interpose the charge-modulation arrangement-region in the vertical direction between a portion vertically connecting the first and second photodiodes provided on the upper left side and the lower left side and the charge-modulation portion provided in the central portion of the charge-modulation arrangement-region extending toward the right from the connecting portion. Accordingly, the first extraction gate electrode 41q and the second extraction gate electrode 41p can switch the operation between the extraction of photoelectrons toward the first extraction region 24g and the second extraction region 24f and the transport of the photoelectrons toward the charge-modulation portion including the first transfer-control mechanism (31, 42h), the second transfer-control mechanism (31, 44h) and the third transfer-control mechanism (31, 43h).

Similarly, the range sensor according to modified example 2 of the fifth embodiment is provided with the third extraction gate electrode 41r and the fourth extraction gate electrode 41s symmetrically arranged to interpose the charge-modulation arrangement-region in the vertical direction between a portion vertically connecting the third and fourth photodiodes provided on the lower right side and the upper right side and the charge-modulation portion provided in the central portion of the charge-modulation arrangement-region extending toward the left from the connecting portion. Accordingly, the third extraction gate electrode 41r and the fourth extraction gate electrode 41s can switch the operation between the extraction of photoelectrons toward the third extraction region 24j and the fourth extraction region 24k and the transport of the photoelectrons toward the charge-modulation portion including the first transfer-control mechanism (31, 42h), the second transfer-control mechanism (31, 44h) and the third transfer-control mechanism (31, 43h), as in the case shown in FIG. 20.

<Modified example 3 of fifth embodiment>

Figure 25:
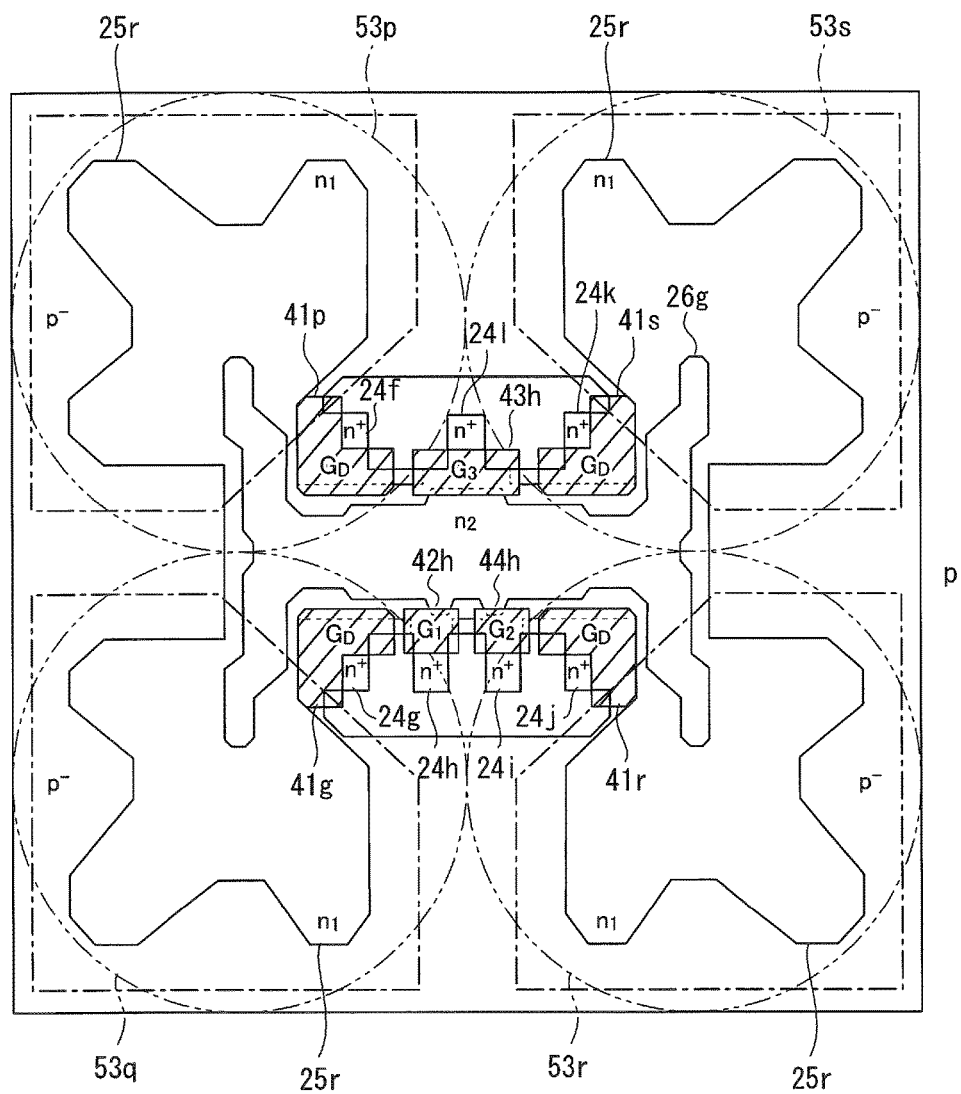
FIG. 25 is a schematic plan view from above of a principal part of a range sensor according to Modified Example 3 of the fifth embodiment of the present invention.

A range sensor according to modified example 3 of the fifth embodiment of the present invention is a lock-in pixel including a shielding plate 51 having four apertures: a first aperture as indicated by the dashed-dotted line on the upper left side, a second aperture as indicated by the dashed-dotted line on the lower left side, a third aperture as indicated by the dashed-dotted line on the lower right side, and a fourth aperture as indicated by the dashed-dotted line on the upper right side, to define four light-receiving areas in one pixel, as shown in the schematic plan view from above of the principal part in FIG. 25. The lock-in pixel shown in FIG. 25 also includes four photodiodes provided in the respective four light-receiving areas to receive light collected in the respective independent microlenses 53p, 53q, 53r and 53s, as in the case of the lock-in pixel shown in FIG. 20 and FIG. 24.

When focused on the first aperture provided on the upper left side and the second aperture provided on the lower left side in FIG. 25, the range sensor according to modified example 3 of the fifth embodiment has a structure similar to that shown in the cross sections of FIG. 2 to FIG. 4, including: a pixel layer 22 made of a semiconductor of a first conductivity type (p-type); and a surface-buried region 25r of a second conductivity type (n-type) selectively buried in the upper portion of the pixel layer 22 to implement a first photodiode in the first light-receiving area defined by the first aperture by forming a junction with the pixel layer 22 and a second photodiode in the second light-receiving area defined by the second aperture by forming a junction with the pixel layer 22, connecting the upper and second light-receiving areas in the vertical direction, and including a charge-modulation arrangement-region extending from the portion where the first and second light-receiving areas are connected toward the portion shielded by the shielding plate 51 along the upper portion of the pixel layer 22 in the right direction.

When focused on a planar pattern of the surface-buried region 25r, the surface-buried region 25r has a planar pattern on the left side in which a first light-receiving terminal-portion having a trilobate leaf shape extends toward a first light-receiving area in the upper left direction, and a second light-receiving terminal-portion having a trilobate leaf shape extends toward a second light-receiving area in the lower left direction. As used herein, the "trilobate leaf shape" is a shape of a leaf of trident maple divided into three by two slits.

The surface-buried region 25r has a planar pattern on the right side in which a third light-receiving terminal-portion having a trilobate leaf shape extends toward a third light-receiving area in the lower right direction, and a fourth light-receiving terminal-portion having a trilobate leaf shape extends toward a fourth light-receiving area in the upper right direction. The surface-buried region 25r on the right side in FIG. 25 thus includes a third photodiode in the third light-receiving area defined by a third aperture by forming a junction with the pixel layer 22 and a fourth photodiode in the fourth light-receiving area defined by a fourth aperture by forming a junction with the pixel layer 22.

The two trilobate leaf shapes of the first and second light-receiving areas on the eft side and the two trilobate leaf shapes of the third and fourth light-receiving areas on the right side are connected to each other via the charge-modulation arrangement-region interposed therebetween and extending in the lateral direction. Namely, the surface-buried region 25r in the range sensor according to modified example 3 of the fifth embodiment includes the trilobate leaf-shaped first to fourth light-receiving terminal-portions in the first to fourth light-receiving areas provided into a tetracyclic flower shape in a planar pattern.

As shown in FIG. 25, the trilobate leaf-shaped first light-receiving terminal-portion on the upper left side has an area sufficient to cover substantially the entire first aperture, the trilobate leaf-shaped second light-receiving terminal-portion on the lower left side has an area sufficient to cover substantially the entire second aperture, the trilobate leaf-shaped third light-receiving terminal-portion on the lower right side has an area sufficient to cover substantially the entire third aperture, and the trilobate leaf-shaped fourth light-receiving terminal-portion on the upper right side has an area sufficient to cover substantially the entire fourth aperture.

As in the case of the planar patterns shown in FIG. 20 and FIG. 24, the charge-modulation arrangement-region in the central portion of the surface-buried region 25r has a polygonal shape including fishbone-shaped branches extending in the vertical direction, instead of a rectangular shape extending straight in the horizontal direction. In other words, the surface-buried region 25r including the charge-modulation arrangement-region in the central portion is provided with first and second branches extending downward in parallel on the lower side of the charge-modulation arrangement-region, and a third branch extending upward on the upper side of the charge-modulation arrangement-region on the opposite side of the first and second branches.

In the central portion of the charge-modulation arrangement-region, a first charge-accumulation region 24h and a second charge-accumulation region 24i of n-type conductivity having a higher impurity concentration than the first surface-buried region 25r are connected to the tips of the branches of the first and second branches, respectively, and a third charge-accumulation region 24l of n-type conductivity having a higher impurity concentration than the first surface-buried region 25r is connected to the tip of the branch of the third branch. The range sensor according to modified example 3 of the fifth embodiment includes a first transfer-control mechanism (31, 42h), a second transfer-control mechanism (31, 44h) and a third transfer-control mechanism (31, 43h) provided adjacent to the first charge-accumulation region 24h, the second charge-accumulation region 24i and the third charge-accumulation region 24l, respectively, to control a transfer of signal charges to the first charge-accumulation region 24h, the second charge-accumulation region 24i and the third charge-accumulation region 24l.

The range sensor according to modified example 3 of the fifth embodiment further includes a guide region 26g buried in a part of the surface-buried region 25r on the upper side, having a four-legged (bronze vessel) shape including Z-shaped first and second protruding-edges connecting the first and second photodiodes in the vertical direction on the left side in FIG. 25 and Z-shaped third and fourth protruding-edges connecting the third and fourth photodiodes in the vertical direction on the right side in FIG. 25, and having a higher impurity concentration than the surface-buried region 25r and a lower impurity concentration than the first charge-accumulation region 24h, the second charge-accumulation region 24i and the third charge-accumulation region 24l. The structure of the guide region 26g is the same as described with reference to FIG. 24, and overlapping explanations are not repeated below.

As in the case shown in FIG. 24, the range sensor according to modified example 3 of the fifth embodiment further includes a first extraction control mechanism (31, 41q) provided adjacent to the first extraction region 24g and configured to control extraction of charges toward the first extraction region 24g via the branch extending in the lower direction of the surface-buried region 25r, a second extraction control mechanism (31, 41p) provided adjacent to the second extraction region 24f and configured to control extraction of charges toward the second extraction region 24f via the branch extending in the upper direction of the surface-buried region 25r, a third extraction control mechanism (31, 41r) provided adjacent to the third extraction region 24j and configured to control extraction of charges toward the third extraction region 24j via the branch extending in the lower direction of the surface-buried region 25r, and a fourth extraction control mechanism (31, 41s) provided adjacent to the fourth extraction region 24k and configured to control extraction of charges toward the fourth extraction region 24k via the branch extending in the upper direction of the surface-buried region 25r. Accordingly, the range sensor according to modified example 3 of the fifth embodiment can switch the operation between the extraction of photoelectrons toward the first extraction region 24g and the second extraction region 24f or the third extraction region 24j and the fourth extraction region 24k and the transport of the photoelectrons toward the charge-modulation portion including the first transfer-control mechanism (31, 42h), the second transfer-control mechanism (31, 44h) and the third transfer-control mechanism (31, 43h).

The range sensor according to modified example 3 of the fifth embodiment includes a plurality of trilobate leaf-shaped photodiodes provided radially around the pixel and the merged common part in the central portion of the pixel, so as to exhibit a more rapid response and higher-speed performance (improve the efficiency of charge collection more) than the range sensor according to the first embodiment. The range sensor according to modified example 3 of the fifth embodiment can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

(Sixth Embodiment)

Figure 26:
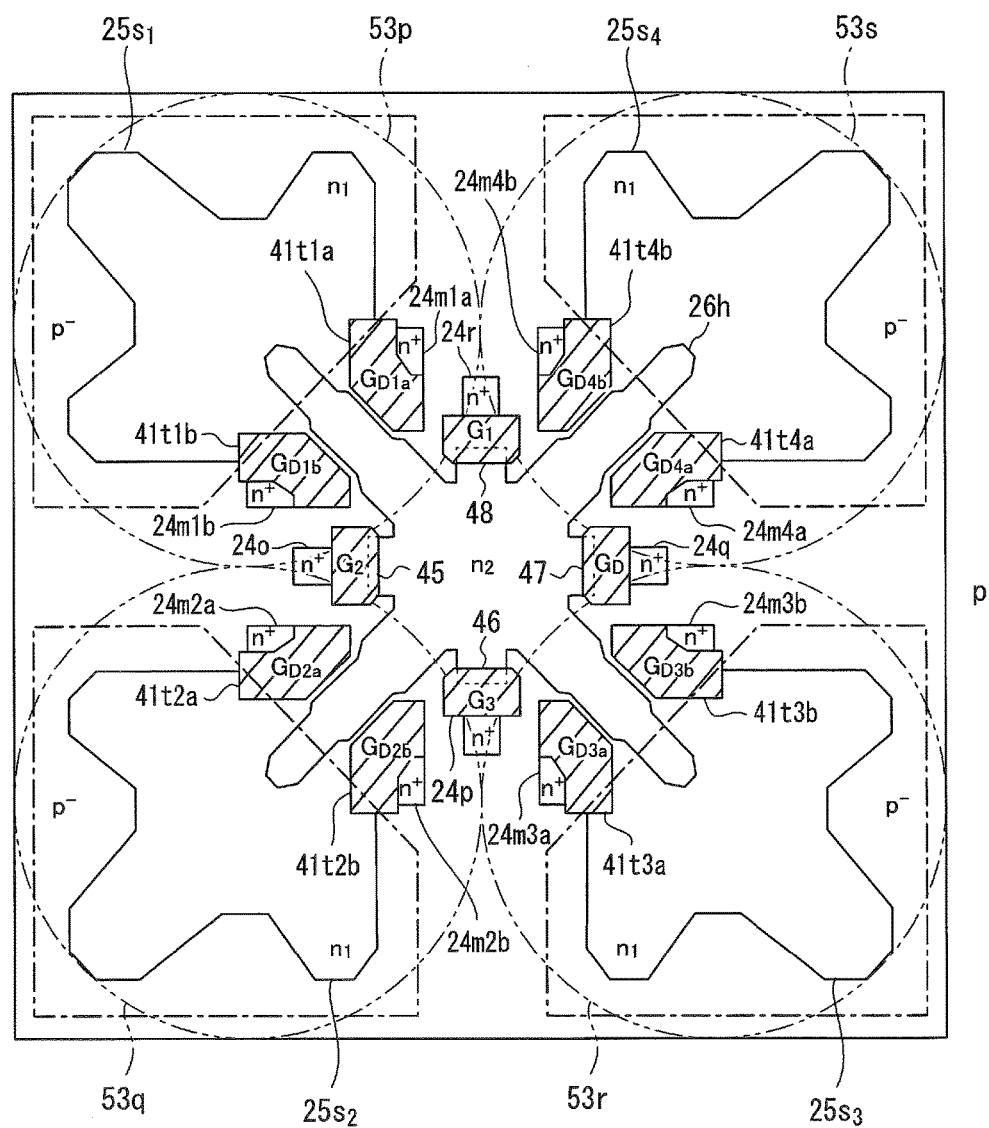
FIG. 26 is a schematic plan view from above of a principal part of a range sensor according to a sixth embodiment of the present invention.

A range sensor according to the sixth embodiment of the present invention is a lock-in pixel including a shielding plate 51 having four apertures: a first aperture as indicated by the dashed-dotted line on the upper left side, a second aperture as indicated by the dashed-dotted line on the lower left side, a third aperture as indicated by the dashed-dotted line on the lower right side, and a fourth aperture as indicated by the dashed-dotted line on the upper right side, to define four light-receiving areas in one pixel, as shown in the schematic plan view from above of the principal part in FIG. 26. The lock-in pixel shown in FIG. 26 also includes four photodiodes provided in the respective four light-receiving areas to receive light collected in the respective independent microlenses 53$p$, 53$q$, 53$r$ and 53$s$, as in the case of the lock-in pixel shown in FIG. 20, FIG. 24 and FIG. 25.

As in the case shown in the cross-sectional views of FIG. 2 to FIG. 4, the first light-receiving area defined by the first aperture on the upper left side in FIG. 26 is provided with a pixel layer 22 made of a semiconductor of a first conductivity type (p-type), and a light-receiving terminal-portion (first light-receiving terminal-portion) 25$s_1$ of a surface-buried region of a second conductivity type (n-type) to implement a first photodiode by forming a junction with the pixel layer 22 into a trilobate leaf shape. The second light-receiving area defined by the second aperture on the lower left side is provided with the pixel layer 22, and a light-receiving terminal-portion (second light-receiving terminal-portion) 25$s_2$ of the surface-buried region of n-type conductivity to implement a second photodiode by forming a junction with the pixel layer 22 into a trilobate leaf shape.

The third light-receiving area defined by the third aperture on the lower right side is provided with the pixel layer 22, and a light-receiving terminal-portion (third light-receiving terminal-portion) 25$s_3$ of the surface-buried region of n-type conductivity to implement a third photodiode by forming a junction with the pixel layer 22 into a trilobate leaf shape, and the fourth light-receiving area defined by the fourth aperture on the upper right side is provided with the pixel layer 22, and a light-receiving terminal-portion (fourth light-receiving terminal-portion) 25$s_4$ of the surface-buried region of n-type conductivity to implement a fourth photodiode by forming a junction with the pixel layer 22 into a trilobate leaf shape. The trilobate leaf-shaped first light-receiving terminal-portion 25$s_4$, second light-receiving terminal-portion 25$s_2$, third light-receiving terminal-portion 25$s_3$ and fourth light-receiving terminal-portion 25$s_4$ are not independent semiconductor regions but are integrated together via a charge-modulation arrangement-region buried into an X-shape in a planar pattern in the upper portion of the common pixel layer 22. Namely, the surface-buried region (25$s_2$, 25$s_3$, 25$s_4$) in the range sensor according to the sixth embodiment has a planar pattern in which the trilobate leaf-shaped first to fourth light-receiving terminal-portions 25$s_1$, 25$s_2$, 25$s_3$ and 25$s_4$ are provided radially in the first to fourth light-receiving areas into a tetracyclic flower shape as shown in FIG. 26.

As shown in FIG. 26, the trilobate leaf-shaped first light-receiving terminal-portion 25$s_1$ on the upper left side has an area sufficient to cover substantially the entire first aperture, the trilobate leaf-shaped second light-receiving terminal-portion 25$s_2$ on the lower left side has an area sufficient to cover substantially the entire second aperture, the trilobate leaf-shaped third light-receiving terminal-portion 25$s_3$ on the lower right side has an area sufficient to cover substantially the entire third aperture, and the trilobate leaf-shaped fourth light-receiving terminal-portion 25$s_4$ on the upper right side has an area sufficient to cover substantially the entire fourth aperture.

The charge-modulation arrangement-region in the central portion of the surface-buried region (25$s_1$, 25$s_2$, 25$s_3$, 25$s_4$) has a complicated shape in a planar pattern having bipinnate compound leaf-shaped branches (not shown), instead of a simple X-shape. As used herein, the "bipinnate compound leaf shape" is a fractal figure having branches in a pinnate pattern such as angelica tree. More particularly, the surface-buried region (25$s_1$, 25$s_2$, 25$s_3$, 25$s_4$) has a topology in which concentric large and small X-shapes are oriented at 45 degrees to each other. The small X-shape is shifted by 45 degrees with respect to the large X-shape to have a plus sign shape with four branches. A first charge-accumulation region 24$r$ of n-type conductivity having a higher impurity concentration than the surface-buried region (25$s_1$, 25$s_2$, 25$s_3$, 25$s_4$) is connected to a vertical branch extending on the upper side of the plus sign shape, and a third charge-accumulation region 24$p$ of n-type conductivity having a higher impurity concentration than the surface-buried region (25$s_1$, 25$s_2$, 25$s_3$, 25$s_4$) is connected to a vertical branch extending on the lower side of the plus sign shape. A second charge-accumulation region 24$o$ of n-type conductivity having a higher impurity concentration than the surface-buried region (25$s_1$, 25$s_2$, 25$s_3$, 25$s_4$) is connected to a lateral branch extending on the left side of the plus sign shape. A central extraction region 24$q$ of n-type conductivity having a higher impurity concentration than the surface-buried region (25$s_1$, 25$s_2$, 25$s_3$, 25$s_4$) is connected to a lateral branch extending on the right side of the plus sign shape.

The large X-shape of the surface-buried region (25$s_1$, 25$s_2$, 25$s_3$, 25$s_4$) is provided toward the first light-receiving terminal-portion 25$s_1$ with branches on both sides of the charge-modulation arrangement-region in the direction perpendicular to the charge-modulation arrangement-region extending in the upper left direction, and a first upper extraction region 24$m$1$a$ and a first lower extraction region 24$m$1$b$ are connected to the tips of the respective branches. The large X-shape of the surface-buried region (25$s_1$, 25$s_2$, 25$s_3$, 25$s_4$) is provided toward the second light-receiving terminal-portion 25$s_2$ with branches on both sides of the charge-modulation arrangement-region in the direction perpendicular to the charge-modulation arrangement-region extending in the lower left direction, and a second upper extraction region 24$m$2$a$ and a second lower extraction region 24$m$2$b$ are connected to the tips of the respective branches. The large X-shape of the surface-buried region (25$s_1$, 25$s_2$, 25$s_3$, 25$s_4$) is provided toward the third light-receiving terminal-portion 25$s_3$ with branches on both sides of the charge-modulation arrangement-region in the direction perpendicular to the charge-modulation arrangement-region extending in the lower right direction, and a third lower extraction region 24$m$3$a$ and a third upper extraction region 24$m$3$b$ are connected to the tips of the respective branches. The large X-shape of the surface-buried region (25$s_1$, 25$s_2$, 25$s_3$, 25$s_4$) is provided toward the fourth light-receiving terminal-portion 25$s_4$ with branches on both sides of the charge-modulation arrangement-region in the direction perpendicular to the charge-modulation arrangement-region extending in the upper right direction, and a fourth lower extraction region 24$m$4$a$ and a fourth upper extraction region 24$m$4$b$ are connected to the tips of the respective branches.

The range sensor according to the sixth embodiment includes a first transfer-control mechanism (31, 48), a second transfer-control mechanism (31, 45) and a third transfer-control mechanism (31, 46) provided adjacent to the first charge-accumulation region 24$r$, the second charge-accumulation region 24$o$ and the third charge-accumulation region 24$p$, respectively, to control a transfer of signal charges to the first charge-accumulation region 24$r$, the second charge-accumulation region 24$o$ and the third charge-accumulation region 24$p$.

The range sensor according to the sixth embodiment further includes a guide region 26$h$ having concentric large and small X-shapes oriented at 45 degrees to each other as shown in FIG. 26 and having a higher impurity concentration than the surface-buried region ($25s_1$, $25s_2$, $25s_3$, $25s_4$) and a lower impurity concentration than the first charge-accumulation region 24r, the second charge-accumulation region 24o and the third charge-accumulation region 24p. The guide region 26h is buried in a part of the surface-buried region ($25s_1$, $25s_2$, $25s_3$, $25s_4$) on the upper side (not shown), as in the case shown in the cross-sectional views of FIG. 2A, FIG. 3A, FIG. 4A and FIG. 5A. The oblique branch of the large X-shape in the guide region 26h extendtending in the upper left direction has a stepped shape gradually increased in width from the first light-receiving terminal-portion $25s_1$ on the outer side toward the center of the large X-shape. The oblique branch of the large X-shape in the guide region 26h extending in the lower left direction has a stepped shape gradually increased in width from the second light-receiving terminal-portion $25s_2$ on the outer side toward the center of the large X-shape. The oblique branch of the large X-shape in the guide region 26h extending in the lower right direction has a stepped shape gradually increased in width from the third light-receiving terminal-portion $25s_3$ on the outer side toward the center of the large X-shape. The oblique branch of the large X-shape in the guide region 26h extending in the upper right direction has a stepped shape gradually increased in width from the fourth light-receiving terminal-portion $25s_4$ on the outer side toward the central portion of the large X-shape.

The range sensor according to the sixth embodiment generates a high drift field in the entire regions of the respective depleted oblique branches of the X-shape gradually increased in width toward the central portion of the X-shape, so as to rapidly transfer the photoelectrons as signal charges along the oblique branches of the X-shape in the longitudinal direction from the outer side to the central portion of the guide region 26h extendven when the light-receiving area has a large area of which a pixel size is five micrometers square or greater.

The range sensor according to the sixth embodiment includes a first upper extraction control mechanism (31, 41t1a) provided adjacent to the first upper extraction region 24m1a along the charge-modulation arrangement-region extending in the upper left direction of the X-shape of the surface-buried region ($25s_1$, $25s_2$, $25s_3$, $25s_4$) and configured to control extraction of charges toward the first upper extraction region 24m1a via the branch extending in the upper right direction from the charge-modulation arrangement-region, and a first lower extraction control mechanism (31, 41t1b) provided adjacent to the first lower extraction region 24m1b along the charge-modulation arrangement-region extending in the upper left direction of the X-shape of the surface-buried region ($25s_1$, $25s_2$, $25s_3$, $25s_4$) and configured to control extraction of charges toward the first lower extraction region 24m1b via the branch extending in the lower left direction from the charge-modulation arrangement-region.

The range sensor according to the sixth embodiment further includes a second upper extraction control mechanism (31, 41t2a) provided adjacent to the second upper extraction region 24m2a along the charge-modulation arrangement-region extending in the lower left direction of the X-shape of the surface-buried region ($25s_1$, $25s_2$, $25s_3$, $25s_4$) and configured to control extraction of charges toward the second upper extraction region 24m2a via the branch extending in the upper left direction from the charge-modulation arrangement-region, and a second lower extraction control mechanism (31, 41t2b) provided adjacent to the second lower extraction region 24m2b along the charge-modulation arrangement-region extending in the lower left direction of the X-shape of the surface-buried region ($25s_1$, $25s_2$, $25s_3$, $25s_4$) and configured to control extraction of charges toward the second upper extraction region 24m2a via the branch extending in the lower right direction from the charge-modulation arrangement-region.

The range sensor according to the sixth embodiment further includes a third lower extraction control mechanism (31, 41t3a) provided adjacent to the third lower extraction region 24m3a along the charge-modulation arrangement-region extending in the lower right direction of the X-shape of the surface-buried region ($25s_1$, $25s_2$, $25s_3$, $25s_4$) and configured to control extraction of charges toward the third lower extraction region 24m3a via the branch extending in the lower left direction from the charge-modulation arrangement-region, and a third upper extraction control mechanism (31, 41t3b) provided adjacent to the third upper extraction region 24m3b along the charge-modulation arrangement-region extending in the lower right direction of the X-shape of the surface-buried region ($25s_1$, $25s_2$, $25s_3$, $25s_4$) and configured to control extraction of charges toward the third upper extraction region 24m3a via the branch extending in the upper right direction from the charge-modulation arrangement-region.

The range sensor according to the sixth embodiment further includes a fourth lower extraction control mechanism (31, 41t4a) provided adjacent to the fourth lower extraction region 24m4a along the charge-modulation arrangement-region extending in the upper right direction of the X-shape of the surface-buried region ($25s_t$, $25s_2$, $25s_3$, $25s_4$) and configured to control extraction of charges toward the fourth lower extraction region 24m4a via the branch extending in the lower right direction from the charge-modulation arrangement-region, and a fourth upper extraction control mechanism (31, 41t4b) provided adjacent to the fourth upper extraction region 24m4b along the charge-modulation arrangement-region extending in the upper right direction of the X-shape of the surface-buried region ($25s_1$, $25s_2$, $25s_3$, $25s_4$) and configured to control extraction of charges toward the fourth upper extraction region 24m4b via the branch extending in the upper left direction from the charge-modulation arrangement-region.

The range sensor according to the sixth embodiment further includes a central extraction control mechanism (31, 47) provided adjacent to the central extraction region 24q provided at the lateral branch extending on the right side of the plus sign shape and configured to control extraction of charges toward the central extraction region 24q via the lateral branch of the plus sign shape from the surface-buried region ($25s_1$, $25s_2$, $25s_3$, $25s_4$).

The range sensor according to the sixth embodiment can switch the operation between the extraction of photoelectrons toward the first upper extraction region 24m1a, the first lower extraction region 24m1b, the second upper extraction region 24m2a, the second lower extraction region 24m2b, the third lower extraction region 24m3a, the third upper extraction region 24m3b, the fourth lower extraction region 24m4a, the fourth upper extraction region 24m4b and the central extraction region 24q due to the first upper extraction control mechanism (31, 41t1a), the first lower extraction control mechanism (31, 41t1b), the second upper extraction control mechanism (31, 41t2a), the second lower extraction control mechanism (31, 41t2b), the third lower extraction control mechanism (31, 41t3a), the third upper extraction control mechanism (31, 41t3b), the fourth lower extraction control mechanism (31, 41t4a), the fourth upper extraction control mechanism (31, 41t4b) and central extraction control mechanism (31, 47), and the transport of the photoelectrons toward the first charge-accumulation region 24r, the second charge-accumulation region 24o and the third charge-accumulation region 24p due to the first transfer-control mechanism (31, 48), the second transfer-control mechanism (31, 45) and the third transfer-control mechanism (31, 46).

Figure 27:
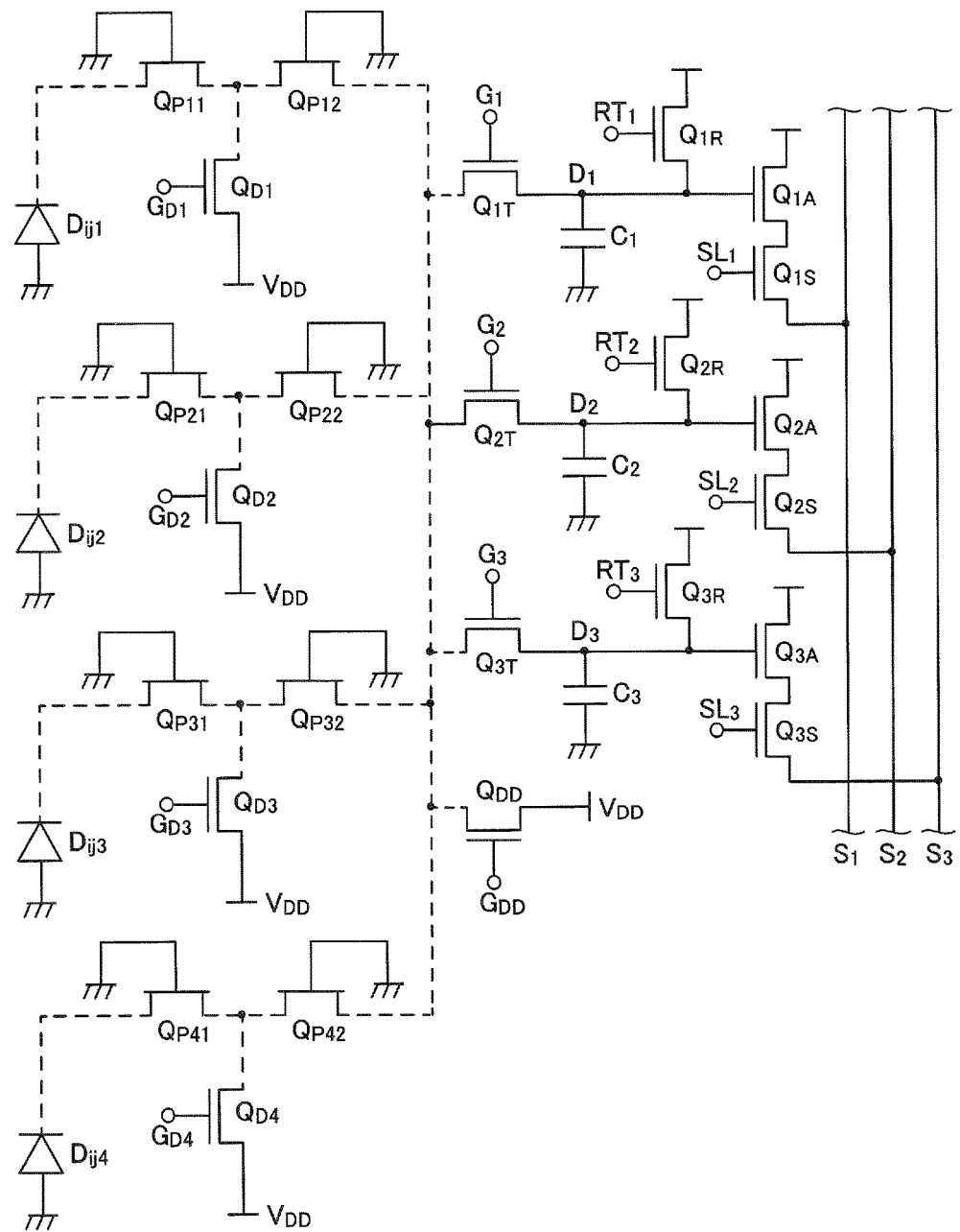
FIG. 27 is a circuit diagram of the principal part of the range sensor according to the sixth embodiment of the present invention illustrated with an equivalent circuit.

FIG. 27 illustrates an equivalent circuit of the range sensor according to the sixth embodiment including four photodiodes in one pixel: a first photodiode $D_{ij1}$, a second photodiode $D_{ij2}$, a third photodiode $D_{ij3}$ and a fourth photodiode $D_{ij4}$. The charge-modulation portion common to the four photodiodes in the range sensor according to the sixth embodiment is implemented by three transistors arranged in parallel: a first transfer transistor $Q_{1T}$ as the first transfer-control mechanism (31, 48), a second transfer transistor $Q_{2T}$ as the second transfer-control mechanism (31, 45), and a third transfer transistor $Q_{3T}$ as the third left transfer-control mechanism (31, 46), as indicated in the middle in FIG. 27.

The static induction channels from the respective first photodiode $D_{ij1}$, second photodiode $D_{ij2}$, third photodiode $D_{ij3}$ and fourth photodiode $D_{ij4}$ indicated on the left side to the "common charge-modulation portion" are shown in a circuit indicated by the broken lines in FIG. 27.

The static induction channel is indicated on the uppermost left side by two first junction field-effect transistors $Q_{P11}$ and $Q_{P12}$, of which own gates are grounded. A source terminal of a first charge-extraction MOS transistor $Q_{D1}$ for charge extraction is connected to a center tap of the two first junction field-effect transistors $Q_{P11}$ and $Q_{P12}$ connected in series, and a drain terminal of the first charge-extraction MOS transistor $Q_{D1}$ is connected to a power source $V_{DD}$ having a high potential. The broken lines in FIG. 27 on the uppermost left side indicate paths in which electrons flow rapidly due to a depletion electric field because of the connection in the semiconductor region in FIG. 27, photoelectrons generated in the first photodiode $D_{ij1}$ immediately reach the common charge-modulation portion as signal charges when a voltage $G_{D1}$ applied to each of an extraction gate electrode 41t1a and an extraction gate electrode 41t1b respectively implementing the first upper extraction control mechanism (31, 41t1a) and the first lower extraction control mechanism (31, 41t1b) is set at a low potential (L).

The static induction channel is indicated on the second stage on the left side by two second junction field-effect transistors $Q_{p21}$ and $Q_{p22}$ of which own gates are grounded. A source terminal of a second charge-extraction MOS transistor $Q_{D2}$ for charge extraction is connected to a center tap of the two second junction field-effect transistors $Q_{p21}$ and $Q_{p22}$ connected in series, and a drain terminal of the second charge-extraction MOS transistor $Q_{D2}$ is connected to a power source $V_{DD}$ having a high potential. The broken lines in FIG. 27 on the second stage on the left side indicate paths in which electrons flow rapidly due to a depletion electric field because of the connection in the semiconductor region in FIG. 27, photoelectrons generated in the second photodiode $D_{ij2}$ immediately reach the common charge-modulation portion as signal charges when a voltage $G_{D2}$ applied to each of an extraction gate electrode 41t2a and an extraction gate electrode 41t2b respectively implementing the second upper extraction control mechanism (31, 41t2a) and the second lower extraction control mechanism (31, 41t2b) is set at a low potential (L).

The static induction channel is indicated on the third stage on the left side by two third junction field-effect transistors $Q_{P31}$ and $Q_{P32}$ of which own gates are grounded. A source terminal of a third charge-extraction MOS transistor $Q_{D3}$ for charge extraction is connected to a center tap of the two third junction field-effect transistors $Q_{P31}$ and $Q_{P32}$ connected in series, and a drain terminal of the third charge-extraction MOS transistor $Q_{D3}$ is connected to a power source $V_{DD}$ having a high potential. The broken lines in FIG. 27 on the third stage on the left side indicate paths in which electrons flow rapidly due to a depletion electric field because of the connection in the semiconductor region in FIG. 27, photoelectrons generated in the third photodiode $D_{ij3}$ immediately reach the common charge-modulation portion as signal charges when a voltage $G_{D3}$ applied to each of an extraction gate electrode 41t3a and an extraction gate electrode 41t3b respectively implementing the third lower extraction control mechanism (31, 41t3a) and the third upper extraction control mechanism (31, 41t3b) is set at a low potential (L).

The static induction channel is indicated on the lowermost left side by two fourth junction field-effect transistors $Q_{P41}$ and $Q_{P42}$ of which own gates are grounded. A source terminal of a fourth charge-extraction MOS transistor $Q_{D4}$ for charge extraction is connected to a center tap of the two fourth junction field-effect transistors $Q_{P41}$ and $Q_{P42}$ connected in series, and a drain terminal of the fourth charge-extraction MOS transistor $Q_{D4}$ is connected to a power source $V_{DD}$ having a high potential. The broken lines in FIG. 27 on the lowermost left side indicate paths in which electrons flow rapidly due to a depletion electric field because of the connection in the semiconductor region in FIG. 27, photoelectrons generated in the fourth photodiode $D_{ij4}$ immediately reach the common charge-modulation portion as signal charges when a voltage $G_{D4}$ applied to each of an extraction gate electrode 41t4a and an extraction gate electrode 41t4b respectively implementing the fourth lower extraction control mechanism (31, 41t4a) and the fourth upper extraction control mechanism (31, 41t4b) is set at a low potential (L).

The equivalent circuit is illustrated with the case in which one end of each of the first transfer transistor $Q_{1T}$, the second transfer transistor $Q_{2T}$ and the third transfer transistor $Q_{3T}$ implementing the common charge-modulation portion is connected to the first junction field-effect transistor $Q_{P12}$, the second junction field-effect transistor $Q_{P22}$, the third junction field-effect transistor $Q_{P3}$ and the fourth junction field-effect transistor $Q_{P42}$ arranged in parallel.

Namely, the output terminals of the first junction field-effect transistor $Q_{P12}$, the second junction field-effect transistor $Q_{P22}$, the third junction field-effect transistor $Q_{P32}$ and the fourth junction field-effect transistor $Q_{P42}$ are connected to the input terminal of each of the first transfer transistor $Q_{1T}$, the second transfer transistor $Q_{2T}$, the third transfer transistor $Q_{3T}$ and a central drain transistor $Q_{DD}$ arranged in parallel.

In the circuit diagram, the other ends of the first transfer transistor $Q_{1T}$, the second transfer transistor $Q_{2T}$ and the third transfer transistor $Q_{3T}$ are connected to the first charge-accumulation region 24r serving as node $D_1$, the second charge-accumulation region 24o serving as node $D_2$ and the third charge-accumulation region 24p serving as node $D_3$, respectively. When the voltage at the intermediate potential (M) is applied to one of the first transfer gate electrode 48, the second transfer gate electrode 45 and the third transfer gate electrode 46, and the voltage at the low potential (L) is applied to the other two electrodes, the photoelectrons are transferred to one of the first charge-accumulation region 24r, the second charge-accumulation region 24o and the third charge-accumulation region 24p.

The three common nodes $D_1$, $D_2$ and $D_3$ shown in FIG. 27 are connected to capacitors $C_1$, $C_2$ and $C_3$ for charge-accumulation. The capacitors $C_1$, $C_2$ and $C_3$ are preferably depletion-mode MOS capacitors in which a threshold voltage is set at a negative voltage so as to reduce voltage dependence. The first node $D_1$ is connected to a gate terminal of a first amplification transistor $Q_{1A}$ implementing a source follower circuit for reading out a potential change in association with a change in the charge amount of the first node $D_1$. The first node $D_1$ is further connected to a first reset transistor $Q_{1R}$ for initializing signal charges after signal readout. A source terminal of the first amplification transistor $Q_{1A}$ is connected to a first selection transistor $Q_{1S}$, serving as a switch for readout image selection. An output of the first selection transistor $Q_{1S}$ is connected to a signal readout line extending in the vertical direction.

The second node $D_2$ is connected to a gate terminal of a second amplification transistor $Q_{2A}$ implementing a source follower circuit for reading out a potential change in association with a change in the charge amount of the second node $D_2$. The second node $D_2$ is further connected to a second reset transistor $Q_{2R}$ for initializing s signal charges after signal readout. A source terminal of the second amplification transistor $Q_{2A}$ is connected to a second selection transistor $Q_{2S}$, serving as a switch for readout image selection. An output of the second selection transistor $Q_{2S}$ is connected to a signal readout line extending in the vertical direction. The third node $D_3$ is connected to a gate terminal of a third amplification transistor $Q_{3A}$ implementing a source follower circuit for reading out a potential change in association with a change in the charge amount of the third node $D_3$. The third node $D_3$ is further connected to a third reset transistor $Q_{3R}$ for initializing signal charges after signal readout. A source terminal of the third amplification transistor $Q_{3A}$ is connected to a third selection transistor $Q_{3S}$, serving as a switch for readout image selection. An output of the third selection transistor $Q_{3S}$ is connected to a signal readout line extending in the vertical direction.

The signal readout method in the range sensor according to the sixth embodiment may be either a method of reading out a signal from each of three signal readout lines arranged in parallel as shown in FIG. 27, or a method of turning on a switch sequentially by selection signals SL1, SL2 and SL3 to read out each signal as a time-series signal from a single signal readout line as shown in FIG. 11.

In the range sensor and the solid-state imaging device according to the sixth embodiment, the first photodiode $D_{ij1}$, the second photodiode $D_{ij2}$, the third photodiode $D_{ij3}$ and the fourth photodiode $D_{ij4}$ each receive light and accumulate signals as charges after subjected to charge modulation in the common charge-modulation portion provided in the central portion of the pixel so as to amplify the signals.

When a solid-state imaging device (image sensor) having a large pixel area and using a single photodiode cannot ensure a sufficiently rapid response, a plurality of photodiodes, each based on the structure according to the first embodiment, may be provided around the pixel as illustrated in the sixth embodiment to merge the common part in the central portion of the pixel, so as to strengthen the function of the range sensor according to the first embodiment and exhibit a more rapid response and higher-speed performance (improve the efficiency of charge collection).

The range sensor according to the sixth embodiment has the function suitable for the time-of-flight measurement by use of the Eq. (4) or the Eq. (8) as described in the first embodiment. The range sensor according to the sixth embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

As in the case of the range sensor according to the respective first to fifth embodiments, the range sensor according to the sixth embodiment is provided with the static induction channel having a sufficient length from the respective four ends of the X-shaped charge-modulation arrangement-region to the central portion of the charge-modulation portion, which is shielded by the shielding plate 51, so as to achieve remarkable effects upon reducing the influence of background light while using a pulse at short intervals.

Although the range sensor according to the sixth embodiment has a structure for illustration purposes in which the four photodiodes are provided around the pixel to each receive light to accumulate signals as charges after subjected to charge modulation in the common charge-modulation portion provided in the central portion of the pixel to amplify the signals, the number of photodiodes provided around the pixel may be two or the other number such as six or eight, depending on the size of the pixel area or the response speed or sensitivity to be required.

The range sensor according to the sixth embodiment includes a plurality of trilobate leaf-shaped photodiodes provided radially around the pixel and the merged common part in the central portion of the pixel, so as to exhibit a more rapid response and higher-speed performance (improve the efficiency of charge collection more) than the range sensor according to the first embodiment. The range sensor according to the sixth embodiment can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

(Seventh Embodiment)

A range sensor according to the seventh embodiment of the present invention is a lock-in pixel including a shielding plate 51 having an aperture indicated by the dashed-dotted line in FIG. 28 defining a light-receiving area. As shown in the plan view of FIG. 28 and the cross-sectional views of FIG. 29A and FIG. 30A, the range sensor according to the seventh embodiment fundamentally has the same structure as the range sensor according to the first embodiment and serves as a lock-in pixel including: a pixel layer 22 made of a semiconductor of a first conductivity type (p-type); the shielding plate 51 having the aperture and provided above the pixel layer 22 to define the light-receiving area on the pixel layer 22 below the aperture; a surface-buried region 62 of a second conductivity type (n.-type) selectively buried in the upper portion of the pixel layer 22 to implement a photodiode in the light-receiving area by forming a junction with the pixel layer 22, and extending from the light-receiving area toward plural portions shielded by the shielding plate 51 along the upper portion of the pixel layer 22 so as to delineate a plurality of branches, implementing a T-shaped configuration on the end side; a first charge-accumulation region 24b, a second charge-accumulation region 24d and a third charge-accumulation region 24c of n-type conductivity, which is connected to the tips of the branches and having a higher impurity concentration than the surface-buried region 62; a first transfer-control mechanism (31, 42), a second transfer-control mechanism (31, 44) and a third transfer-control mechanism (31, 43) provided at the branches adjacent to the first charge-accumulation region

24b, the second charge-accumulation regions 24d and the third charge-accumulation region 24c, respectively, to control a transfer of signal charges to the first charge-accumulation region 24b, the second charge-accumulation regions 24d and the third charge-accumulation region 24c; and a guide region (63, 64) of n-type conductivity, which is buried in a part of the upper portion of the surface-buried region 62 with one end provided below a part of the aperture and other ends extending to at least a part of the respective transfer-control mechanisms, and having a higher impurity concentration than the surface-buried region 62 and a lower impurity concentration than the first charge-accumulation region 24b, the second charge-accumulation regions 24d and the third charge-accumulation region 24c.

The range sensor according to the seventh embodiment differs from the range sensor according to the first embodiment in that the surface-buried region 62 is locally buried in the light-receiving area into a reverse U-shape to surround the guide region (63, 64) in a planar pattern, while the surface-buried region 25 in the first embodiment has a fork-like shape in the light-receiving area (in the seventh embodiment, the "fork-like shape" is also referred to as an E-shape). The surface-buried region 62 has a stepped shape of which the width measured in the direction perpendicular to the vertical direction of FIG. 28 is gradually increased from top to bottom. The outline of the surface-buried region 62 in the planar pattern is an envelope curve approximate to a reverse U-shape.

Figure 29A:
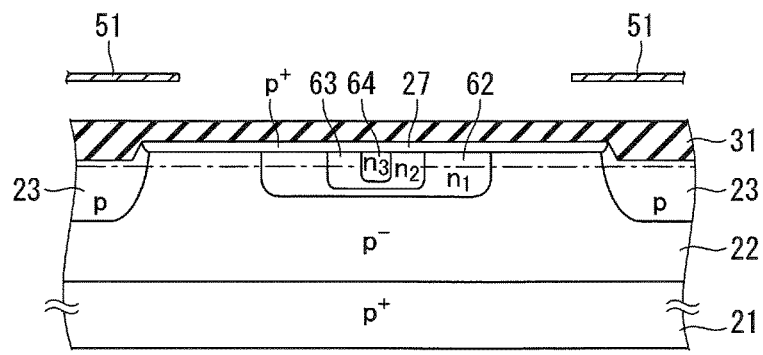
FIG. 29A is a cross-sectional view of the range sensor according to the seventh embodiment as viewed from direction XXIX-XXIX in FIG. 28.
Figure 30A:
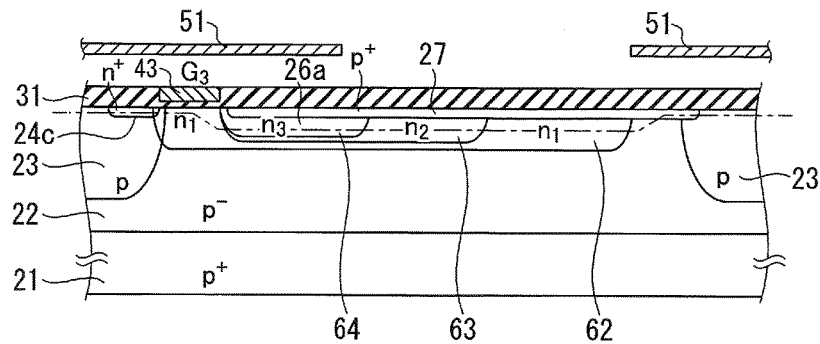
FIG. 30A is a cross-sectional view of the range sensor according to the seventh embodiment as viewed from direction XXX-XXX in FIG. 28.

As shown in FIG. 28, FIG. 29A and FIG. 30A, the range sensor according to the seventh embodiment differs from the range sensor according to the first embodiment in that the guide region (63, 64) has a double-layer structure (a complex structure) including an auxiliary guide region 63 and a main guide region 64 buried in the auxiliary guide region 63, while the guide region 26a according to the first embodiment has a single-layer structure. The auxiliary guide region 63 of the guide region (63, 64) in the range sensor according to the seventh embodiment is a semiconductor region of n-type conductivity ($n_2$-type) having one end provided below a part of the aperture and other ends extending toward the first transfer-control mechanism (31, 42), the second transfer-control mechanism (31, 44) and the third transfer-control mechanism (31, 43), and having a higher impurity concentration than the surface-buried region. The main guide region 64 is a semiconductor region of n-type conductivity ($n_3$-type) having one end provided in a part of the auxiliary guide region 63 and other protruding-edges extending to at least a part of the respective transfer-control mechanisms, and having a higher impurity concentration than the auxiliary guide region 63. The main guide region 64 is a semiconductor region having a lower impurity concentration than the first charge-accumulation region 24b, the second charge-accumulation regions 24d and the third charge-accumulation region 24c.

Namely, the range sensor according to the seventh embodiment includes the auxiliary guide region 63 buried in the central portion of the surface-buried region 62 and having a higher impurity concentration than the surface-buried region 62. The auxiliary guide region 63 guides signal charges from the surface-buried region 62 to the main guide region 64, so as to facilitate the transfer of the signal charges in the surface-buried region 62 toward the main guide region 64. The outline of the auxiliary guide region 63 in the planar pattern is an envelope curve having a stepped shape approximate to a reverse V-shape of which the width measured in the direction perpendicular to the vertical direction of FIG. 28 is gradually increased from top to bottom.

The main guide region 64 is a semiconductor region for guiding the photoelectrons guided by the auxiliary guide region 63 further to the respective narrow transfer channels in the charge-modulation portion. As shown in FIG. 28, the main guide region 64 has a stepped shape of which the width in the direction perpendicular to the longitudinal direction (the vertical direction in FIG. 28) of the main guide region 64 is gradually increased from upper-side to lower-side in the drawing of FIG. 28.

The triple-layered semiconductor regions of n-type conductivity having different impurity concentrations as shown in FIG. 28 have a large potential gradient in every region even in a photodiode having a significantly large area of which a pixel size is 10 micrometers square or greater, so as to increase the electric field to lead to high-speed performance. As shown in the plan view of FIG. 28 and the potential profile in FIG. 29B, the tip of the auxiliary guide region 63 corresponds to the bottom of the potential profile of the surface-buried region 62 to which carriers generated are transferred. The tip of the main guide region 64 having a topology in which the width is narrower than that of the auxiliary guide region 63 is provided in the auxiliary guide region 63. Since the main guide region 64 is buried into the region, around the tip of the auxiliary guide region 63 at a predetermined gap, the potential gradient increases in every region, so as to increase the electric field to achieve higher-speed performance of the range sensor.

The auxiliary guide region 63 may be buried as a semiconductor region having a higher impurity concentration than the surface-buried region 62 such that a part of an ion-implanted area to bury the surface-buried region 62 is doubly ion-implanted in the planar pattern shown in FIG. 28. The main guide region 64 may be buried as a semiconductor region having a higher impurity concentration than the auxiliary guide region 63 such that a part of the region implanted with ions to bury the surface-buried region 62 is triply implanted with ions in the planar pattern shown in FIG. 28.

Figure 29B:
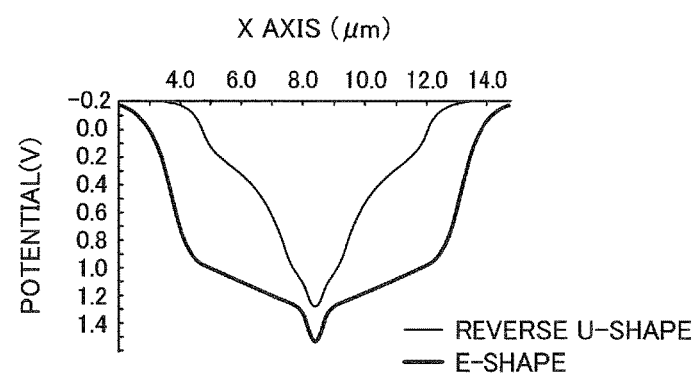
FIG. 29B is a view illustrating potential profiles for the structures illustrated in FIG. 29A and FIG. 29C.
Figure 29C:
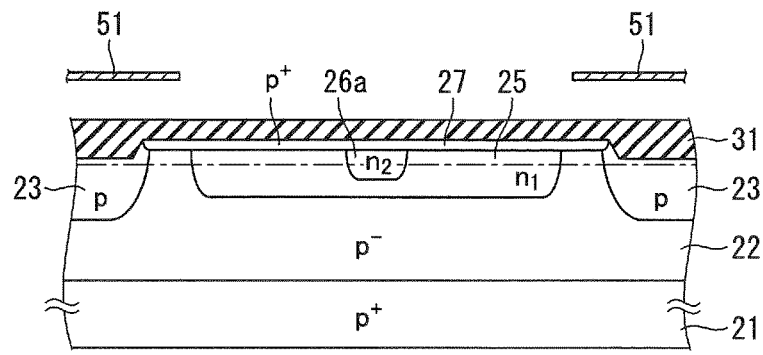
FIG. 29C is a cross-sectional view of the range sensor according to the first embodiment as viewed from direction V-V in FIG. 1.

FIG. 29A is a cross-sectional view of the range sensor according to the seventh embodiment as viewed from direction XXIX-XXIX in FIG. 28, and FIG. 29B is a view illustrating a potential profile indicated by the thin solid line corresponding to the cross section along the dashed-dotted line in FIG. 29A. FIG. 29C is a cross-sectional view which is the same as shown in FIG. 5 in order to compare the range sensor according to the seventh embodiment and the range sensor according to the first embodiment. FIG. 29B further indicates a potential profile by the thick solid line corresponding to the cross section along the dashed-dotted line in FIG. 29C to compare the potential profile of the range sensor according to the seventh embodiment and the potential profile of the range sensor according to the first embodiment.

In the range sensor according to the first embodiment, as shown in the potential profile in FIG. 5, the narrow tip of the guide region 26a is in contact with the surface-buried region 25 to which carriers generated are transferred at a position corresponding to the bottom of the potential profile. The potential profile shows a flat pattern in the region other than the narrow tip of the guide region 26a. In the range sensor according to the seventh embodiment, the potential profile shown in FIG. 29B shows a substantially V-shaped steep gradient tapered to the bottom of the potential profile of the surface-buried region 62.

Figure 30B:
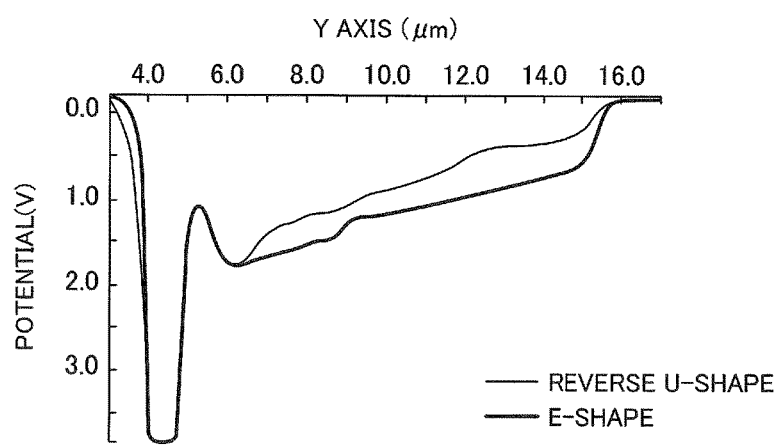
FIG. 30B is a view illustrating potential profiles for the structures illustrated in FIG. 30A and FIG. 30C when a gate signal of an intermediate potential (M) is applied to a first transfer gate electrode.
Figure 30C:
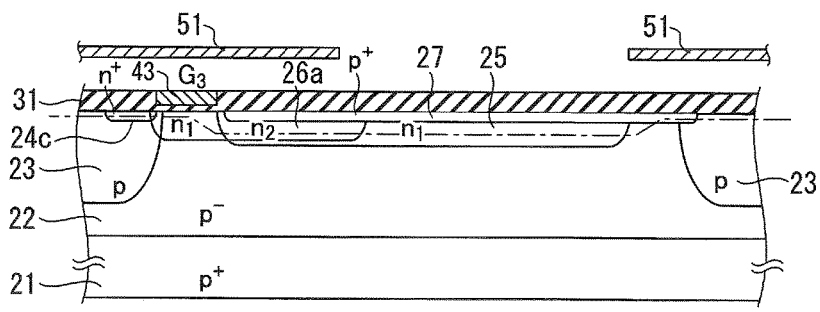
FIG. 30C is a cross-sectional view of the range sensor according to the first embodiment as viewed from the direction opposite to direction III-III in FIG. 1.

FIG. 30A is a cross-sectional view as viewed from direction XXX-XXX in FIG. 28, and FIG. 30B is a view illustrating a potential profile indicated by the thin solid line corresponding to the cross section in FIG. 30A when gate signal $G_1$ of an intermediate potential (M) is applied to the first transfer gate electrode 42. FIG. 30C is a view corresponding to the cross-sectional view shown in FIG. 3 of which the right and left sides are reversed in order to compare the range sensor according to the seventh embodiment and the range sensor according to the first embodiment. FIG. 30B further indicates a potential profile by the thick solid line corresponding to the cross section of FIG. 30C to compare the potential profile of the range sensor according to the seventh embodiment and the potential profile of the range sensor according to the first embodiment.

Figure 31A:
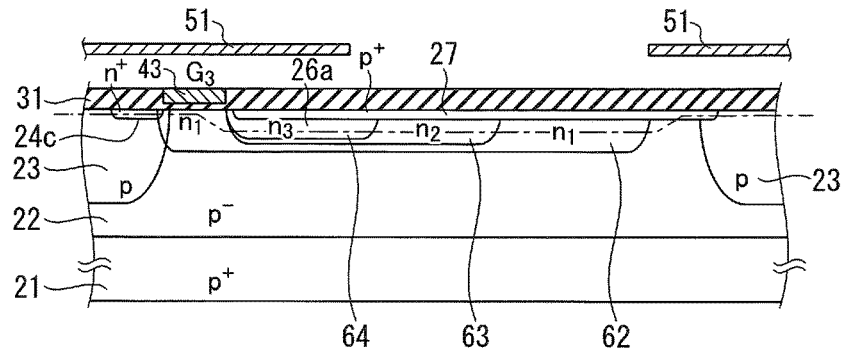
FIG. 31A is a cross-sectional view of the range sensor according to the seventh embodiment as viewed from direction XXX-XXX in FIG. 28.
Figure 31B:
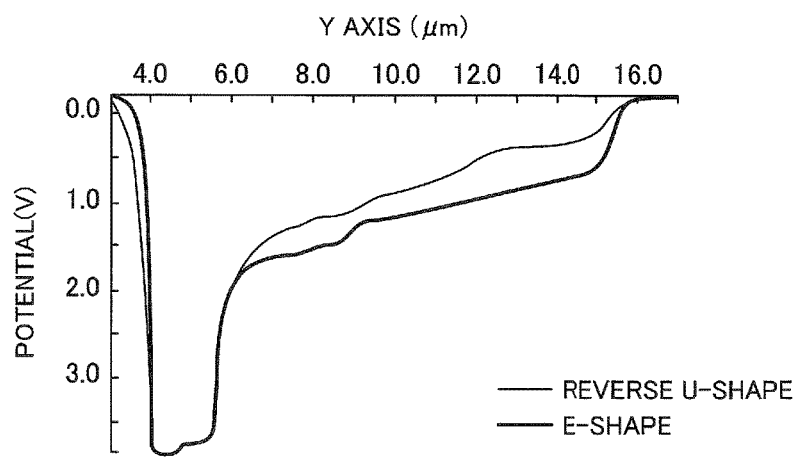
FIG. 31B is a view illustrating potential profiles for the structures illustrated in FIG. 31A and FIG. 31C when a gate signal of an intermediate potential (M) is applied to a third transfer gate electrode.
Figure 31C:
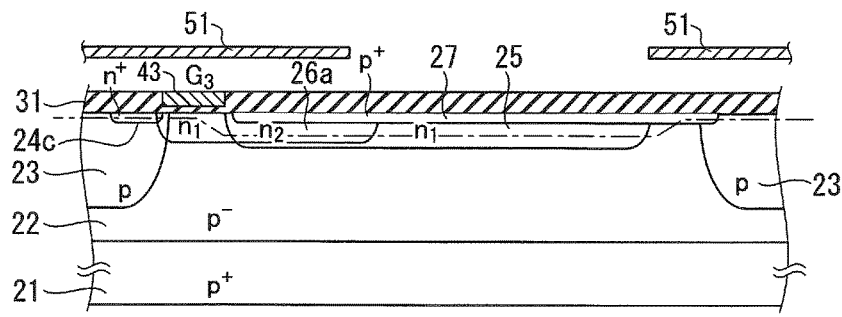
FIG. 31C is a cross-sectional view of the range sensor according to the first embodiment as viewed from the direction opposite to direction III-III in FIG. 1.

FIG. 31A is a cross-sectional view as viewed from direction XXX-XXX iii FIG. 28, and FIG. 31B is a view illustrating a potential profile indicated by the thin solid line corresponding to the cross section in FIG. 31A when gate signal $G_3$ of an intermediate potential (M) is applied to the third transfer gate electrode 43. FIG. 31C is a view corresponding to the cross-sectional view shown in FIG. 3 of which the right and left sides are reversed, as in the case of FIG. 30C, in order to compare the range sensor according to the seventh embodiment and the range sensor according to the first embodiment. FIG. 31B further indicates a potential profile by the thick solid line corresponding to the cross section of FIG. 31C to compare the potential profile of the range sensor according to the seventh embodiment and the potential profile of the range sensor according to the first embodiment.

Although the both potential profiles in FIG. 30B and FIG. 31B show no potential barrier in the static induction channel from the trunk path toward the third charge-accumulation region 24c of the charge-modulation portion, the range sensor according to the seventh embodiment shows a profile having a steeper gradient of the potential in the static induction channel than the profile of the range sensor according to the first embodiment.

The range sensor according to the seventh embodiment with the profile having a steeper gradient of the potential in the static induction channel than the range sensor according to the first embodiment can transfer the photoelectrons generated in the photodiode as signal charges to the charge-modulation portion via the V-shaped potential channel formed in the static induction channel more rapidly than the range sensor according to the first embodiment.

Figure 32:
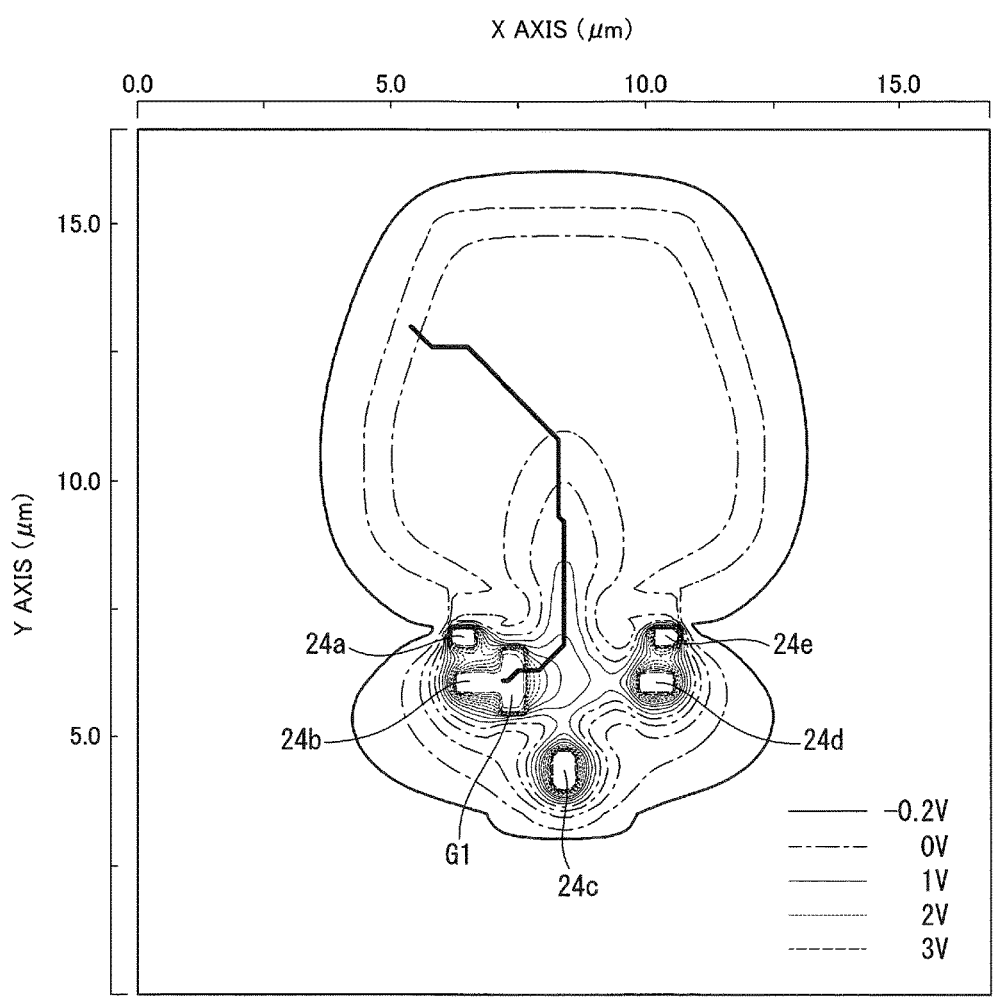
FIG. 32 is a diagram illustrating a potential profile and a transport path of signal charges on equipotential lines in the principal part of the range sensor according to the seventh embodiment when a gate signal of an intermediate potential (M) is applied to the first transfer gate electrode.
Figure 33:
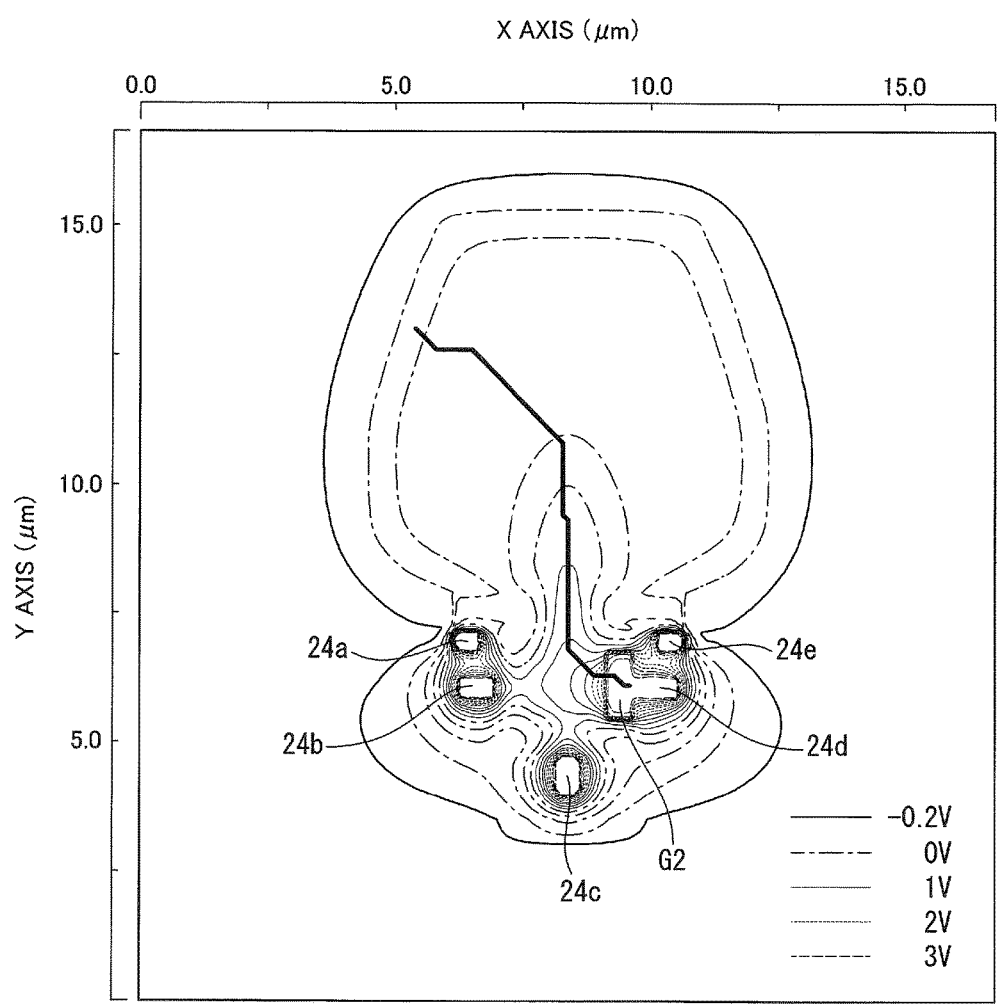
FIG. 33 is a diagram illustrating a potential profile and a transport path of signal charges on equipotential lines in the principal part of the range sensor according to the seventh embodiment when a gate signal of an intermediate potential (M) is applied to the second transfer gate electrode.
Figure 34:
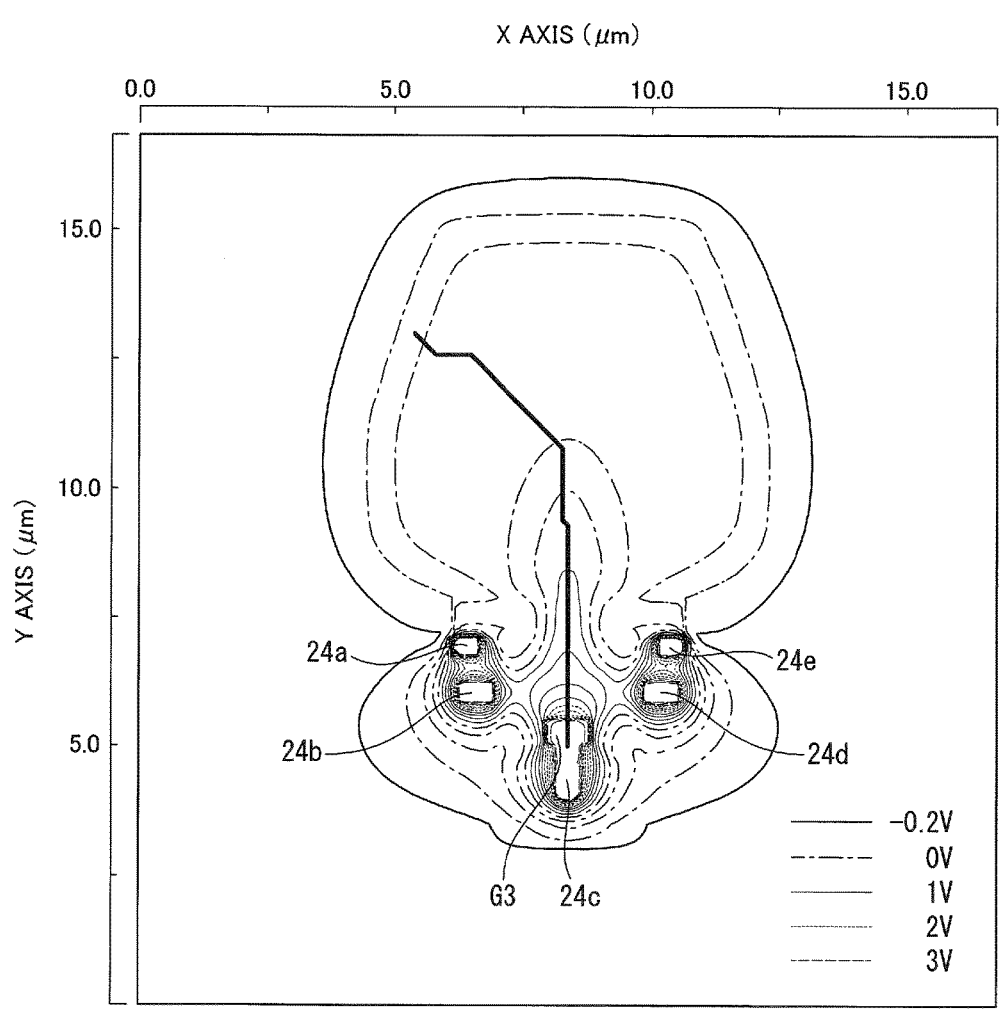
FIG. 34 is a diagram illustrating a potential profile and a transport path of signal charges on equipotential lines in the principal part of the range sensor according to the seventh embodiment when a gate signal of an intermediate potential (M) is applied to the third transfer gate electrode.

As shown in FIG. 28, the range sensor according to the seventh embodiment includes the first transfer gate electrode 42, the second transfer gate electrode 44 and the third transfer gate electrode 43 in the charge-modulation portion. When the gate signal $G_1$ of the intermediate potential (M) is applied to the first transfer gate electrode 42, the potential profile as shown in FIG. 32 appears. When the gate signal $G_2$ of the intermediate potential (M) is applied to the second transfer gate electrode 44, the potential profile as shown in FIG. 33 appears. When the gate signal $G_3$ of the intermediate potential (M) is applied to the third transfer gate electrode 43, the potential profile as shown in FIG. 34 appears. In FIG. 32 to FIG. 34, the thick solid line indicates an equipotential line in which a potential is −0.2 V (indicated by "−0.2 V" in FIG. 32 to FIG. 34), the dashed-dotted line in indicates an equipotential line in which a potential is 0 V or greater and less than 1 V (indicated by "0 V" in FIG. 32 to FIG. 34) (at 0.25 V intervals from 0 V), the thin solid line indicates an equipotential line in which a potential is 1 V or greater and less than 2 V (indicated by "1 V" in FIG. 32 to FIG. 34) (at 0.25 V intervals from 1 V), the fine broken line indicates an equipotential line in which a potential is 2 V or greater and less than 3 V (indicated by "2 V" in FIG. 32 to FIG. 34) (at 0.25 V intervals from 2 V), and the long broken line indicates an equipotential line in which a potential is 3 V or greater and less than 4 V (indicated by "3 V" in FIG. 32 to FIG. 34) (at 0.25 V intervals from 3 V). As described above, the gate signal of the intermediate potential (M) is applied to each of the first transfer gate electrode 42, the second transfer gate electrode 44 and the third transfer gate electrode 43, so as to rapidly transfer the signal charges to the corresponding first charge-accumulation region 24b, second charge-accumulation regions 24d and third charge-accumulation region 24c along the respective paths as indicated by the thick solid lines in FIG. 32 to FIG. 34. This is the principal operation of the range sensor for detecting photoelectrons in synchronization with a light pulse.

Figure 35:
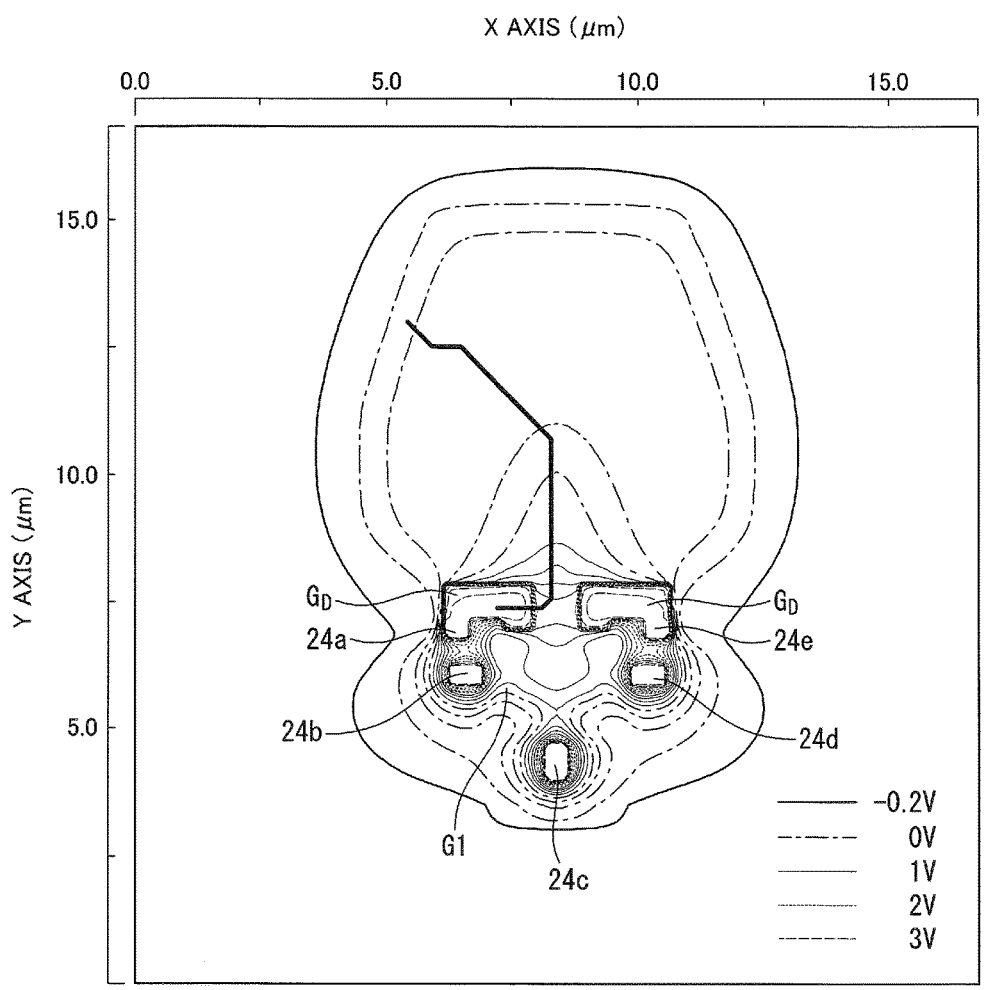
FIG. 35 is a diagram illustrating a potential profile and an extraction path of charges on equipotential lines in the principal part of the range sensor according to the seventh embodiment when a gate signal of an intermediate potential (M) is applied to the first extraction gate electrode.

When gate signal $G_D$ of a high potential (H) higher than the intermediate potential (M) is applied to the first extraction gate electrode 41a and the second extraction gate electrode 41b in the range sensor according to the seventh embodiment, the potential profile indicated by equipotential lines as shown in FIG. 35 appears. Electrons reached the static induction channel formed in the trunk path are directed to the first extraction region 24a to be extracted along the path as indicated by the very thick solid line shown in FIG. 35. In FIG. 35, the thick solid line indicates an equipotential line in which a potential is −0.2 V (indicated by "−0.2 V" in FIG. 35), the dashed-dotted line indicates an equipotential line in which a potential is 0 V or greater and less than 1 V (indicated by "0 V" in FIG. 35) (at 0.25 V intervals from 0 V), the thin solid line indicates an equipotential line in which a potential is 1 V or greater and less than 2 V (indicated by "1 V" in FIG. 35) (at 0.25 V intervals from 1 V), the fine broken line indicates an equipotential line in which a potential is 2 V or greater and less than 3 V (indicated by "2 V" in FIG. 35) (at 0.25 V intervals from 2 V), and the long broken line indicates an equipotential line in which a potential is 3 V or greater and less than 4 V (indicated by "3 V" in FIG. 35) (at 0.25 V intervals from 3 V). When the gate signal $G_D$ of the high potential (H) is applied to the second extraction gate electrode 41b, although the potential profile is not shown in the drawing, electrons reached the static induction channel formed in the trunk path are directed to the second extraction region 24e to be extracted.

The time of transfer of charges to the respective charge-accumulation regions at positions "a" to "e" in each of the X-Y coordinate system of the range sensor according to the seventh embodiment having the reverse U-shaped planar pattern as shown in FIG. 32 to FIG. 35 and the X-Y coordinate system of the range sensor according to the first embodiment having the E-shaped planar pattern as shown in FIG. 6 to FIG. 9 was measured through simulations.

The position "a" of charges was allotted to the coordinate in which X=5.4 μm, Y=13 μm and Z (depth)=3 μm. The position "b" of charges was allotted to the coordinate in which X=8.4 μm, Y=13 μm and Z (depth)=3 μm. The position "c" of charges was allotted to the coordinate in which X=12 μm, Y=12 μm and Z (depth)=3 μm. The position "d" of charges was allotted to the coordinate in which X =8.4 μm, Y=5.5 μm and Z (depth) =0.2 μm. The position "e" of charges was allotted to the coordinate in which X=11 μm, Y=3 μm and Z (depth)=3 μm. Table 1 summarizes the measurement results.

TABLE 1

| Charge position | G₁ | | G₂ | | G₃ | | G_D | |
| --- | --- | --- | --- | --- | --- | --- | --- | --- |
| | E-shape | Reverse U-shape | E-shape | Reverse U-shape | E-shape | Reverse U-shape | E-shape | Reverse U-shape |
| a | 1.51 | 0.56 | 1.51 | 0.56 | 1.56 | 0.57 | 1.15 | 0.46 |
| b | 0.46 | 0.35 | 0.46 | 0.35 | 0.49 | 0.37 | 0.7 | 0.26 |
| c | 1.29 | 0.60 | 1.29 | 0.60 | 1.33 | 0.61 | 0.93 | 0.49 |
| d | 0.008 | 0.004 | 0.007 | 0.003 | — | — | 0.42 | — |
| e | — | 0.32 | 0.58 | 0.31 | — | 0.34 | — | 0.12 |

Unit: ns

The section "G₁" in Table 1 indicates the case regarding the range sensor according to the first embodiment having the E-shaped planar pattern in which the gate signal G₁ applied to the first transfer gate electrode 42 is turned on (3.3 V), while the gate signal G₂ applied to the second transfer gate electrode 44, the gate signal G₃ applied to the third transfer gate electrode 43 and the gate signal G_D applied to the first extraction gate electrode 41a and the second extraction gate electrode 41b are turned off. (1.5 V), and the case regarding the range sensor according to the seventh embodiment having the reverse U-shaped planar pattern in which the gate signal G₁ applied to the first transfer gate electrode 42 is turned on (3.3 V), while the gate signal G₂ applied to the second transfer gate electrode 44, the gate signal G₃ applied to the third transfer gate electrode 43 and the gate signal G_D applied to the first extraction gate electrode 41a and the second extraction gate electrode 41b are turned off (0 V), The section "G₂" in Table 1 indicates the case regarding the range sensor according to the first embodiment having the E-shaped planar pattern in which the gate signal G₂ applied to the second transfer gate electrode 44 is turned on (3.3 V), while the gate signal G₁ applied to the first transfer gate electrode 42, the gate signal G₃ applied to the third transfer gate electrode 43 and the gate signal G_D applied to the first extraction gate electrode 41a and the second extraction gate electrode 41b are turned off (1.5 V), and the case regarding the range sensor according to the seventh embodiment having the reverse U-shaped planar pattern in which the gate signal G₂ applied to the second transfer gate electrode 44 is turned on (3.3 V), while the gate signal G₁ applied to the first transfer gate electrode 42, the gate signal G₃ applied to the third transfer gate electrode 43 and the gate signal G_D applied to the first extraction gate electrode 41a and the second extraction gate electrode 41b are turned off (0 V).

The section "G₃" in Table 1 indicates the case regarding the range sensor according to the first embodiment having the E-shaped planar pattern in which the gate signal G₃ applied to the third transfer gate electrode 43 is turned on (3.3 V), while the gate signal G₁ applied to the first transfer gate electrode 42, the gate signal G applied to the second transfer gate electrode 44 and the gate signal G_D applied to the first extraction gate electrode 41a and the second extraction gate electrode 41b are turned off (1.5 V), and the case regarding the range sensor according to the seventh embodiment having the reverse U-shaped planar pattern in which the gate signal G₃ applied to the third transfer gate electrode 43 is turned on (3.3 V), while the gate signal G₁ applied to the first transfer gate electrode 42, the gate signal G₂ applied to the second transfer gate electrode 44 and the gate signal G_D applied to the first extraction gate electrode 41a and the second extraction gate electrode 41b are turned off (0 V).

The section "G_D" in Table 1 indicates the case regarding the range sensor according to the first embodiment having the E-shaped planar pattern and the range sensor according to the seventh embodiment having the reverse U-shaped planar pattern in which the gate signal G_D applied to the first extraction gate electrode 41a and the second extraction gate electrode 41b is turned on (3.3 V), while the gate signal G₁ applied to the first transfer gate electrode 42, the gate signal G₂ applied to the second transfer gate electrode 44 and the gate signal G₃ applied to the third transfer gate electrode 43 are turned off (0 V).

The transfer time in the range sensor according to the seventh embodiment having the reverse U-shaped planar pattern is approximately half of or a third of the transfer time in the range sensor according to the first embodiment having the E-shaped planar pattern. Thus, the range sensor according to the seventh embodiment can exhibit a more rapid charge transfer than the range sensor according to the first embodiment.

The range sensor according to the seventh embodiment also has the function suitable for the time-of-flight measurement by use of the Eq. (4) or the Eq. (8). The range sensor according to the seventh embodiment thus can serve as a pixel (lock-in pixel) of a solid-state imaging device to achieve a time-of-flight range image sensor capable of rapid transfer of signal charges with high sensitivity at a low dark current even when a plurality of pixels each having a large area of which a pixel size is five micrometers square or greater are provided on a single semiconductor chip.

As in the case of the range sensor according to the first embodiment, the range sensor according to the seventh embodiment is provided with the static induction channel having a sufficient length from the trunk path adjacent to the light-receiving area to the charge-modulation portion, which is shielded by the shielding plate 51, so as to achieve remarkable effects upon reducing the influence of background light while using a pulse at short intervals.

The range sensor according to the seventh embodiment has a profile having a steeper potential gradient in the surface-buried region 62 implementing the photodiode and having the reverse U-shaped planar pattern than the profile of the surface-buried region in the range sensor according to the first embodiment having the E-shaped planar pattern, so as to exhibit a more rapid charge transfer than the range sensor according to the first embodiment.

Although FIG. 28 is illustrated with the case of the triple-layered semiconductor regions of n-type conductivity having different impurity concentrations and including the double-layered guide regions, the range sensor may include semiconductor regions of n-type conductivity having different impurity concentrations and including multiple (three or more) guide regions of n-type conductivity, including a third, fourth, . . . guide regions, so as to have a larger potential gradient in every region in a photodiode having a larger pixel size to ensure higher-speed performance. The range sensor according to the respective second to seventh embodiments may also include multiple (three or more) semiconductor regions of n-type conductivity, so as to achieve the effects of having a larger potential gradient in every region in a photodiode having a larger pixel size, so as to ensure higher-speed performance.

(Other Embodiments)

While the present invention has been described above by reference to the first to seventh embodiments, it should be understood that the present invention is not intended to be limited to the description and the drawings composing part of this disclosure. Various alternative embodiments, examples, and technical applications will be apparent to those skilled in the art according to this disclosure.

While the first to seventh embodiments have exemplified the case in which the first conductivity type is assigned as n-type, and the second conductivity type is assigned as p-type, it will be evident to those skilled in the art that the present invention may also be applicable to the case in which the first conductivity type is p-type and the second conductivity type is n-type to achieve similar effects when the electrical polarities are set to be reverse.

While the first to seventh embodiments have exemplified the case in which the signal charges which are subject to the processes of transportation and accumulation or the like are defined as electrons, and in the potential diagrams, the downward direction (depth direction) is defined as the positive direction of the potential. In a case where electrical polarities are set to be inverse, since the charges which are subject to processes are holes, in a potential shape representing a potential barrier, a potential valley, a potential well, or the like in the charge modulation element, the downward direction (depth direction) of the drawings is represented by the negative direction of the potential.

Figures 36A, 36B:
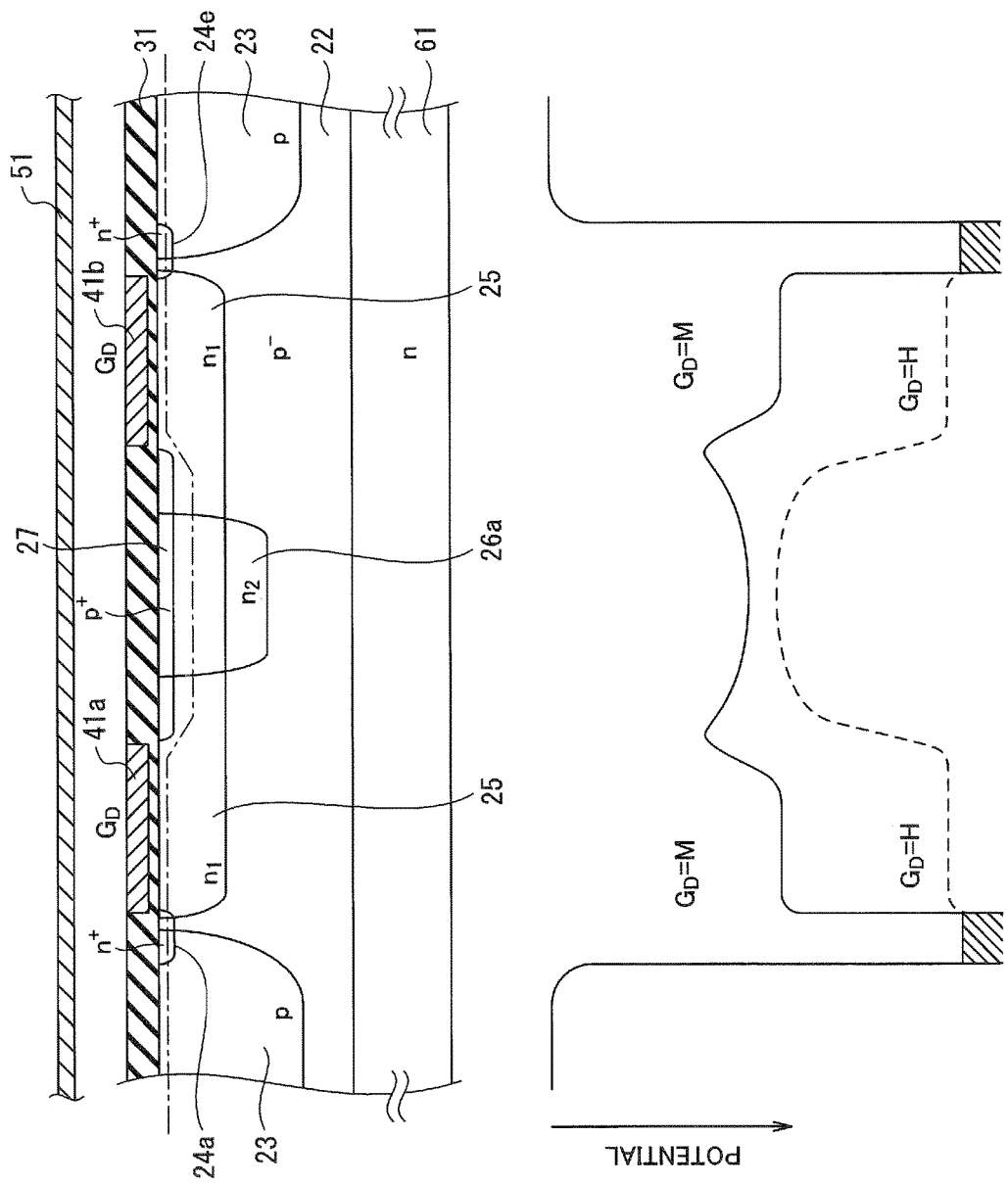
FIG. 36A is a cross-sectional view of a range sensor according to another embodiment at a position corresponding to the cross section as viewed from direction II-II in FIG. 1 for an n-type semiconductor substrate.
FIG. 36B is a diagram illustrating a potential profile for the structure illustrated in FIG. 36A.

While the range sensor according to the first embodiment has been illustrated with the case in which the pixel layer 22 is deposited on the semiconductor substrate 21 of p-type conductivity as shown in the cross-sectional views of FIG. 2A, FIG. 3A and FIG. 4A, the semiconductor substrate may be a semiconductor substrate 61 of n-type conductivity as shown in FIG. 36A, FIG. 37A and FIG. 38A. FIG. 36A is a cross-sectional view as viewed from direction II-II in FIG. 1, and FIG. 36B is a diagram illustrating a potential profile corresponding to the cross section of FIG. 36A. FIG. 37A is a cross-sectional view as viewed from direction III-III in FIG. 1, and FIG. 37B is a diagram illustrating a potential profile corresponding to the cross section of FIG. 37A. FIG. 38A is a cross-sectional view as viewed from direction IV-IV in FIG. 1, and FIG. 38B is a diagram illustrating a potential profile corresponding to the cross section of FIG. 38A.

As shown in FIG. 36A, FIG. 37A and FIG. 38A, while the pixel layer 22 is deposited on the semiconductor substrate 61 of n-type conductivity, the other structures may be completely the same as those in the range sensor according to the first embodiment as shown in FIG. 2A, FIG. 3A and FIG. 4A. When the pixel layer 22 is deposited on the semiconductor substrate 61 of n-type conductivity, and the intermediate potential (M) is applied to the first extraction gate electrode 41a and the second extraction gate electrode 41b arranged symmetrically, a U-shaped potential channel is also formed in the static induction channel of the trunk path extending to the central portion bar of the T shape, while potential barriers remain in the cross-sectional direction as viewed from direction II-II as shown in FIG. 36B. As shown in the potential profile in FIG. 37B, no potential barrier appears in the static induction channel in the cross-sectional direction as viewed from direction III-III in FIG. 1 from the trunk path toward the third charge-accumulation region 24c of the charge-modulation portion. The photoelectrons generated in the photodiode are rapidly transferred to the charge-modulation portion as signal charges via the U-shaped potential channel formed in the static induction channel.

As shown in FIG. 38B, the voltage level $G_3$ of the gate signal applied to the third transfer gate electrode 43 is set at the low potential (L), and the voltage level G1 of the gate signal applied to the first transfer gate electrode 42 and the voltage level $G_2$ of the gate signal applied to the second transfer gate electrode 44 are set at either the low potential (L) or the intermediate potential (M) differently from each other, so as to transfer photoelectrons to either the first charge-accumulation region 24b or the second charge-accumulation region 24d. Thus, the range sensor in which the pixel layer 22 is deposited on the semiconductor substrate 61 of n-type conductivity can implement substantially the same operations as the range sensor according to the first embodiment.

In the range sensor according to the first embodiment, since the semiconductor substrate 21 is a $p_+$-type region having a high impurity concentration, a dark current (a diffusion current component) generated in a deep position of the semiconductor substrate 21 is decreased. Further, the range sensor according to the first embodiment can allow carriers generated in the deep position of the semiconductor substrate 21 and approaching the surface of the semiconductor substrate 21 slowly as a diffusion component to disappear by Auger recombination in the $p^+$-region having a high impurity concentration so as to exhibit a rapid response as a time-of-flight sensor.

As shown in FIG. 36A, FIG. 37A and FIG. 38A, when the semiconductor substrate 61 as a semiconductor region of n-type conductivity and the pixel layer 22 as a semiconductor region of p-type conductivity are used to provide a p-n junction, the range sensor can achieve the effects of suppressing a diffusion component of a dark current in the deep side of the semiconductor substrate 61 and preventing a carrier component from approaching the surface of the semiconductor substrate 61 slowly as a diffusion component due to the potential barrier of the p-n junction.

The range sensor according to the respective second to seventh embodiments may also use a semiconductor substrate of n-type conductivity so as to suppress a diffusion component of a dark current in the deep side of the semiconductor substrate 61 and preventing a carrier component from approaching the surface of the semiconductor substrate 61 slowly as a diffusion component due to the potential barrier of the p-n junction.

Figure 39:
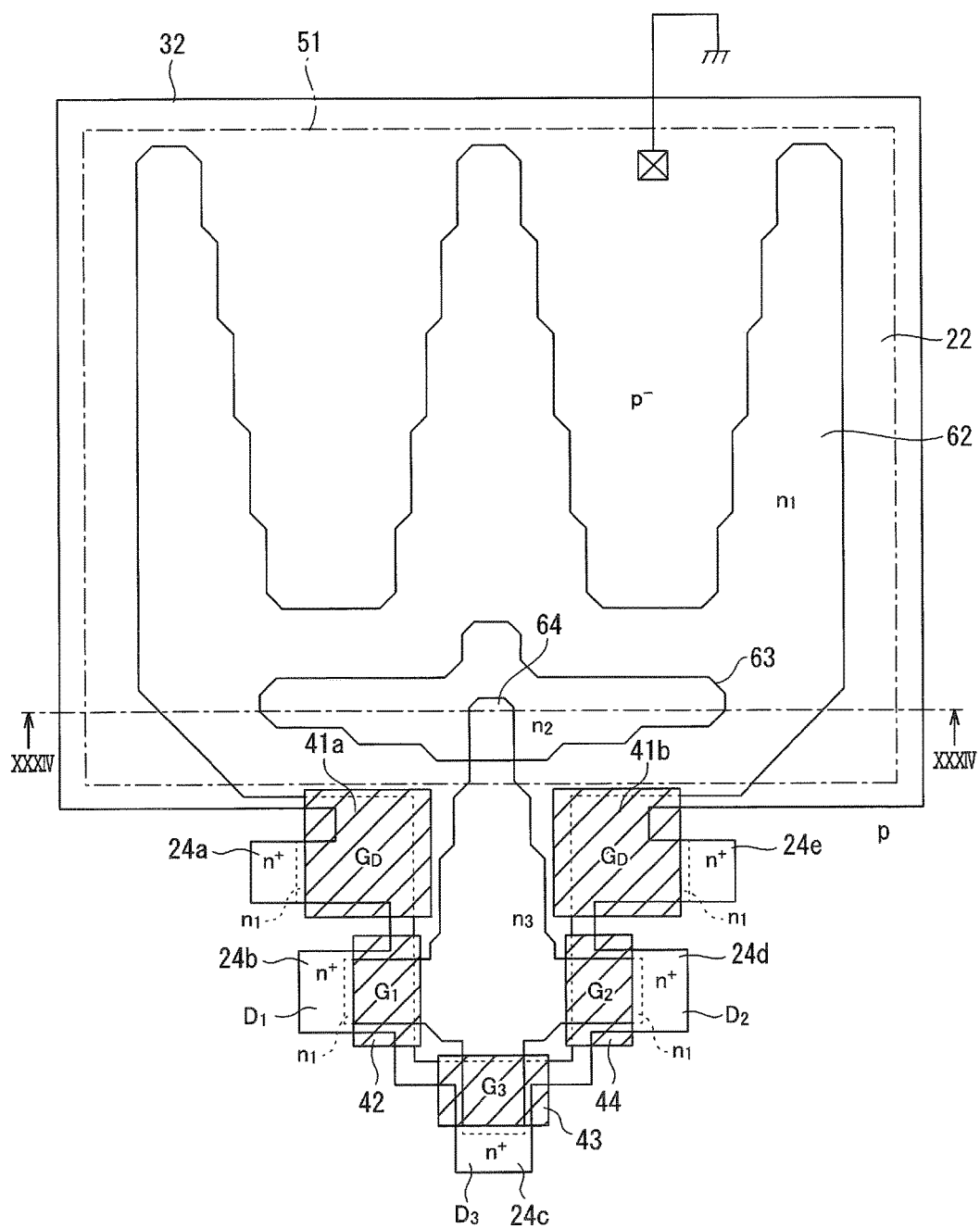
FIG. 39 is a schematic plan view from above of a principal part of a range sensor according to still another embodiment of the present invention.
Figures 40A, 40B:
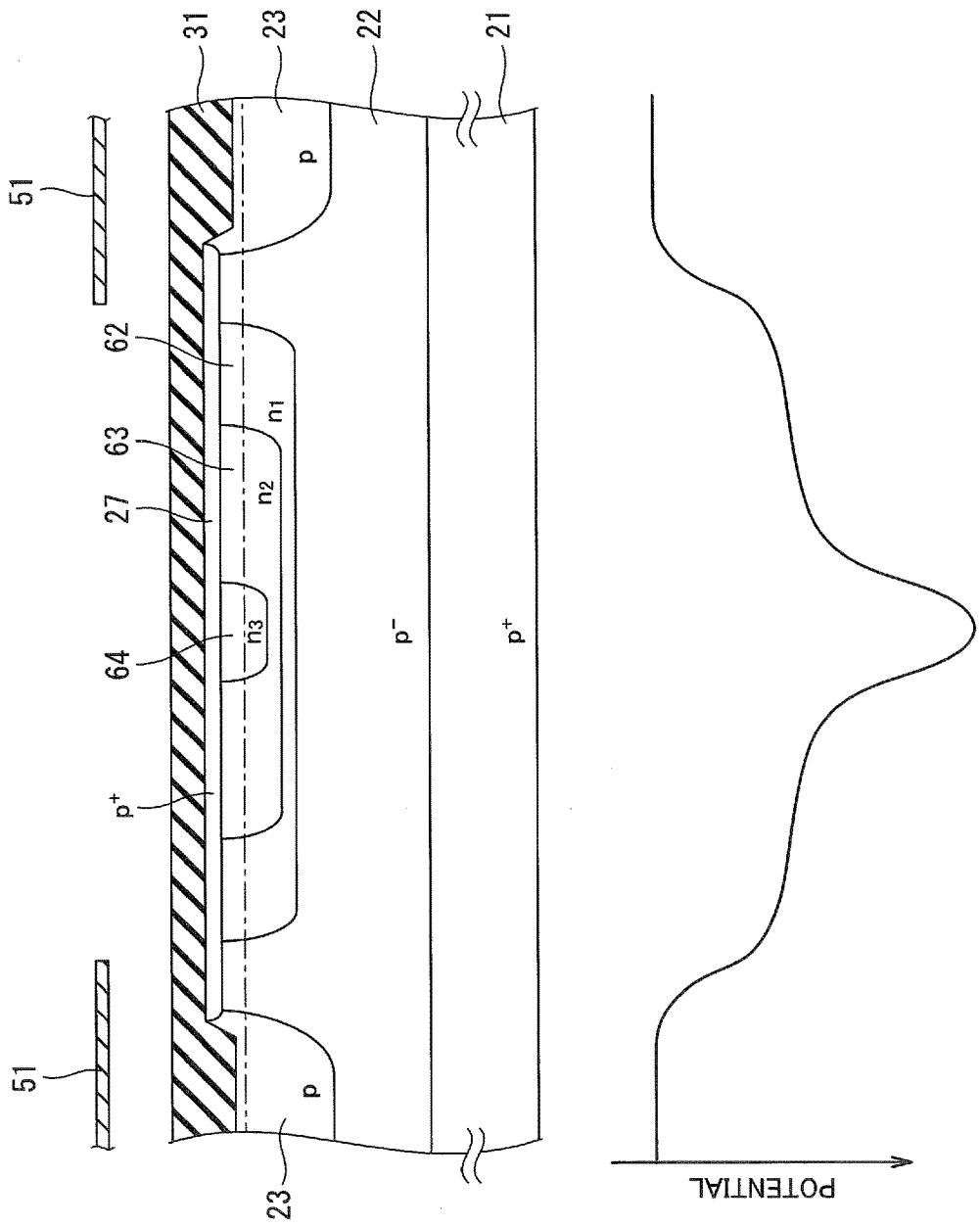
FIG. 40A is a cross-sectional view as viewed from direction XXXXIV-XXXXIV in FIG. 39.
FIG. 40B is a view illustrating a potential profile for the structure illustrated in FIG. 40A.

As shown in FIG. 39 and FIG. 40A, the surface-buried region 62 of n-type conductivity, which implements a photodiode may be formed into a fork-like shape in a planar pattern as in the case of the range sensor according to the first embodiment, and the auxiliary guide region (second guide region) 63 of n-type conductivity having a higher impurity concentration than the surface-buried region 62 is provided in the central portion at the base of the fork-like shape, so as to collect signal charges in the auxiliary guide region 63. FIG. 40A is a cross-sectional view as viewed from direction XXXXIV-XXXXIV in FIG. 39, and FIG. 40B is a diagram illustrating a potential profile corresponding to the cross section of FIG. 40A.

The auxiliary guide region 63 has a planar pattern of a bird-like shape symmetrically spreading the wings of which a head portion is provided in the central portion at the base of the fork-like shape, as shown in FIG. 39. Each of prongs of the fork-like shape has a stepped shape gradually increased in width from upper-side to lower-side in the drawing of FIG. 39, which is the same as the planar pattern of the range sensor according to the first embodiment. The range sensor according to another embodiment as shown in FIG. 39 generates a high drift field in the entire depleted branches of the surface-buried region 62 having a fork-like shape gradually increased in width in the planar pattern in the light-receiving area, so as to rapidly transfer the photoelectrons as signal charges to the auxiliary guide region 63 in the longitudinal direction of the prongs of the fork-like shape even when the light-receiving area has a large area.

The range sensor according to another embodiment as shown in FIG. 39 includes a guide region (a main guide region) 64 of n-type conductivity, which is buried in the central portion of the auxiliary guide region 63 and having a higher impurity concentration than the auxiliary guide region 63, as shown in FIG. 40A, so as to collect signal charges to the guide region 64. The guide region 64 is a semiconductor region for guiding the photoelectrons collected in the auxiliary guide region 63 to the respective narrow transfer channels in the charge-modulation portion. The guide region 64 has a stepped shape of which the width in the direction perpendicular to the longitudinal direction (the vertical direction in FIG. 39) of the guide region 64 is gradually increased from upper-side to lower-side in the drawing of FIG. 39.

The range sensor according to another embodiment as shown in FIG. 39 also generates a high drift field in the entire depleted guide region 64 gradually increased in width in the planar pattern. Accordingly, the photoelectrons as signal charges can rapidly be transferred in the longitudinal direction of the guide region 64.

The triple-layered semiconductor regions of extendconductivity having different impurity concentrations as shown in FIG. 39 have a large potential gradient in every region in a photodiode having a significantly large area of which a pixel size is 10 micrometers square or greater, so as to increase the electric field to lead to high-speed performance. As understood from the plan view of FIG. 39 and the potential profile of FIG. 40B, the tip of the auxiliary guide region (the second guide region) 63 corresponds to the bottom of the potential profile of the surface-buried region 62 to which carriers generated are transferred, and the tip of the guide region (the main guide region) 64 is provided in contact with the auxiliary guide region 63. Accordingly, the potential gradient increases in every region, so as to increase the electric field to achieve high-speed performance of the range sensor. As shown in FIG. 40B, the potential profile has a profile in which the portion corresponding to the auxiliary guide region 63 is deeper than that shown in FIG. 5.

The auxiliary guide region 63 may be buried as a semiconductor region having a higher impurity concentration than the surface-buried region 62 such that a part of an ion-implanted area to bury the surface-buried region 62 is doubly ion-implanted in the planar pattern shown in FIG. 39. The main guide region 64 may be buried as a semiconductor region having a higher impurity concentration than the auxiliary guide region 63 such that a part of the region implanted with ions to bury the surface-buried region 62 is triply implanted with ions in the planar pattern shown in FIG. 39.

Although FIG. 39 is illustrated for a case of the triple-layered semiconductor regions of n-type conductivity, each having different impurity concentrations, and a case which includes the double-layered guide regions, the range sensor may include semiconductor regions of n-type conductivity, each having different impurity concentrations, and a case which includes multiple (three or more) guide regions of n-type conductivity. The multiple guide regions may include a third, fourth, . . . guide regions, so as to have a larger potential gradient in every region in a photodiode having a larger pixel size to ensure higher-speed performance. The range sensor according to the respective second to seventh embodiments may also include multiple (three or more) semiconductor regions of n-type conductivity, so as to achieve the effects of having a larger potential gradient in every region in a photodiode having a larger pixel size, so as to ensure higher-speed performance.

When the surface-buried region includes light-receiving terminal-portions having a trilobate leaf shape in a planar pattern, such as the surface-buried region 25r according to the fifth embodiment or the surface-buried region ($25s_1$, $25s_2$, $25s_3$, $25s_4$) according to the sixth embodiment, the auxiliary guide region (the second guide region) may have a trilobate leaf shape smaller than the light-receiving terminal-portions so as to be provided in each of the four apertures.

In the case of the planar pattern of the fifth embodiment, for example, the range sensor may include four auxiliary guide regions of n-type conductivity having a higher impurity concentration than the surface-buried region 25r in which each one end having a trilobate leaf shape is provided below each of the four apertures and the other ends extend to the charge-modulation arrangement-region shielded by the shielding plate 51. Namely, the guide region 26g shown in FIG. 25 has a double-layer structure including the four auxiliary guide regions and a main guide region of n-type conductivity having protruding-edges extending toward the respective four auxiliary guide regions from the charge-modulation arrangement-region, the main guide region having a higher impurity concentration than the auxiliary guide regions and a lower impurity concentration than the first charge-accumulation region 24h, the second charge-accumulation region 24i and the third charge-accumulation region 24l.

In the case of the sixth embodiment, for example, the range sensor may have a topology including four auxiliary guide regions of n-type conductivity having a higher impurity concentration than the surface-buried region ($25s_1$, $25s_2$, $25s_3$, $25s_4$) in which each one end having a trilobate leaf shape is provided below each of the four apertures and the other ends extend to the charge-modulation arrangement-region shielded by the shielding plate 51. In this case, the guide region 26h shown in FIG. 26 has a double-layer structure including the four auxiliary guide regions and a main guide region of n-type conductivity having a topology including radial (X-shaped) four protruding-edges extending below the respective four auxiliary guide regions from the charge-modulation arrangement-region, the main guide region having a higher impurity concentration than the auxiliary guide regions and a lower impurity concentration than the first charge-accumulation region 24r, the second charge-accumulation region 24o and the third charge-accumulation region 24p.

Figure 41A:
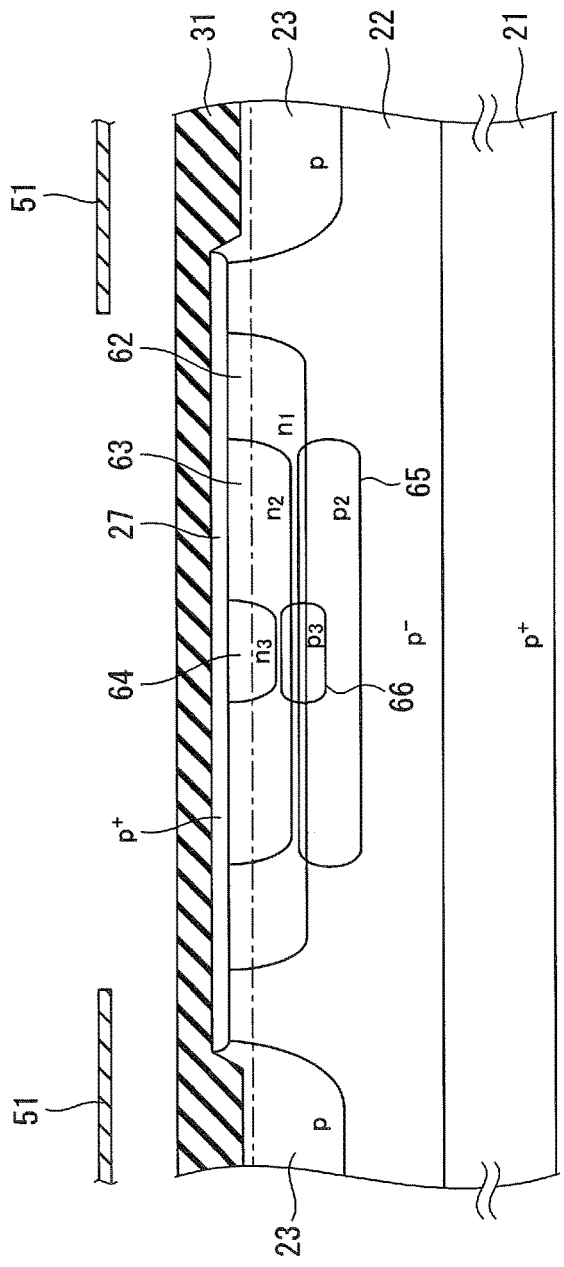
FIG. 41A is a cross-sectional view of a range sensor according to still another embodiment at a position corresponding to the cross section in FIG. 40A.

Further, as shown in FIG. 41A, a first block region 65 of p-type conductivity may be selectively buried immediately below the auxiliary guide region (the second guide region) 63, and a second block region 66 of p-type conductivity having a higher impurity concentration than the first block region 65 may be selectively buried immediately below the guide region 64, so as to reduce a component introduced without charge modulation. FIG. 41A illustrates the first block region 65 partly overlapping with a part of the bottom portion of the surface-buried region 62. The second block region 66 is buried such that the bottom portion partly overlaps with a part of the upper portion of the first block region 65, and the upper portion of the second block region 66 is introduced into a part of the bottom portion of each of the surface-buried region 62 and the auxiliary guide region 63.

Figure 41B:
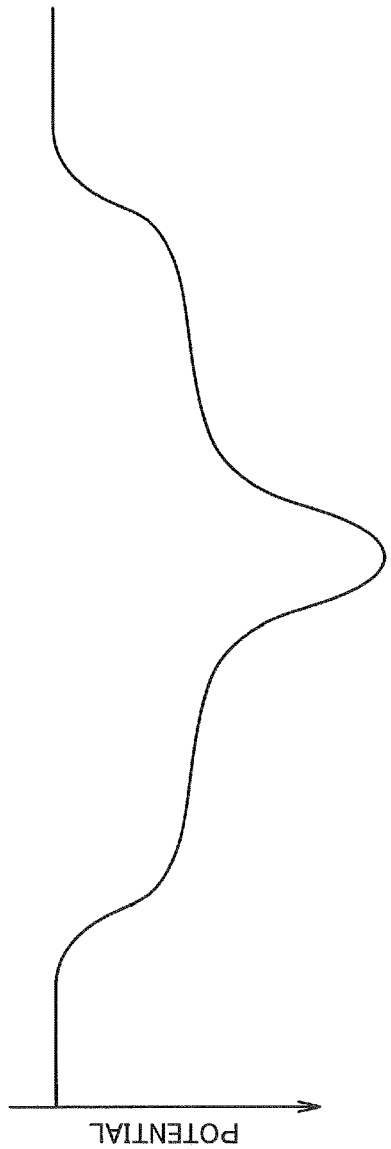
FIG. 41B is a view illustrating a potential profile for the structure illustrated in FIG. 41A.

The range sensor including the first block region 65 and the second block region 66 as shown in FIG. 41A can also have a structure in which the auxiliary guide region 63 is buried at a portion corresponding to the bottom of the potential profile of the surface-buried region 62 to which carriers generated are transferred, and the narrow tip of the guide region 64 is provided in contact with the auxiliary guide region 63, as shown in the potential profile of FIG. 41B. Accordingly, the potential gradient increases in every region, so as to increase the electric field to achieve high-speed performance of the range sensor. The first block region 65 and the second block region 66 may be buried by double ion implantation.

The range sensor according to the respective second to seventh embodiments may also include multiple (three or more) layered semiconductor regions of n-type conductivity in which the block regions are further buried immediately below the respective auxiliary guide region (second guide region) and guide region (main guide region), so as to achieve the effects of reducing a component introduced without charge modulation and increasing the potential gradient in every region to ensure the higher-speed performance when a photodiode has a larger pixel size.

The range sensor according to the first embodiment has been illustrated with the case in which each of the branches of the surface-buried region 25 having a fork-like shape has a stepped shape gradually increased in width from upper-side to lower-side in the drawing of FIG. 1. When the degree of steps along the surface-buried region 25 are minimized as much as possible, and the number of the steps increases infinitely, the range sensor in which each prong has a width gradually increased from top to bottom in a straight manner as shown in FIG. 42 may be obtained.

Figure 42:
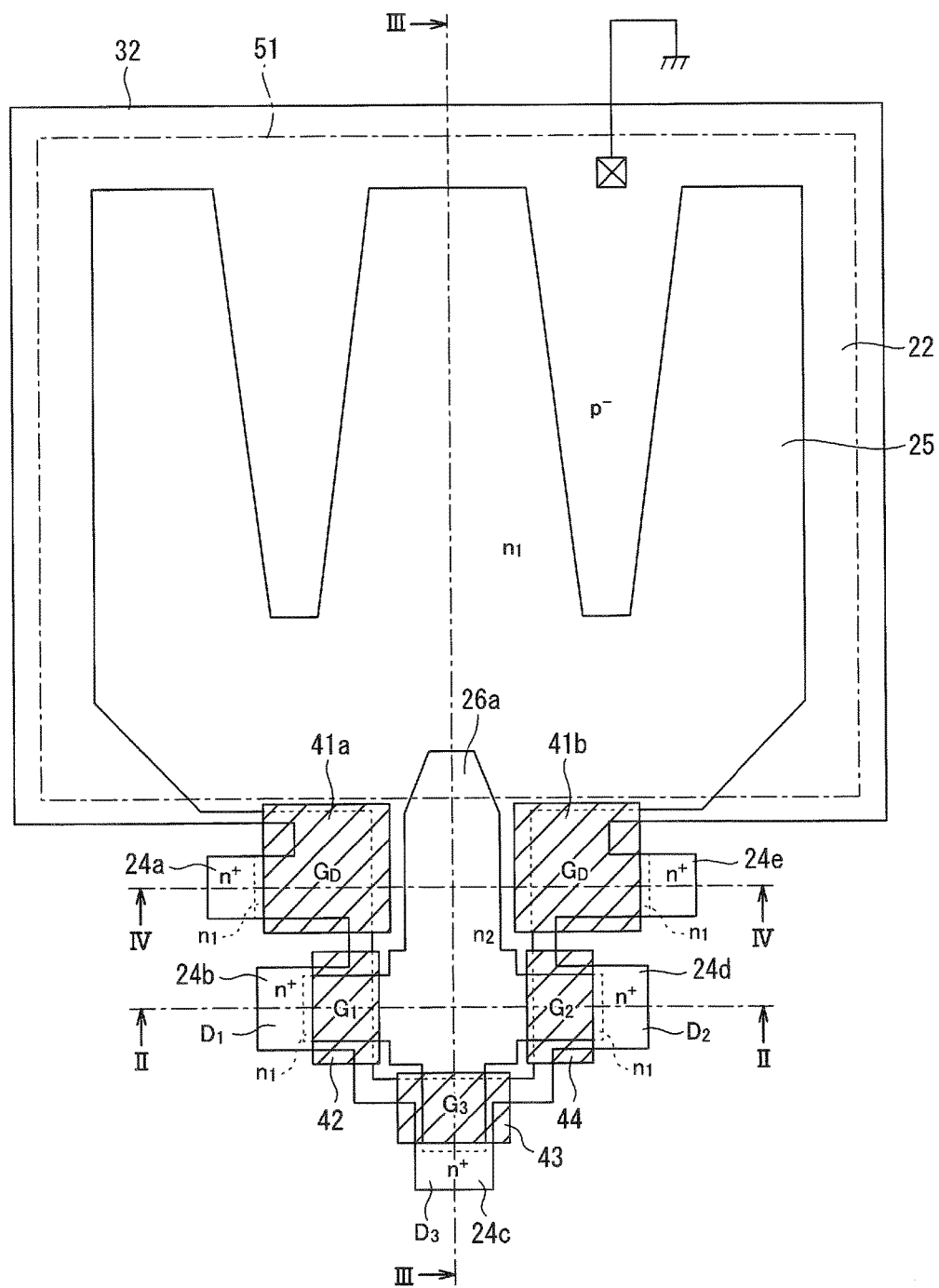
FIG. 42 is a schematic plan view from above of a principal part of a range sensor according to still another embodiment of the present invention.

The actual topology of the surface-buried region 25 may result in a gently stepped shape as shown in FIG. 42 because of limitations of the manufacture process in photolithography even when the surface-buried region 25 has a stepped shape as shown in FIG. 1 in a mask level. The range sensor including the surface-buried region 25 gradually increased in width from top to bottom in a straight manner as shown in FIG. 42 can also generate a high drift field in the entire depleted prongs of the surface-buried region 25 having a fork-like shape. Accordingly, photoelectrons as signal charges can be transferred rapidly in the longitudinal direction of the prongs of the fork-like shape gradually increased in width from top to bottom in a straight manner, as shown in FIG. 42.

The range sensor according to the first embodiment having the topology as shown in FIG. 42, instead of the topology as shown in FIG. 1, can also generate a high drift field in the entire depleted guide region 26a. Accordingly; photoelectrons as signal charges can be transferred rapidly in the longitudinal direction of the guide region 26a having the planar pattern as shown in FIG. 42.

It will be evident to those skilled in the art according to the explanations made above and the scope of the present invention that the range sensor according to the respective third to seventh embodiments may employ the lateral electric field control effect as described in the second embodiment, so as to transfer electric charges more rapidly than "the transfer gate method" as described in the range sensor according to the respective third to seventh embodiments.

Figure 43:
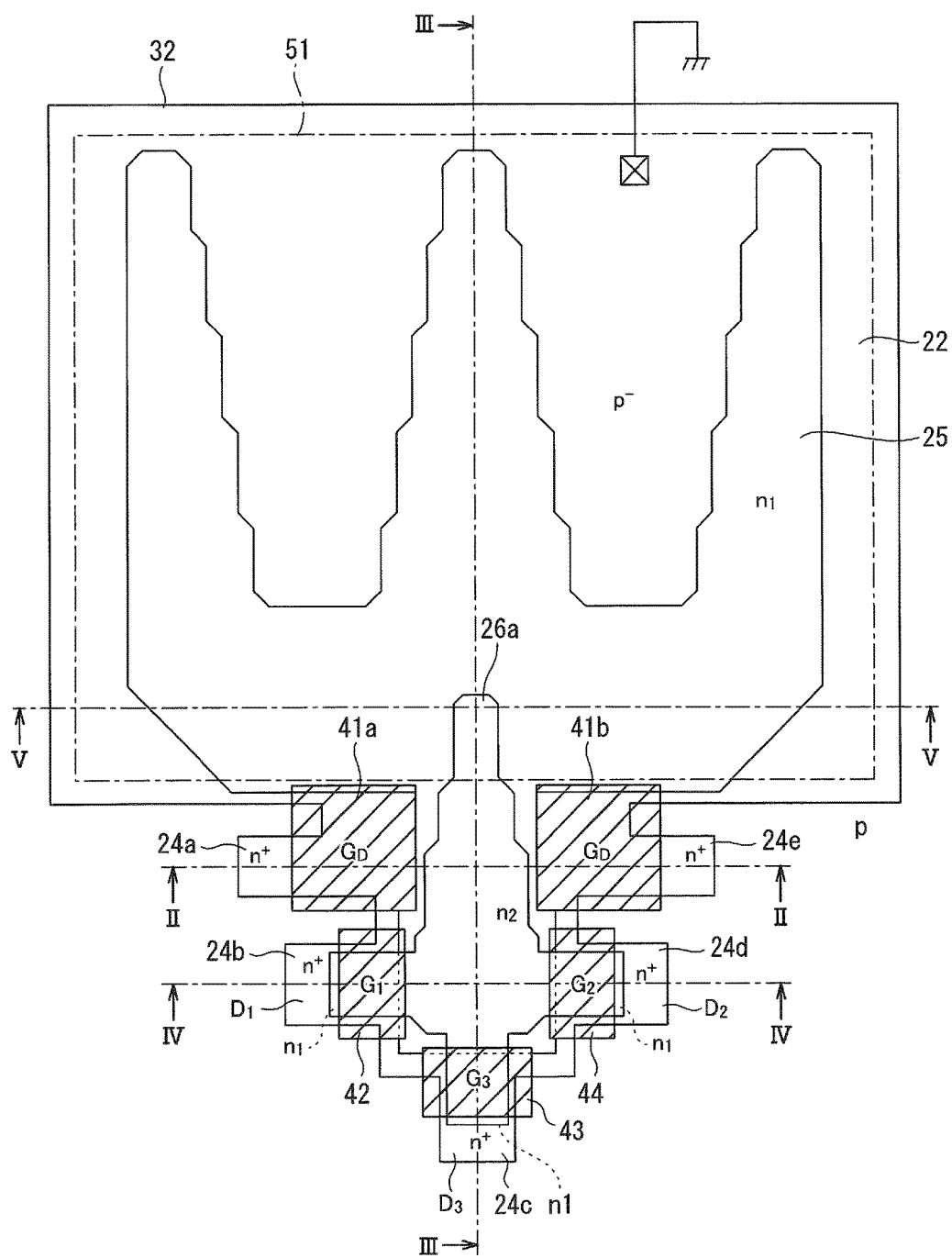
FIG. 43 is a schematic plan view from above of a principal part of a range sensor according to still another embodiment of the present invention.
Figure 44:
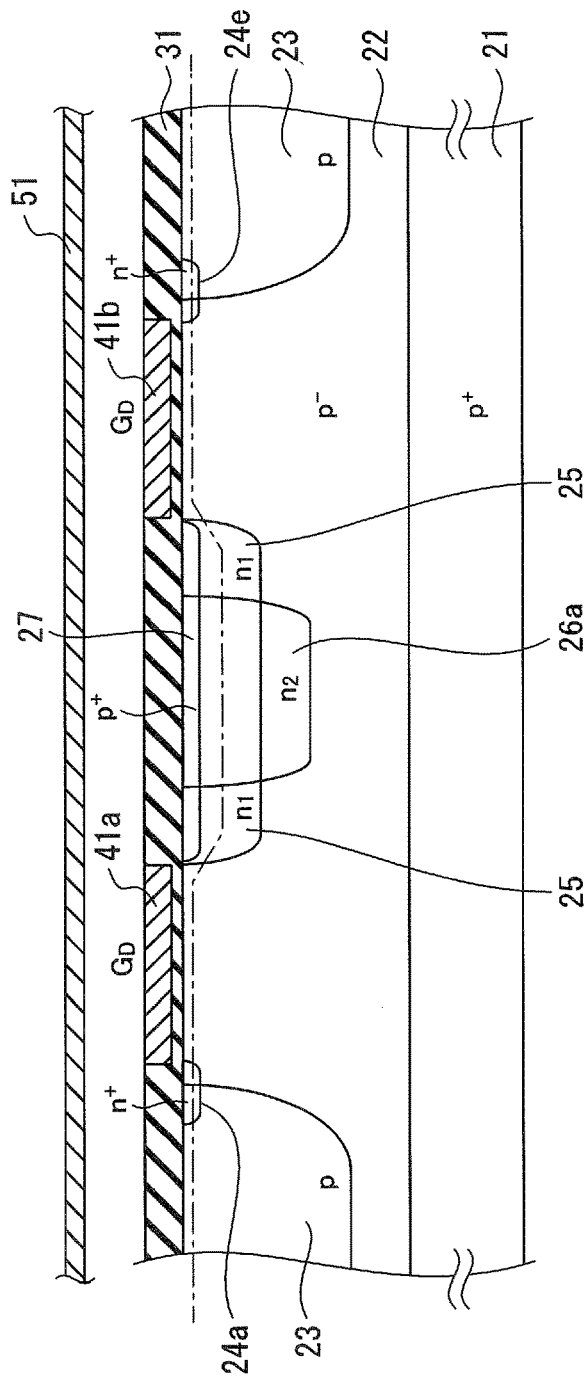
FIG. 44 is a cross-sectional view as viewed from direction II-II in FIG. 43.

The range sensor according to the first embodiment has been illustrated with the case provided with the additional branches extending adjacent to the light-receiving area in the direction perpendicular to the longitudinal direction of the trunk path of the surface-buried region 25, and the respective tips of the additional branches are connected with the first extraction region 24a and the second extraction region 24e of n-type conductivity having a higher impurity concentration than the surface-buried region 25. The range sensor is not necessarily provided with additional branches adjacent to the light-receiving area in the direction perpendicular to the longitudinal direction of the trunk path of the surface-buried region 25, as shown in FIG. 43 and FIG. 44. In other words, the surface-buried region 25 may be separated from the first extraction region 24a and the second extraction region 24e.

Figure 45:
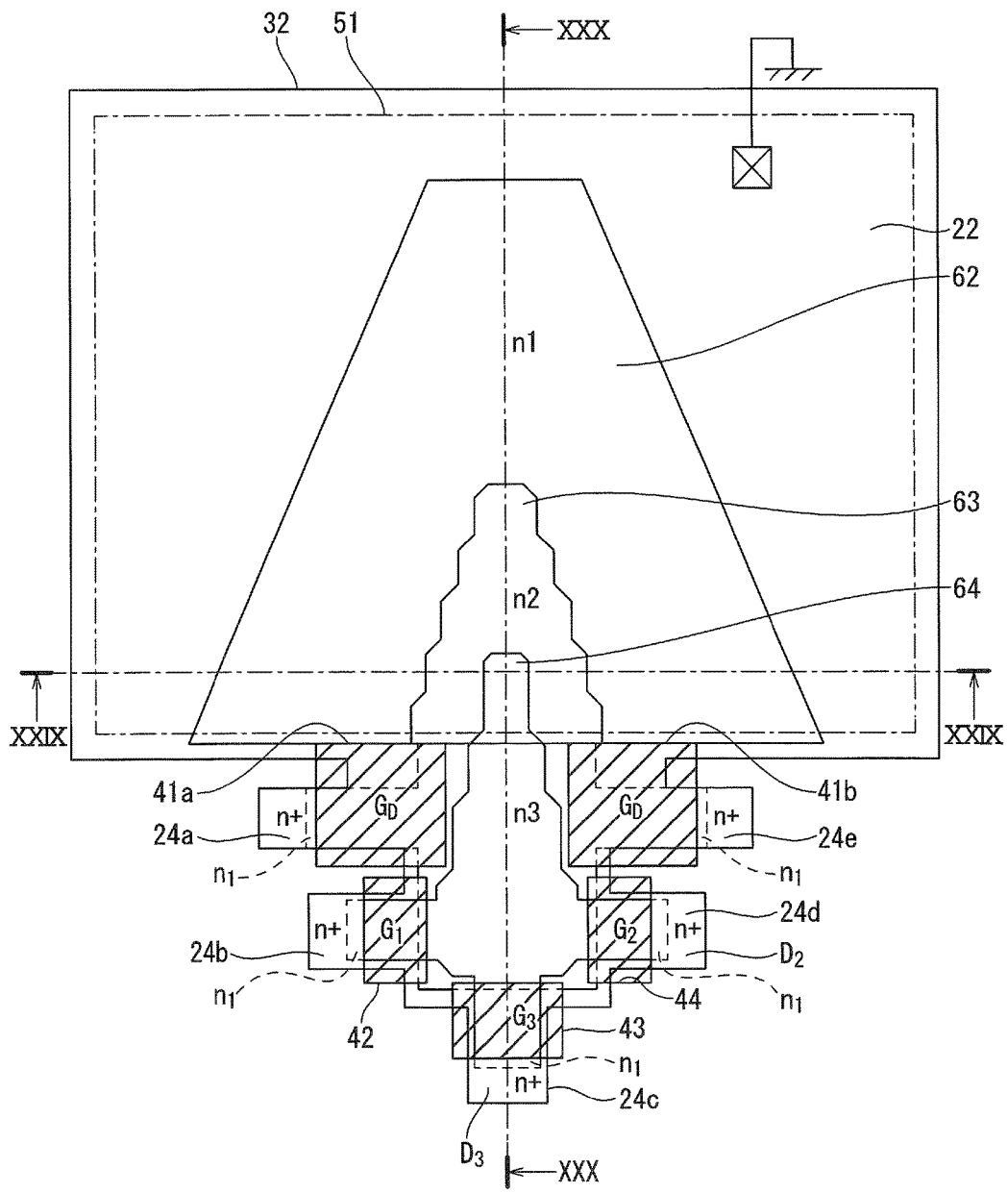
FIG. 45 is a schematic plan view from above of a principal part of a range sensor according to still another embodiment of the present invention.

The range sensor according to the seventh embodiment has been illustrated with the case in which the reverse U-shaped surface-buried region 25 has a stepped shape gradually increased in width from upper-side to lower-side in the drawing of FIG. 28. When the degree of the steps along the surface-buried region 25 are minimized as much as possible, and the number of the steps increases infinitely, the range sensor including the surface-buried region 62 having a trapezoidal shape gradually increased in width in a straight manner as shown in FIG. 45 or a surface-buried region having a reverse U-shape approximate to a parabolic curve gradually increased in width into an arc-like shape (not shown) may be obtained. The actual topology of the surface-buried region 62 may result in a gently stepped trapezoidal shape as shown in FIG. 45 because of limitations of the manufacture process in photolithography even when the surface-buried region 62 has a stepped shape as shown in FIG. 28 in a mask level. The range sensor including the surface-buried region 62 gradually increased in width from top to bottom in a straight manner as shown in FIG. 45 can also rapidly transfer photoelectrons. When the end of the surface-buried region 62 further extends upward in FIG. 45, the outline of the surface-buried region 62 may be an envelope curve approximate to a reverse V-shape (isosceles triangle).

Namely, the outline of the surface-buried region 62 or the envelope curve of the outline is only required to have a gradually increased width measured in the direction perpendicular to the transfer direction of signal charges so as to have a trapezoidal shape, a parabolic curve, a reverse U-shape or a reverse V-shape in the light-receiving area to surround the auxiliary guide region 63 of the guide region (63, 64) in a planar pattern. The range sensor may only include the main guide region 64 of the guide region (63, 64) without the auxiliary guide region 63 shown in FIG. 45.

The semiconductor material implementing the photodiode in the range sensor according to the present invention is not limited to silicon (Si). Range sensors and solid-state imaging devices including various kinds of compound semiconductors such as group III-V compound semiconductor or group II-VI compound semiconductor can employ the structures and technical ideas of the range sensor and the solid-state imaging device according to the respective first to seventh embodiments.

It should be noted that the present invention includes various embodiments which are not disclosed herein. Therefore, the scope of the present invention is defined only by the present invention specifying matters according to the claims reasonably derived from the description heretofore.

REFERENCE SIGNS LIST 21, 61 Semiconductor substrate
22 Pixel layer
23 Well region
24a, 24aa, 24ba, 24g First extraction region
24be, 24ae, 24e, 24f Second extraction region
24j Third extraction region
24k Fourth extraction region
24, 24ab, 24b, 24bb, 24h First charge-accumulation region
24ad, 24bd, 24i, 24d Second charge-accumulation region
24ac, 24bc, 24l, 24c Third charge-accumulation region
25, 25p, 25q, 62 Surface-buried region
25a First surface-buried region
25b Second surface-buried region
26a, 26b, 26f, 64 Guide region (main guide region)
26d First guide region
26e Second guide region
27 Pinning layer
31 Insulating film
32, 32a, 32b, 32c Edge of filed insulating film
41a, 41aa, 41ba, 41m First extraction gate electrode
41ab, 41b, 41bb, 41l Second extraction gate electrode
41n Third extraction gate electrode
41o Fourth extraction gate electrode
42a, 42, 42b, 42h First transfer gate electrode
44a, 44, 44b, 44h Second transfer gate electrode
43a, 43, 43b, 43h Third transfer gate electrode
42p First field-control electrode
44p Second field-control electrode
43p Third field-control electrode
51 Shielding plate
53p, 53q, 53r, 53s Microlens
65 First block region
66 Second block region

The invention claimed is:

1. A range sensor comprising:
a pixel layer made of a semiconductor of a first conductivity type;
an optical shielding plate having an aperture and provided above the pixel layer to define a light-receiving portion, with a pixel size of five micrometers square or greater, on the pixel layer below the aperture;
a surface-buried region of a second conductivity type selectively buried in an upper portion of the pixel layer so as to constitute a photodiode in the light-receiving portion by making a junction with the pixel layer, and extending from the light-receiving portion toward plural portions shielded by the optical shielding plate along the upper portion of the pixel layer so as to branch for defining a plurality of projections, the plural portions including a number of three or more portions, the projections extend toward the plural portions;
charge-accumulation regions of the second conductivity type connected to tips of the respective projections and having a higher impurity concentration than the surface-buried region;
a plurality of transfer-control mechanisms provided at the respective projections adjacent to the charge-accumulation regions to control signal charges transferred to the charge-accumulation regions; and
a guide region of the second conductivity type having a higher impurity concentration than the surface-buried region and a lower impurity concentration than the charge-accumulation regions, buried in a part of the surface-buried region with a planar pattern such that one end of the planar pattern is provided below a part of the aperture and other ends of the planar pattern are branched under the optical shielding plate, and the other ends are extending to at least a part of the respective transfer-control mechanisms, and the planar pattern having a multi-stepped shape, by gradually increasing widths of the planar pattern along a direction towards the transfer-control mechanisms, the widths are measured in a direction perpendicular to a transfer direction of the signal charges,
wherein an outline of the surface-buried region or an envelope curve of the outline comprises a gradually increased width measured in the direction perpendicular to the transfer direction of the signal charges so as to comprise a trapezoidal shape, a parabolic curve, a reverse U-shape or a reverse V-shape in the light-receiving portion to surround the guide region in a planar pattern.

2. The range sensor of claim 1, wherein the guide region comprises:
an auxiliary guide region of the second conductivity type having a higher impurity concentration than the surface-buried region, and provided with one end below a part of the aperture and other ends extending toward the transfer-control mechanisms; and
a main guide region of the second conductivity type having a higher impurity concentration than the auxiliary guide region and a lower impurity concentration than the charge-accumulation regions, and provided with one end buried in a part of the auxiliary guide region, and other branch ends extending to at least a part of the respective transfer-control mechanisms.

3. The range sensor of claim 1, wherein a block region of the first conductivity type having a higher impurity concentration than the pixel layer is buried immediately below the guide region in the upper portion of the pixel layer.

4. The range sensor of claim 1, wherein the surface-buried region further is provided with an additional projection in a part of a trunk path between the light-receiving portion toward the branch projections and projecting in a direction perpendicular to a longitudinal direction of the trunk path, and
an extraction drain region of the second conductivity type having a higher impurity concentration than the surface-buried region is connected to a tip of the additional projection.

5. A range sensor comprising:
a pixel layer made of a semiconductor of a first conductivity type;
an optical shielding plate having a plurality of apertures and provided above the pixel layer to define light-receiving portions on the pixel layer below the respective apertures;
a surface-buried region of a second conductivity type buried in an upper portion of the pixel layer to compose photodiodes in the respective light-receiving portions by making a junction with the pixel layer, and including a charge-modulation arrangement-region provided with a plurality of projections at a position shielded by the optical shielding plate and including a plurality of light-receiving terminal-portions corresponding to the respective apertures and extending toward the respective apertures at both ends of the charge-modulation arrangement-region to each have an area sufficient to cover substantially the entire corresponding aperture;

charge-accumulation regions of the second conductivity type connected to tips of the respective projections and having a higher impurity concentration than the surface-buried region;

a plurality of transfer-control mechanisms provided at the respective projections adjacent to the charge-accumulation regions to control signal charges transferred to the charge-accumulation regions; and a guide region of the second conductivity type having a higher impurity concentration than the surface-buried region and a lower impurity concentration than the charge-accumulation regions, including a plurality of branch ends corresponding to the respective apertures and extending from an area shielded by the optical shielding plate on the charge-modulation arrangement-region to the respective apertures so that tips are provided below the respective apertures, and having a gradually increased width measured in a direction perpendicular to a transfer direction of the signal charges in a planar pattern, wherein the surface-buried region is further provided at both ends of additional projections projecting in a direction perpendicular to a longitudinal direction of the charge-modulation arrangement-region, and extraction drain regions of the second conductivity type having a higher impurity concentration than the surface-buried region are connected to tips of the additional projections.

6. The range sensor of claim 5, wherein the guide region comprises:

auxiliary guide regions of the second conductivity type having a higher impurity concentration than the surface-buried region and provided below the respective apertures; and a main guide region of the second conductivity type having a higher impurity concentration than the auxiliary guide regions and a lower impurity concentration than the charge-accumulation regions, and having branch ends extending toward the respective auxiliary guide regions from the charge-modulation arrangement-region.

7. The range sensor of claim 5, wherein a block region of the first conductivity type having a higher impurity concentration than the pixel layer is buried immediately below the guide region in the upper portion of the pixel layer.

8. A range sensor comprising:

a pixel layer made of a semiconductor of a first conductivity type;

an optical shielding plate having a plurality of apertures around a pixel region defined by the pixel layer and provided above the pixel layer to define light-receiving portions on the pixel layer below the respective apertures;

a surface-buried region of a second conductivity type buried in an upper portion of the pixel layer to compose photodiodes in the respective light-receiving portions by making a junction with the pixel layer, and including a charge-modulation arrangement-region provided with a plurality of projections in a central portion of the pixel region shielded by the optical shielding plate, the charge-modulation arrangement-region including a plurality of light-receiving terminal portions corresponding to the respective apertures and radially extending toward the respective apertures to each have an area sufficient to cover substantially the entire corresponding aperture;

charge-accumulation regions of the second conductivity type connected to tips of the respective projections and having a higher impurity concentration than the surface-buried region;

a plurality of transfer-control mechanisms provided at the respective projections adjacent to the charge-accumulation regions to control signal charges transferred to the charge-accumulation regions; and a guide region of the second conductivity type having a higher impurity concentration than the surface-buried region and a lower impurity concentration than the charge-accumulation regions, including a plurality of branch ends corresponding to the respective apertures and provided with tips radially extending below the respective apertures from an area shielded by the optical shielding plate on the charge-modulation arrangement-region, and having a gradually increased width measured in a direction perpendicular to a transfer direction of the signal charges in a planar pattern, wherein the surface-buried region is further provided with additional projections projecting adjacent to the respective light-receiving terminal-portions in a direction perpendicular to a radial direction of the radially extending light-receiving terminal-portions, and extraction drain regions of the second conductivity type having a higher impurity concentration than the surface-buried region are connected to tips of the additional projections.

9. The range sensor of claim 8, wherein the guide region comprises:

auxiliary guide regions of the second conductivity type having a higher impurity concentration than the surface-buried region and provided below the respective apertures; and a main guide region of the second conductivity type having a higher impurity concentration than the auxiliary guide regions and a lower impurity concentration than the charge-accumulation regions, and having branch ends corresponding to the auxiliary guide regions and provided with tips radially extending below the auxiliary guide regions from the charge-modulation arrangement-region.

10. The range sensor of claim 8, wherein a block region of the first conductivity type having a higher impurity concentration than the pixel layer is buried immediately below the guide region in the upper portion of the pixel layer.

11. The range sensor of claim 4, further comprising an extraction control mechanism provided adjacent to the extraction drain region and configured to control extraction of charges toward the extraction drain region via each additional projection.

12. The range sensor of claim 1, wherein each of the transfer-control mechanisms comprises:

a gate insulating film provided on the respective projections; and a transfer gate electrode provided on the gate insulating film, and a voltage applied to each transfer gate electrode controls potentials in a transfer channel defined by the respective projections, so as to control the signal charges transferred to the respective charge-accumulation regions.

13. The range sensor of claim 1, wherein each of the transfer-control mechanisms comprises a pair of electric field-control electrodes on the pixel layer via an insulating film while interposing the respective projections in the planar pattern in the direction perpendicular to the transfer direction of the signal charges, and a different electric field-control voltage is applied to each of the pair of electric field-control electrodes to change a depletion potential in the respective projections so as to control movement of the signal charges transferred in the respective projections.

* * * * *